(12) United States Patent
Takahashi et al.

(10) Patent No.: US 11,405,569 B2
(45) Date of Patent: Aug. 2, 2022

(54) SOLID-STATE IMAGING DEVICE

(71) Applicant: SONY SEMICONDUCTOR SOLUTIONS CORPORATION, Kanagawa (JP)

(72) Inventors: Hiroshi Takahashi, Kanagawa (JP); Ryoichi Nakamura, Kanagawa (JP); Hidenori Maeda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 212 days.

(21) Appl. No.: 16/631,521

(22) PCT Filed: Jun. 21, 2018

(86) PCT No.: PCT/JP2018/023570
§ 371 (c)(1),
(2) Date: Jan. 16, 2020

(87) PCT Pub. No.: WO2019/021705
PCT Pub. Date: Jan. 31, 2019

(65) Prior Publication Data
US 2020/0177829 A1    Jun. 4, 2020

(30) Foreign Application Priority Data

Jul. 25, 2017 (JP) .............................. JP2017-143352
May 2, 2018 (JP) .............................. JP2018-088690

(51) Int. Cl.
*H04N 5/374* (2011.01)
*H01L 27/146* (2006.01)
*H04N 5/341* (2011.01)

(52) U.S. Cl.
CPC ....... *H04N 5/374* (2013.01); *H01L 27/14621* (2013.01); *H01L 27/14627* (2013.01); *H01L 27/14643* (2013.01); *H04N 5/341* (2013.01)

(58) Field of Classification Search
CPC .......................... H04N 5/374; H01L 27/14643
See application file for complete search history.

(56) References Cited

U.S. PATENT DOCUMENTS

| 2002/0044215 A1* | 4/2002 | Takagi | H01L 27/14601 348/374 |
| 2003/0171649 A1* | 9/2003 | Yokoi | H04N 5/2254 600/109 |

(Continued)

FOREIGN PATENT DOCUMENTS

| CN | 102313959 A | 1/2012 |
| CN | 104508441 A | 4/2015 |

(Continued)

OTHER PUBLICATIONS

International Search Report and Written Opinion of PCT Application No. PCT/JP2018/023570, dated Aug. 28, 2018, 10 pages of ISRWO.

*Primary Examiner* — Thanh Luu
(74) *Attorney, Agent, or Firm* — Chip Law Group

(57) ABSTRACT

Provided is a solid-state imaging device that includes a first substrate that has one principal surface on which a pixel portion in which pixels are arranged is formed, a second substrate which is bonded to a surface of the first substrate opposed to the one principal surface and in which an opening is provided in a partial region in a surface opposed to a bonding surface to the first substrate is provided. The solid-state imaging device further includes at least one (Continued)

sub-chip inside the opening so as not to protrude from the opening and in which a circuit having a predetermined function is formed.

20 Claims, 39 Drawing Sheets

(56) References Cited

U.S. PATENT DOCUMENTS

| | | | |
|---|---|---|---|
| 2003/0218120 A1 | 11/2003 | Shibayama | |
| 2004/0130640 A1 | 7/2004 | Fujimori | |
| 2007/0029670 A1 | 2/2007 | Shibayama et al. | |
| 2007/0133183 A1* | 6/2007 | Urbach | H01L 25/072 |
| | | | 361/760 |
| 2009/0128681 A1* | 5/2009 | Kim | H04N 5/2257 |
| | | | 348/335 |
| 2009/0212384 A1* | 8/2009 | Kobayashi | H01L 27/14632 |
| | | | 257/443 |
| 2013/0010145 A1* | 1/2013 | Hagiwara | H01L 27/14634 |
| | | | 348/222.1 |
| 2014/0284744 A1 | 9/2014 | Fujii et al. | |
| 2016/0351499 A1* | 12/2016 | Kitada | H01L 23/5384 |
| 2017/0150042 A1* | 5/2017 | Suzuki | H04N 5/2258 |
| 2018/0130782 A1* | 5/2018 | Lee | H01L 24/24 |

FOREIGN PATENT DOCUMENTS

| | | |
|---|---|---|
| EP | 1492168 A1 | 12/2004 |
| EP | 1577950 A1 | 9/2005 |
| EP | 1598862 A1 | 11/2005 |
| JP | 2003-264280 A | 9/2003 |
| JP | 2004-207461 A | 7/2004 |
| JP | 2004-265948 A | 9/2004 |
| JP | 2014-099582 A | 5/2014 |
| JP | 2014-187166 A | 10/2014 |
| WO | 2003/077318 A1 | 9/2003 |
| WO | 2004/059740 A1 | 7/2004 |
| WO | 2004/075281 A1 | 9/2004 |
| WO | 2018/079328 A1 | 5/2018 |

* cited by examiner

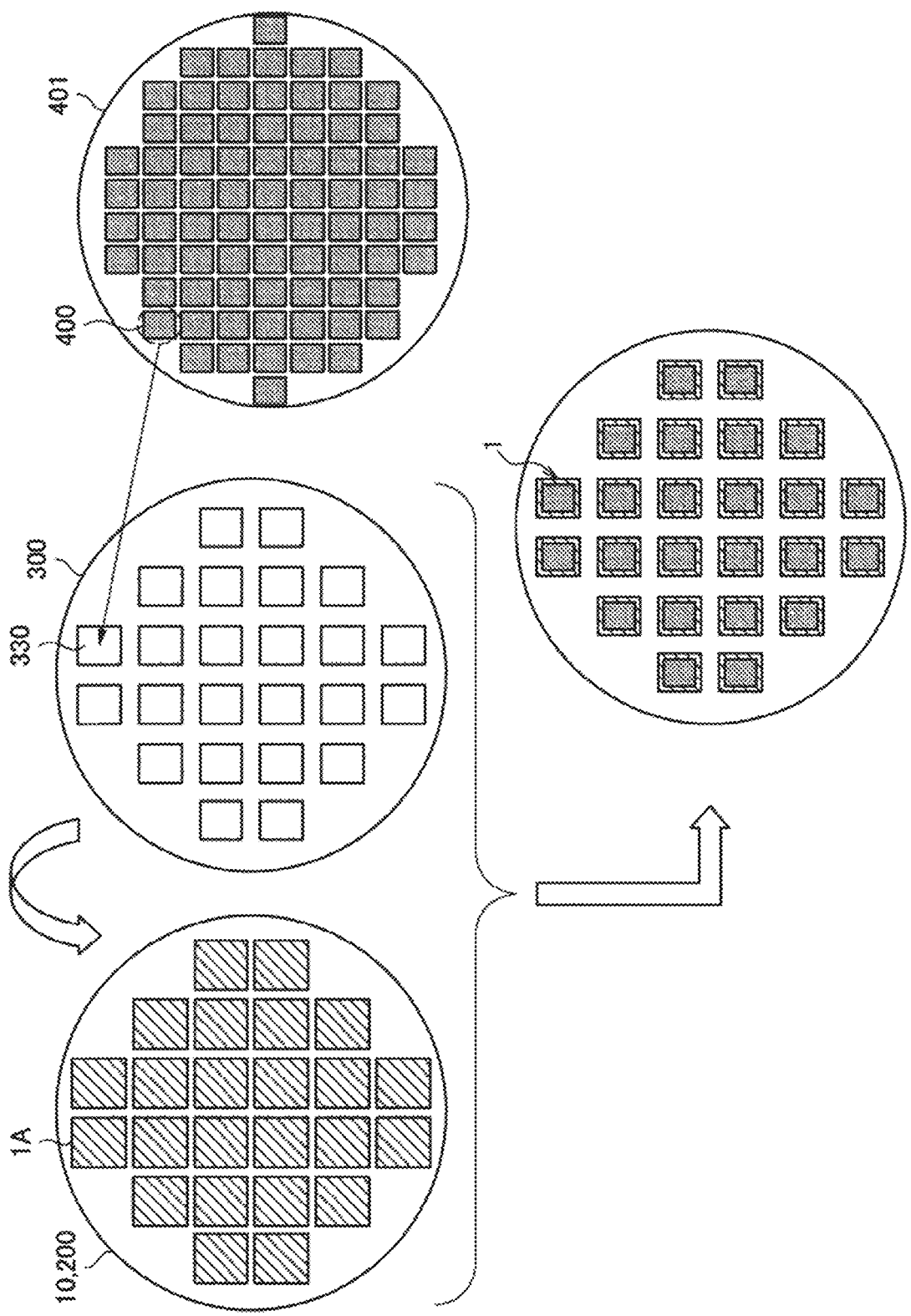

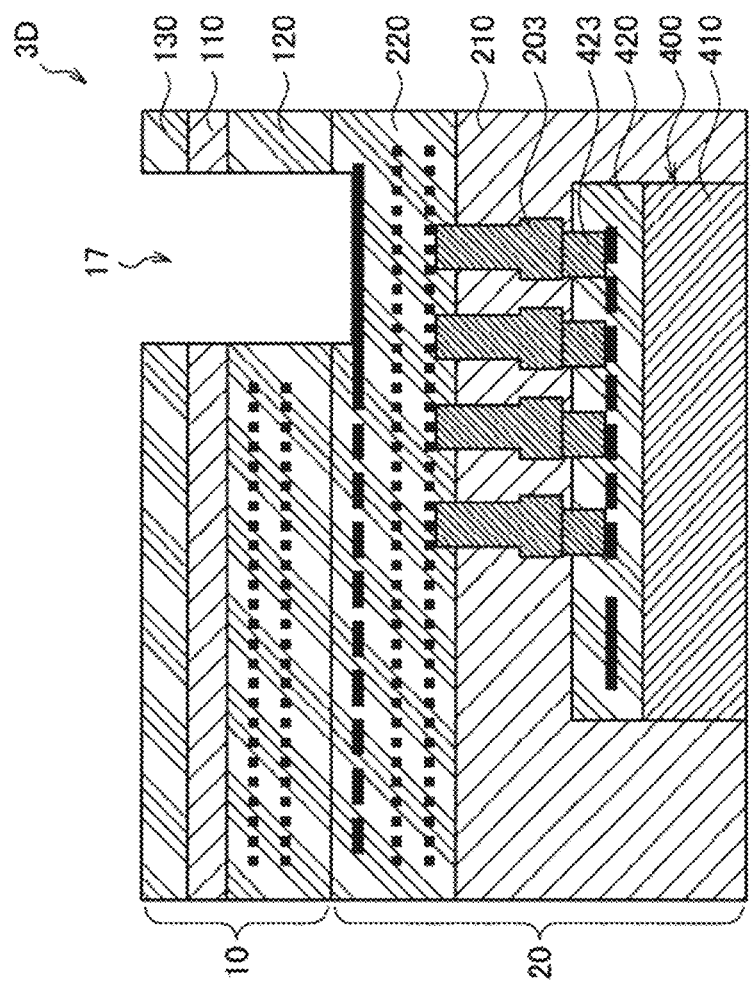

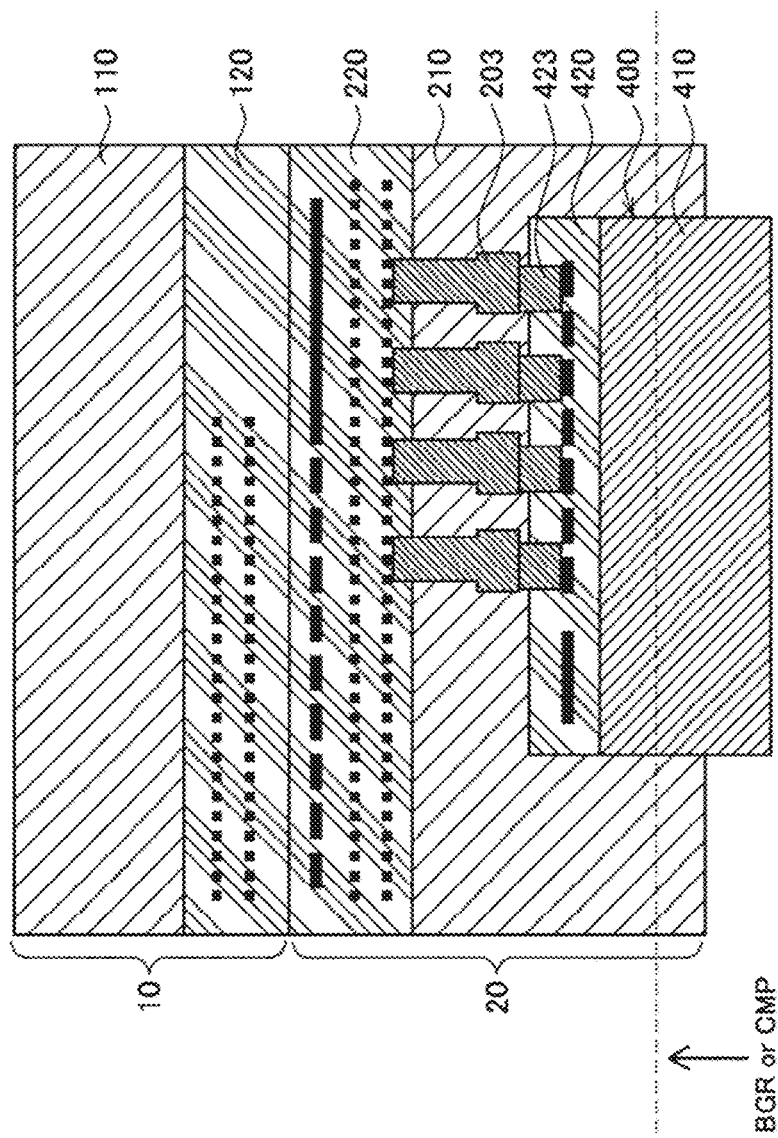

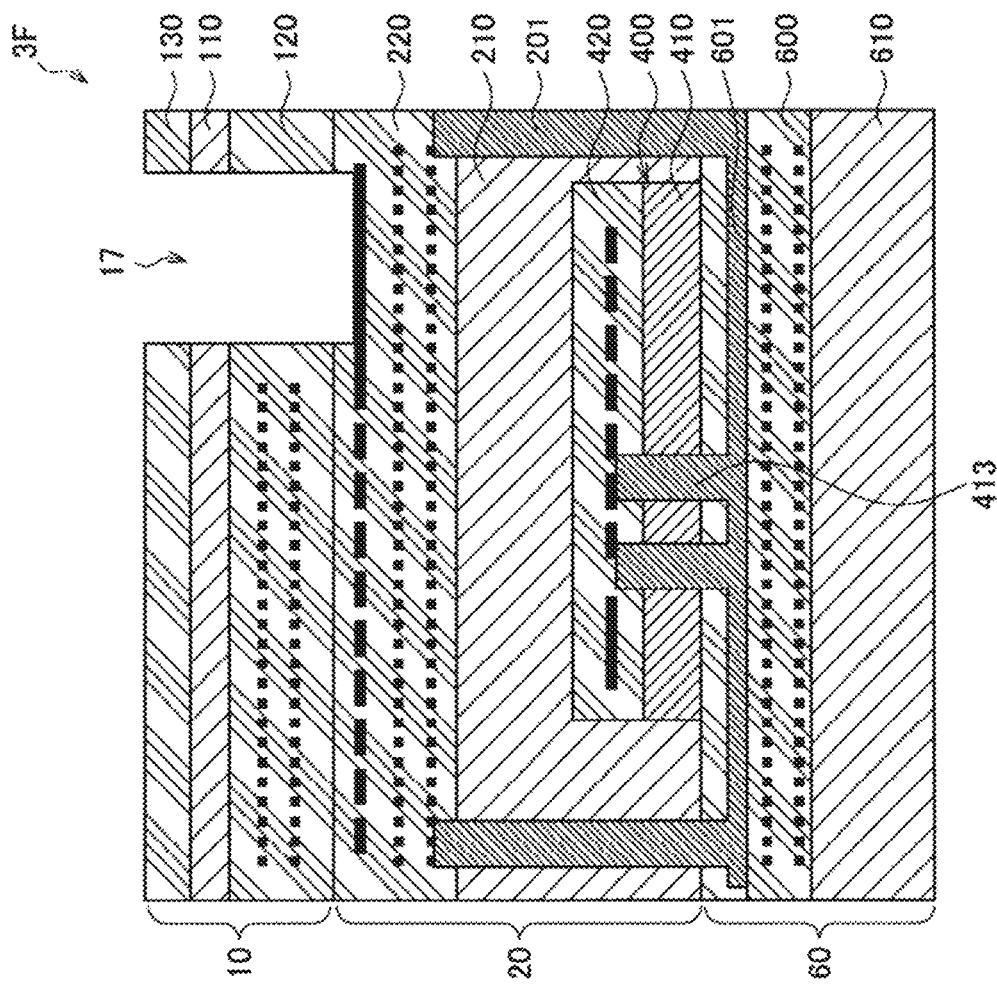

SOLID-STATE IMAGING DEVICE

CROSS REFERENCE TO RELATED APPLICATIONS

This application is a U.S. National Phase of International Patent Application No. PCT/JP2018/023570 filed on Jun. 21, 2018, which claims priority benefit of Japanese Patent Application No. JP 2018-088690 filed in the Japan Patent Office on May 2, 2018 and also claims priority benefit of Japanese Patent Application No. JP 2017-143352 filed in the Japan Patent Office on Jul. 25, 2017. Each of the above-referenced applications is hereby incorporated herein by reference in its entirety.

FIELD

The present disclosure relates to a solid-state imaging device.

BACKGROUND

As semiconductor devices in which a plurality of chips are laminated, for example, amplified solid-state imaging devices and multilayer laminated memory devices such as CMOS image sensors have been known. These laminated semiconductor devices are implemented by laminating chips having different functions in a film thickness direction and electrically connecting the chips via through holes filled with metal material.

As a method for laminating the chips, for example, a method for bonding wafers having chips formed thereon has been developed.

For example, Patent Literature 1 below discloses a laminated solid-state imaging device obtained by bonding wafers having chips formed thereon and then collectively polishing the wafers to make them thin by using backgrinding.

CITATION LIST

Patent Literature

Patent Literature 1: JP 2014-099582 A

SUMMARY

Technical Problem

However, in the case where wafers on which chips having different planar areas are formed are laminated together, the number and layout of chips that can be formed on the wafers are limited by a wafer on which a chip having the largest planar area is formed.

Thus, the present disclosure proposes a novel and improved solid-state imaging device capable of further increasing the degree of freedom of the size and layout of chips to be laminated.

Solution to Problem

According to the present disclosure, a solid-state imaging device is provided that includes: a first substrate that has one principal surface on which a pixel portion in which pixels are arranged is formed; a second substrate which is bonded to a surface of the first substrate opposed to the one principal surface and in which an opening is provided in a partial region in a surface opposed to a bonding surface to the first substrate; and at least one sub-chip which is provided inside the opening so as not to protrude from the opening and in which a circuit having a predetermined function is formed.

According to the present disclosure, a substrate provided with an opening is bonded to a substrate on which a pixel portion is formed. Consequently, the substrate provided with the opening can be used as a support, and a sub-chip and a circuit inside the substrate can be electrically connected through the opening.

Advantageous Effects of Invention

As described above, the present disclosure can provide a solid-state imaging device with a higher degree of freedom of the size and layout of chips to be laminated.

The above-mentioned effect is not necessarily limited, and any effect described herein or other effects that could be understood from the specification may be exhibited together with or in place of the above-mentioned effect.

BRIEF DESCRIPTION OF DRAWINGS

FIG. 2 is a schematic diagram for describing the outline of a method for manufacturing a solid-state imaging device according to the embodiment.

FIG. 10A is a vertical sectional view schematically illustrating a laminate structure of a solid-state imaging device according to a fourth specific example.

FIG. 11 is a vertical sectional view schematically illustrating one step in a method for manufacturing the solid-state imaging device according to the fourth specific example.

FIG. 13A is a vertical sectional view schematically illustrating a laminate structure of a solid-state imaging device according to a sixth specific example.

DESCRIPTION OF EMBODIMENTS

Figure 1:
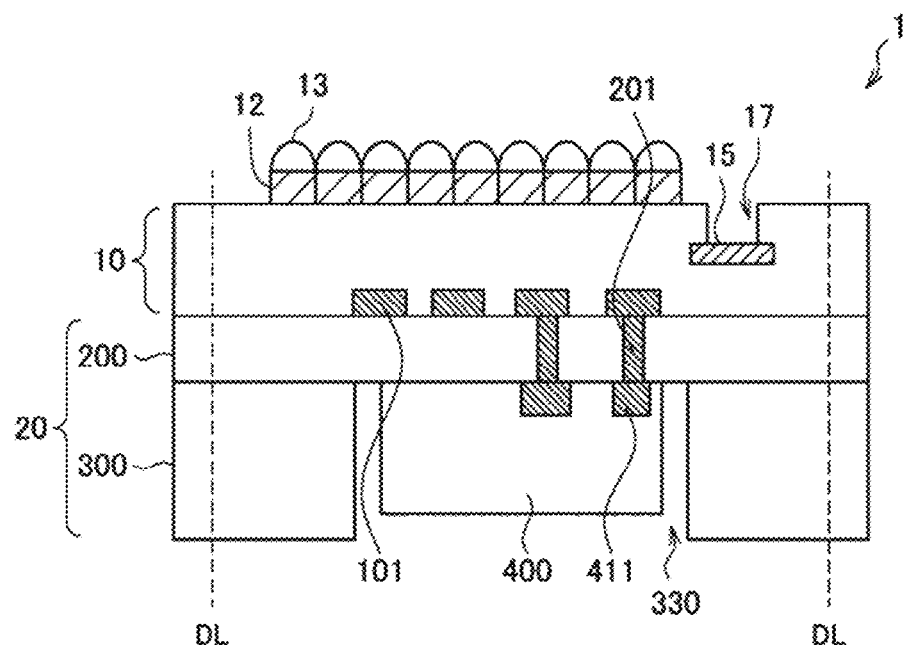
FIG. 1 is a vertical sectional view for schematically describing a configuration of a solid-state imaging device according to one embodiment of the present disclosure.

Referring to the accompanying drawings, preferable embodiments of the present disclosure are described in detail below. In the specification and the drawings, components having substantially the same functional configurations are denoted by the same reference symbols to omit overlapping descriptions.

The descriptions are given in the following order:
0. Technical background of the present disclosure
1. Configuration of solid-state imaging device
2. Method for manufacturing solid-state imaging device
3. Modifications of solid-state imaging device
4. Specific examples of solid-state imaging device
5. Applied example
6. Conclusion <0. Technical Background of the Present Disclosure>

Prior to describing a solid-state imaging device according to one embodiment of the present disclosure, the technical background of the present disclosure is described.

For example, a laminated solid-state imaging device in which a plurality of chips are laminated has been known. In such a laminated solid-state imaging device, a plurality of wafers having chips formed therein are bonded, and then the laminated wafers are thinned by a combination of backgrinding (BGR) and chemical mechanical polishing (CMP) as needed. In the laminated solid-state imaging device, the thinning of each wafer makes it easier to form a connection electrode passing through each chip and can reduce the thickness of the device as a whole, which is very important.

In this method, however, in the case where the planar areas of chips formed in the laminated wafers are different, the layout is determined depending on a wafer on which a chip having the largest area is formed, and hence a region that is not used for a chip is generated in some wafers. In this method, the wafers having chips formed therein are laminated together, and hence when any of the laminated chips does not satisfy desired performance, desired performance cannot be satisfied in the solid-state imaging device as a whole. Thus, this method may reduce the yield of solid-state imaging devices.

In recent years, on the other hand, a technology called "chip on wafer (CoW)" for laminating separately manufactured chips on chips formed on a wafer has been developed. In this method, however, a wafer having laminated chips functions as a support, and hence it is difficult to perform thinning processing such as backgrinding and CMP on the wafer, and the thickness of the entire solid-state imaging device increases. In the case where a separately manufactured chip is bonded to a wafer through resin, distortion or warpage may occur in the bonded chip due to stress in the resin, which may affect the characteristics as a solid-state imaging device.

Furthermore, for example, a technology with which a carrier wafer is provisionally bonded to a wafer having a pixel portion formed therein and then chips are laminated and the wafer is thinned, and thereafter the carrier wafer is separated has been proposed. In this method, the carrier wafer is used as a support, and hence the wafer having the pixel portion formed therein can be thinned. This can reduce the thickness of the solid-state imaging device as a whole.

In this method, however, the carrier wafer is provisionally bonded and then separated, and hence a residue of adhesive used for the provisional bonding of the carrier wafer may affect the performance of the solid-state imaging device. When the carrier wafer is separated, stress may be applied to the wafer having the pixel portion formed therein, and distortion or warpage may occur in the wafer having the pixel portion formed therein.

The technology according to the present disclosure has been made in view of the above-mentioned circumstances. In the following, a solid-state imaging device according to one embodiment of the present disclosure is described in detail.

<1. Configuration of Solid-State Imaging Device>

First, a configuration of the solid-state imaging device according to one embodiment of the present disclosure is described with reference to FIG. 1. FIG. 1 is a vertical sectional view for schematically describing the configuration of the solid-state imaging device according to the present embodiment.

In each figure referred to in the following description, the size of some constituent members is sometimes exaggerated for the sake of description. The relative sizes of constituent members illustrated in each figure do not always accurately represent the actual large-small relation of the constituent members. In the following description, a direction in which substrates or layers are laminated is sometimes referred to as "upward direction".

As illustrated in FIG. 1, a solid-state imaging device 1 according to the present embodiment is formed by laminating a first substrate 10, a second substrate 20 including a circuit board 200 and an opening substrate 300, and a sub-chip 400 in this order. For example, the solid-state imaging device 1 may be manufactured in a manner that a plurality of solid-state imaging devices 1 are arranged on a substrate in a wafer state and are then cut along dicing lines DL.

Specifically, the first substrate 10 may be provided with a pixel portion. The circuit board 200 in the second substrate 20 and the sub-chip 400 may be provided with circuits for performing various kinds of signal processing related to the operation of the solid-state imaging device 1. For example, the circuit board 200 may be provided with a logic circuit, and the sub-chip 400 may be provided with a memory circuit. For example, the solid-state imaging device 1 may be a complementary metal-oxide-semiconductor (CMOS) image sensor for photoelectrically converting light entering the first substrate 10 at the pixel portion.

For example, the first substrate 10 includes a semiconductor substrate made of silicon (Si) and a multi-layer wiring layer formed on the semiconductor substrate. On a light receiving surface of the first substrate 10, a color filter layer 12 and a micro lens array 13 are provided, and a pad opening portion 17 for exposing a pad 15 formed therein is provided. On a surface of the first substrate 10 opposed to the light receiving surface, electrodes 101 for extracting signals acquired at the pixel portion to the second substrate 20 or the sub-chip 400 are provided.

In the semiconductor substrate and the multi-layer wiring layer, a pixel portion, in which pixels are two-dimensionally arranged, and a pixel signal processing circuit for processing pixel signals from the pixel portion are formed. Each pixel includes a photodiode (PD) for receiving light from an imaging target and photoelectrically converting the received light, a transistor for reading an electric signal corresponding to light acquired by the photodiode, and a drive circuit. For example, the pixel signal processing circuit executes various kinds of signal processing such as analog-digital conversion (AD conversion) on the electric signal from each pixel. At the pixel portion, the pixels may be two-dimensionally arranged or three-dimensionally arranged.

The color filter layer 12 is formed by two-dimensionally arranging a plurality of color filters (CF). The micro lens array 13 is formed by two-dimensionally arranging a plurality of micro lenses (ML). The color filter layer 12 and the micro lens array 13 are formed immediately above the pixel portion, and one CF and one ML are provided for PD in each pixel.

For example, each CF in the color filter layer 12 may have any color of red, green, and blue. When light that has passed through the CF enters the PD in the pixel and is converted into a pixel signal, a pixel signal of a color component corresponding to the CF of an imaging target is acquired. More specifically, in the solid-state imaging device 1, one pixel corresponding to one CF functions as a subpixel, and one pixel may be formed by a plurality of subpixels. For example, in the solid-state imaging device 1, one pixel may be formed by four-color subpixels of a red pixel, in which a red CF is provided, a green pixel, in which a green CF is provided, a blue pixel, in which a blue CF is provided, and a white pixel, in which a CF is not provided. The arrangement method for CF is not particularly limited, and may be various types of arrangement, for example, delta arrangement, stripe arrangement, diagonal arrangement, and rectangle arrangement.

The micro lens array 13 is formed such that each ML is located immediately above each CF. The micro lens array 13 condenses light by each ML and causes the condensed light to enter a PD in a pixel, thereby being capable of improving the sensitivity of the solid-state imaging device 1.

The pad 15 is formed in the multi-layer wiring layer in the first substrate 10, and functions as an input/output (I/O) portion for exchanging various kinds of signals with the outside. For example, the pad 15 may be provided along the outer periphery of the first substrate 10. The metal surface of the pad 15 is exposed by the pad opening portion 17, and the pad 15 is electrically connected to an external circuit by, for example, wire bonding through the pad opening portion 17. For example, the pad 15 may be formed from metal such as aluminum (Al) in consideration of adhesiveness with a wire for wire bonding.

For example, the second substrate 20 is formed by bonding the circuit board 200, on which a circuit is formed, and the opening substrate 300, in which the opening 330 passing through the substrate is formed. For example, the circuit board 200 is a logic substrate on which a logic circuit is formed.

Specifically, for example, the circuit board 200 includes a semiconductor substrate made of Si and a multi-layer wiring layer formed on the semiconductor substrate. In the semiconductor substrate and the multi-layer wiring layer, logic circuits for executing various kinds of signal processing related to the operation of the solid-state imaging device 1 may be formed. For example, the logic circuit controls a drive signal for driving the pixel portion in the first substrate 10, and controls the exchange of signals with the outside. The circuit board 200 is provided with a through-via 201 for electrically connecting the electrode 101 provided in the first substrate 10 and the electrode 411 provided in the sub-chip 400.

For example, the opening substrate 300 is formed by providing the opening 330 passing through the semiconductor substrate in a partial region of the semiconductor substrate made of Si. Specifically, the opening 330 provided in the opening substrate 300 is formed with a planar area smaller than the planar area of the first substrate 10 and larger than the planar area of the sub-chip 400. In this manner, the opening substrate 300 can house the sub-chip 400 inside the opening 330.

The opening substrate 300 functions as a support and a carrier wafer for the solid-state imaging device 1. The opening substrate 300 is provided with the opening 330, and hence the sub-chip 400 can form electrical connection with the circuit board 200 through the opening 330. The configuration of the opening substrate 300 itself is not particularly limited. The opening substrate 300 may be formed by only the semiconductor substrate, or may be formed by a lamination substrate, in which the semiconductor substrate and a multi-layer wiring layer are laminated.

The sub-chip 400 is provided inside the opening 330 so as not to protrude from the opening 330, and is bonded to the circuit board 200. With this, the sub-chip 400 can be electrically connected to the circuit board 200 through the opening 330 in the opening substrate 300. The sub-chip 400 does not protrude from the opening 330, and hence, for example, the sub-chip 400 is protected by the opening substrate 300 when the surface opposed to the surface on which the sub-chip 400 is provided (that is, light receiving surface of first substrate 10) is subjected to thinning processing.

For example, the sub-chip 400 includes a semiconductor substrate made of Si and a multi-layer wiring layer formed on the semiconductor substrate. In the semiconductor substrate and the multi-layer wiring layer, a memory circuit for temporarily holding a pixel signal acquired at the pixel portion in the first substrate 10 and AD-converted by the pixel signal processing circuit may be formed. The sub-chip 400 is provided with an electrode 411 for inputting and outputting a signal to and from the first substrate 10 or the second substrate 20.

In the solid-state imaging device 1, global shutter imaging can be implemented by temporarily holding pixel signals in the memory circuit. Pixel signals can be read from the solid-state imaging device 1 to an external circuit at higher speed. Consequently, the solid-state imaging device 1 can suppress distortion in images to take images with higher quality even during high-speed photographing.

The sub-chip 400 is not limited to the above-mentioned memory chip, and may be a chip in which another element is formed. For example, the sub-chip 400 may be a chip in which a gyro element or an antenna element is formed, and the sub-chip 400 may be a chip in which an infrared light receiving element using compound semiconductor is formed.

As the materials of the semiconductor substrates and the multi-layer wiring layers in the first substrate 10, the second substrate 20, and the sub-chip 400, the circuits formed in the semiconductor substrates and the multi-layer wiring layers, and the methods for forming the semiconductor substrates and the multi-layer wiring layers, the publicly known ones can be appropriately used, and hence detailed descriptions thereof are here omitted.

For example, the semiconductor substrate may be other types of semiconductor substrates than a silicon substrate, such as a gallium arsenide (GaAs) substrate and a silicon carbide (SiC) substrate. Alternatively, the semiconductor substrate may be a substrate in which semiconductor such as silicon is laminated on a sapphire substrate. The multi-layer wiring layer may be, for example, a laminate body in which a metal wiring layer of copper (Cu) or aluminum (Al) is formed in an insulating layer of $SiO_2$ or SiN.

The semiconductor substrates constituting the first substrate 10 and the second substrate 20 and the semiconductor substrate constituting the sub-chip 400 may be formed from the same material. In such a case, the coefficients of thermal expansion and the coefficients of thermal conductivity of the first substrate 10, the second substrate 20, and the sub-chip 400 are equal to one another, and hence thermal stress and heat radiation performance can be improved.

It should be understood that the semiconductor substrates constituting the first substrate 10 and the second substrate 20 and the semiconductor substrate constituting the sub-chip 400 may be formed from different materials. In the solid-state imaging device 1 according to the present embodiment, the degree of freedom of the type, size, and layout of the sub-chip 400 is high, and hence even a sub-chip 400 to be mounted to a mounting substrate of dedicated material can be used without any problem.

Circuits provided in the first substrate 10, the circuit board 200 in the second substrate 20, and the sub-chip 400 are electrically connected to one another. For example, the first substrate 10, the circuit board 200, and the sub-chip 400 may be electrically connected to one another by coupling electrodes 101 and 411 respectively provided in the first substrate 10 and the sub-chip 400 through a through-via 201 provided in the circuit board 200.

The electrical connection method for the first substrate 10, the circuit board 200, and the sub-chip 400 is not limited to the above, and various publicly known methods can be used.

For example, as described above, the circuits provided in the first substrate 10, the circuit board 200, and the sub-chip 400 may be electrically connected through a through-via formed by filling a through hole passing through the semiconductor substrate with metal such as Cu. The circuits provided in the first substrate 10, the circuit board 200, and the sub-chip 400 may be electrically connected in a manner that electrodes exposed on the surfaces of chips are brought into contact with each other and then the electrodes are bonded together by thermal treatment. Such a structure in which the exposed electrodes are bonded by being brought into direct contact with each other is sometimes called "electrode bonding structure". The electrode bonding structure, which is formed at an interface between bonded chips, can improve the degree of freedom of layout of wiring and electrodes as compared with the case where chips are electrically connected by using through-vias.

Although the illustration is omitted in each figure, it should be understood that in the solid-state imaging device 1, insulating material is interposed at a part where metal material of wiring and through-vias is in contact with a semiconductor substrate in order to electrically insulate the metal material and the semiconductor substrate. As the insulating material, for example, publicly known insulating material exemplified by a silicon oxide such as $SiO_2$ or a silicon nitride such as SiN can be used. The insulating material may be interposed between the metal material and the semiconductor substrate, or may be present in the semiconductor substrate at a position away from a contact part therebetween. For example, in the through-via, the above-mentioned insulating material may be present between an inner wall of a through hole provided in the semiconductor substrate and metal material buried in the through hole.

As described above, in the solid-state imaging device 1 according to the present embodiment, the second substrate 20 formed by the circuit board 200 and the opening substrate 300 can be used as a support, and a space for mounting the sub-chip 400 therein can be provided by the opening 330 formed in the opening substrate 300. Consequently, the solid-state imaging device 1 according to the present embodiment can be thinned without separating the second substrate 20 serving as a support, and diced sub-chips 400 can be bonded thereto.

<2. Method for manufacturing solid-state imaging device>

Next, an example of a method for manufacturing the solid-state imaging device 1 according to the present embodiment is described with reference to FIGS. 2, 3A, 3B, 3C, 3D, 3E, 3F, 3G, and 3H. FIG. 2 is a schematic view for describing the outline of the method for manufacturing the solid-state imaging device 1 according to the present embodiment. FIGS. 3A, 3B, 3C, 3D, 3E, 3F, 3G, and 3H are schematic vertical sectional views for describing steps in the method for manufacturing the solid-state imaging device 1 according to the present embodiment.

First, the outline of the method for manufacturing the solid-state imaging device 1 according to the present embodiment is described with reference to FIG. 2. As illustrated in FIG. 2, a first substrate 10 before dicing, on which pixel portions 1A are formed, and a circuit board 200 are first bonded together. Specifically, the circuit board 200 is bonded to a surface of the first substrate 10 opposed to the surface on which the pixel portions 1A are formed. After that, thinning processing of the circuit board 200 is performed by a combination of backgrinding and CMP.

Next, a laminate body of the first substrate 10 and the circuit board 200 is bonded to the opening substrate 300 provided with the opening 330. Specifically, the opening substrate 300 is bonded to the surface of the laminate body of the first substrate 10 and the circuit board 200 on the circuit board 200 side. In this case, the opening 330 in the opening substrate 300 is formed at a position corresponding to a position at which the pixel portion 1A is formed in the first substrate 10.

Subsequently, individual sub-chips 400 are cut from a wafer 401, on which sub-chips 400 are separately formed, and only sub-chips 400 satisfying desired characteristics are placed on the circuit board 200. Specifically, a sub-chip 400 is bonded onto the circuit board 200 by being placed inside the opening 330 in the opening substrate 300, and is electrically connected to the circuit board 200 and the first substrate 10. After that, the surface of the first substrate 10 on which the pixel portion 1A is formed is subjected to thinning processing. In this case, the sub-chip 400 is provided so as not to protrude from the opening 330 and is thus protected by the opening substrate 300, and hence is not particularly affected by the thinning processing of the first substrate 10.

After that, the color filter layer 12 and the micro lens array 13 are formed on the surface of the first substrate 10 on which the pixel portion 1A is formed. Subsequently, the thinning processing of the opening substrate 300 is performed to manufacture a wafer on which the solid-state imaging devices 1 are arranged. By dicing the wafer for each solid-state imaging device 1, the solid-state imaging device 1 separated for each chip is manufactured.

Next, the method for manufacturing the solid-state imaging device 1 according to the present embodiment is described in detail with reference to FIGS. 3A, 3B, 3C, 3D, 3E, 3F, 3G, and 3H.

Figure 3A:
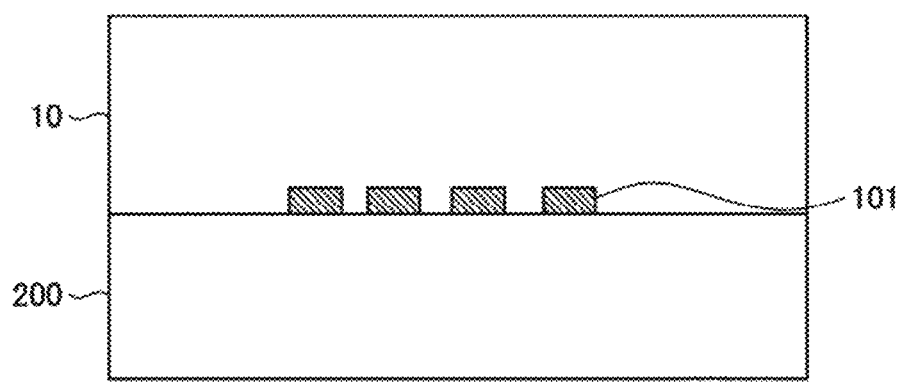
FIG. 3A is a schematic vertical sectional view for describing one step in the method for manufacturing the solid-state imaging device according to the embodiment.

First, as illustrated in FIG. 3A, a photodiode (not shown), a pixel transistor (not shown), wiring (not shown), and the electrode 101 are formed in the first substrate 10 by a publicly known method. The electrode 101 functions as an electrical connection point in the first substrate 10 used for electrically connecting the first substrate 10, the circuit board 200, and the sub-chip 400 at a subsequent stage.

Next, the circuit board 200, in which a circuit having a predetermined function is provided, is formed and bonded to the first substrate 10 by a publicly known method. The method for bonding the circuit board 200 and the first substrate 10 is not particularly limited. For example, the circuit board 200 and the first substrate 10 may be bonded together such that multi-layer wiring layers thereof are opposed to each other (what is called "face-to-face").

Figure 3B:
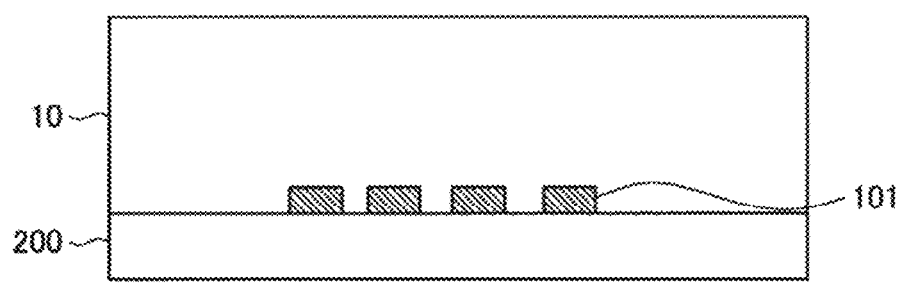
FIG. 3B is a schematic vertical sectional view for describing one step in the method for manufacturing the solid-state imaging device according to the embodiment.

Next, as illustrated in FIG. 3B, the surface of a laminate body in which the first substrate 10 and the circuit board 200 are bonded together on the circuit board 200 side is thinned. The thinning can be performed by using a publicly known method. For example, the surface may be thinned by a combination of backgrinding and CMP.

Figure 3C:
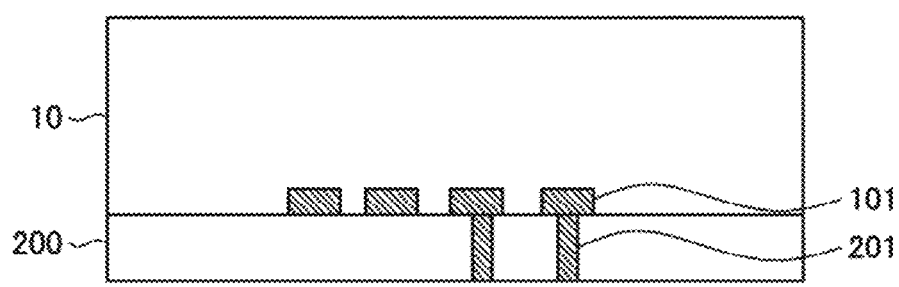
FIG. 3C is a schematic vertical sectional view for describing one step in the method for manufacturing the solid-state imaging device according to the embodiment.

After that, as illustrated in FIG. 3C, the through-via 201 passing through the circuit board 200 and electrically connected to the electrode 101 in the first substrate is formed by using a publicly known method. The through-via 201 functions as an electrical point between the sub-chip 400 and the circuit board 200 when the sub-chip 400 is bonded to the circuit board 200.

Figure 3D:
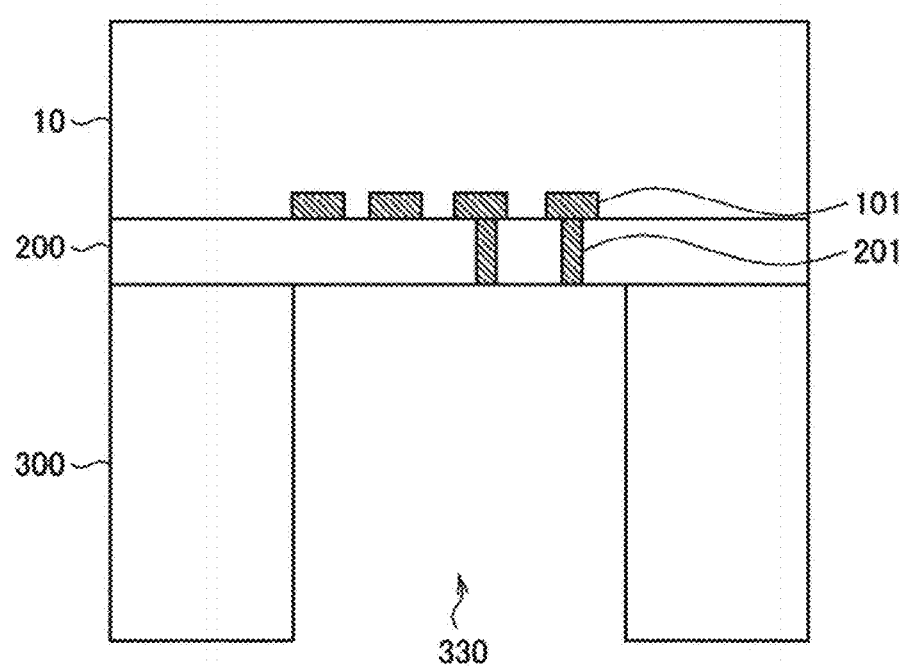
FIG. 3D is a schematic vertical sectional view for describing one step in the method for manufacturing the solid-state imaging device according to the embodiment.

Subsequently, as illustrated in FIG. 3D, a laminate body, in which the first substrate 10 and the circuit board 200 are bonded together, is bonded to the opening substrate 300 provided with the opening 330. Specifically, the opening substrate 300 is bonded to the surface of the laminate body in which the first substrate 10 and the circuit board 200 are bonded together on the circuit board 200 side by plasma bonding.

Figure 3E:
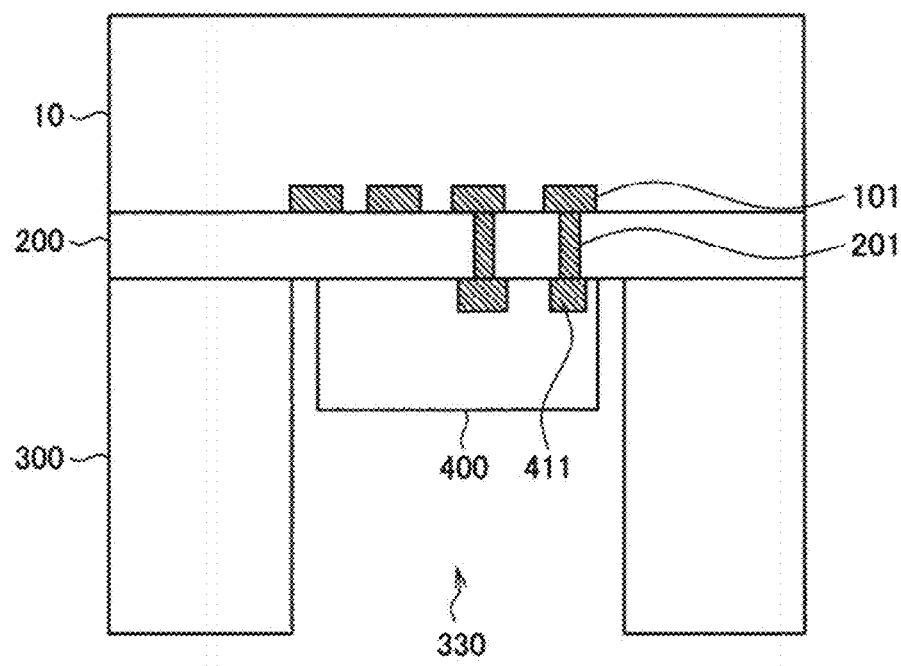
FIG. 3E is a schematic vertical sectional view for describing one step in the method for manufacturing the solid-state imaging device according to the embodiment.

Next, as illustrated in FIG. 3E, the sub-chip 400 and the circuit board 200 are bonded together through the opening 330. Specifically, the sub-chip 400 is provided inside the opening 330 in the opening substrate 300, and is thus bonded to the surface of a laminate body in which the first substrate 10 and the circuit board 200 are bonded together on the circuit board 200 side. For example, the sub-chip 400 and the circuit board 200 may be bonded together by using plasma bonding.

In this case, the sub-chip 400 is bonded to the circuit board 200 such that the electrode 411 in the sub-chip 400 and the through-via 201 in the circuit board 200 form electrical connection. The method for forming electrical connection between the sub-chip 400 and the circuit board 200 is not particularly limited. For example, the sub-chip 400 and the circuit board 200 may be electrically connected by using the above-mentioned electrode bonding structure in place of bonding of the electrode 411 and the through-via 201.

Figure 3F:
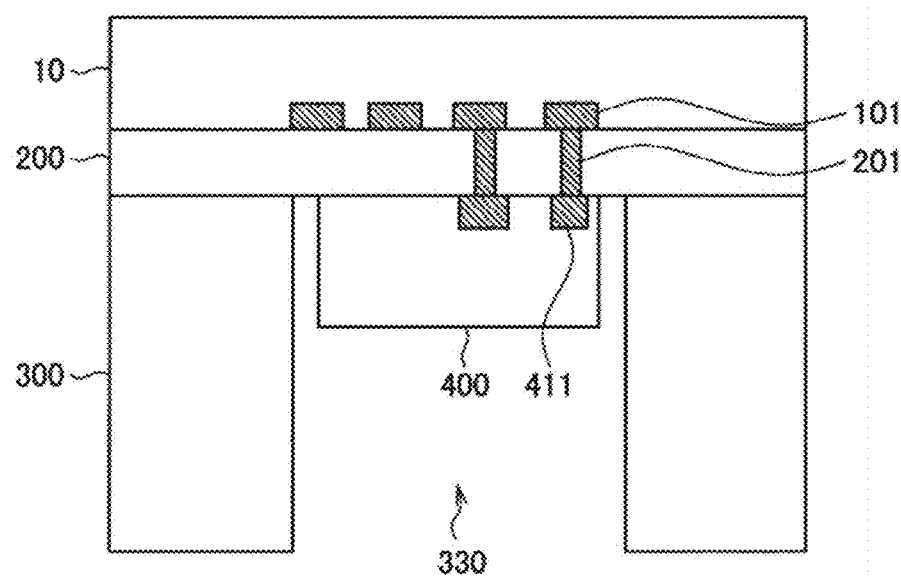
FIG. 3F is a schematic vertical sectional view for describing one step in the method for manufacturing the solid-state imaging device according to the embodiment.

Subsequently, as illustrated in FIG. 3F, the surface of a laminate body of the first substrate 10, the circuit board 200, the opening substrate 300, and the sub-chip 400 on the first substrate 10 side is thinned. Specifically, the surface of the first substrate 10 opposed to the surface bonded to the circuit board 200 (pixel forming surface, on which photodiode and the like are formed) is thinned by a publicly known method.

Figure 3G:
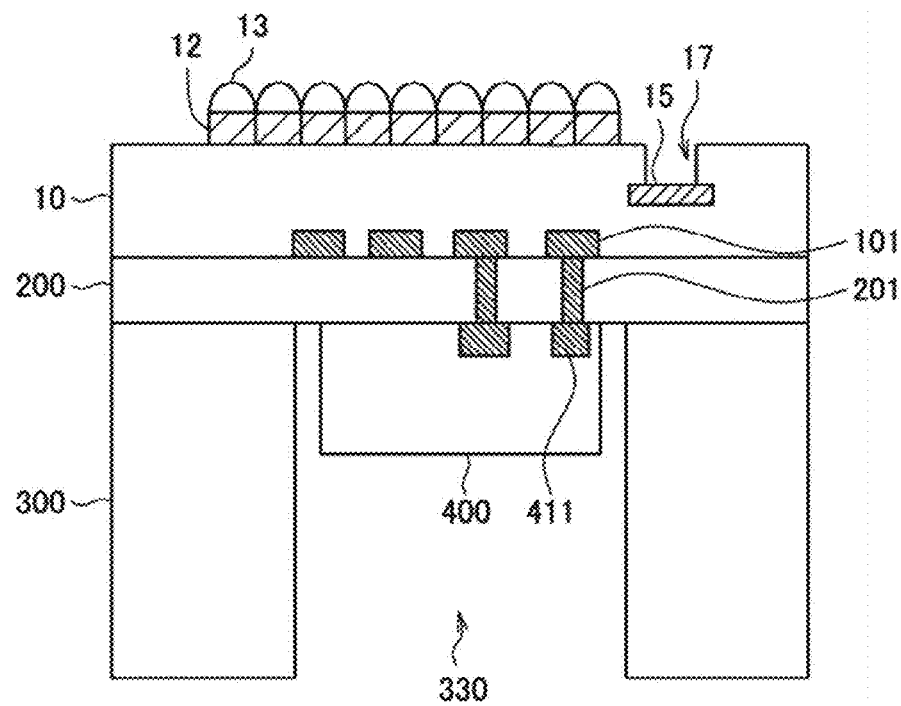
FIG. 3G is a schematic vertical sectional view for describing one step in the method for manufacturing the solid-state imaging device according to the embodiment.

After that, as illustrated in FIG. 3G, the color filter layer 12 and the micro lens array 13 are formed on the pixel forming surface of the thinned first substrate 10. The pad opening portion 17 is formed in the pixel forming surface of the thinned first substrate 10, and hence the pad 15, which has been formed inside the first substrate 10, is exposed.

Figure 3H:
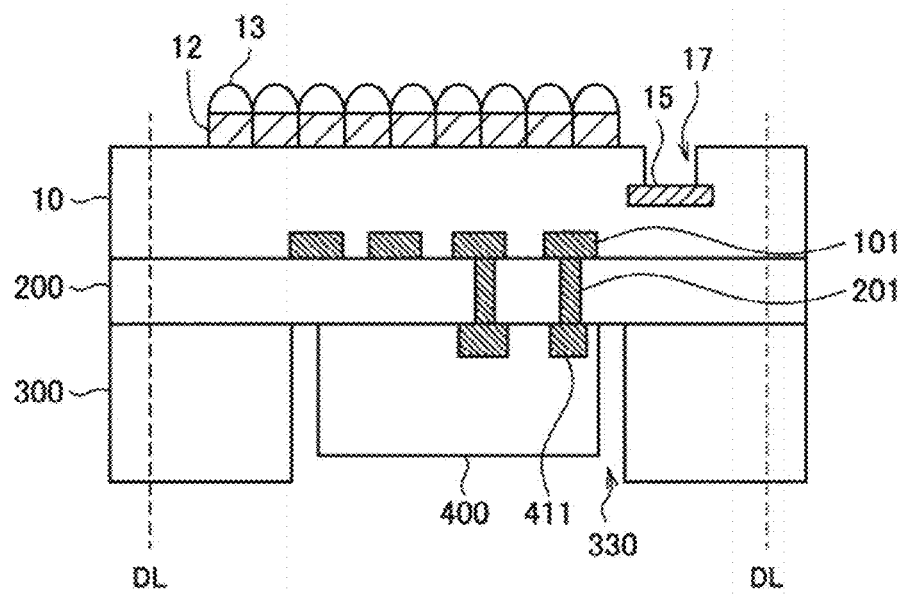
FIG. 3H is a schematic vertical sectional view for describing one step in the method for manufacturing the solid-state imaging device according to the embodiment.

Furthermore, as illustrated in FIG. 3H, after the opening substrate 300 is thinned, the solid-state imaging devices 1 are cut along dicing lines DL, so that the solid-state imaging device 1 prepared as a discrete chip can be manufactured.

The method for manufacturing the solid-state imaging device 1 is not limited to the above. The order of the above-mentioned steps may be replaced depending on cases. For example, the order of the bonding of the sub-chip 400 and the thinning of the first substrate 10 may be replaced. The order of the thinning of the opening substrate 300 and the formation of the color filter layer 12 may be replaced.

The second substrate 20, which is formed as the laminate body of the circuit board 200 and the opening substrate 300 in the above, may be formed by other methods. The other methods are described with reference to FIGS. 4A, 4B, 4C, 4D, 5A, 5B, 5C, 5D, 5E, and 5F.

For example, a method to be described with reference to FIGS. 4A, 4B, 4C, and 4D are methods for forming the second substrate 20 by bonding the circuit board 200 and the opening substrate 300 together in advance instead of sequentially bonding the circuit board 200 and the opening substrate 300 together as the second substrate 20 to the first substrate 10. FIGS. 4A, 4B, 4C, and 4D are schematic vertical sectional views illustrating steps in another method for forming the second substrate 20.

Figure 4A:
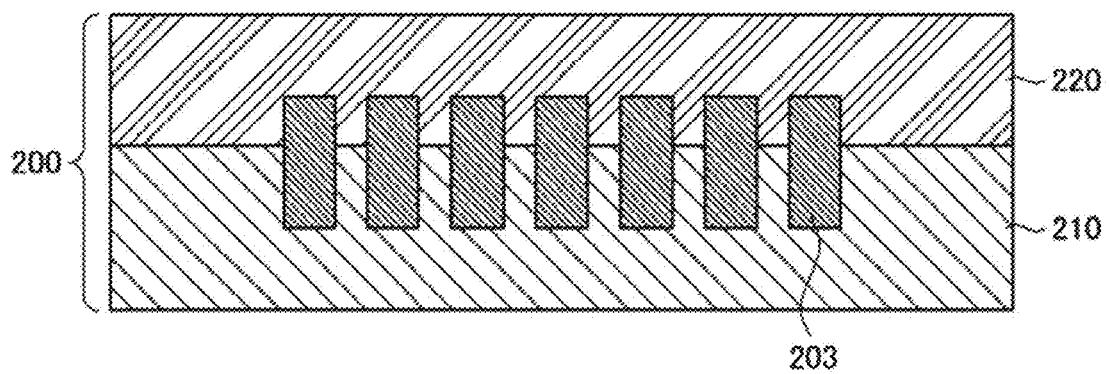
FIG. 4A is a schematic vertical sectional view illustrating one step in another method for forming a second substrate.

First, as illustrated in FIG. 4A, a circuit board 200, in which a multi-layer wiring layer 220 and a semiconductor substrate 210 are laminated, is formed. In the circuit board 200, an electrode 203 to be subsequently exposed through an opening 330 is formed between the multi-layer wiring layer 220 and the semiconductor substrate 210. It should be understood that the circuit board 200 is additionally provided with a circuit having a predetermined function, such as a logic circuit, and the circuit is electrically connected to the electrode 203.

Figure 4B:
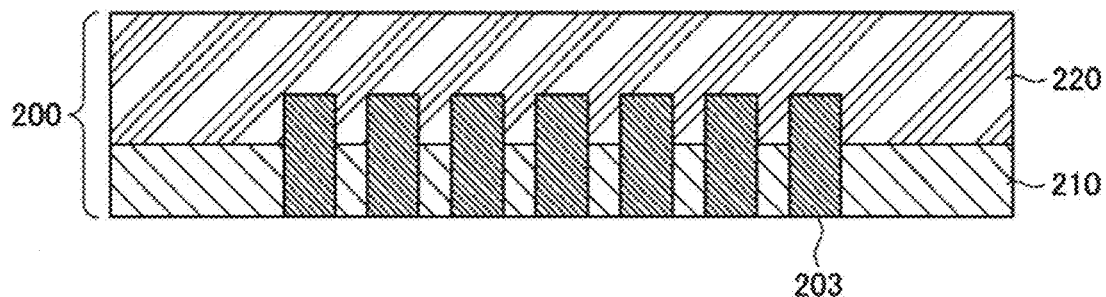
FIG. 4B is a schematic vertical sectional view illustrating one step in the other method for forming the second substrate.

Next, as illustrated in FIG. 4B, the semiconductor substrate 210 in the circuit board 200 is thinned by a combination of backgrinding and CMP. Specifically, the semiconductor substrate 210 is thinned to the extent that the electrode 203 formed therein is exposed.

Figure 4C:
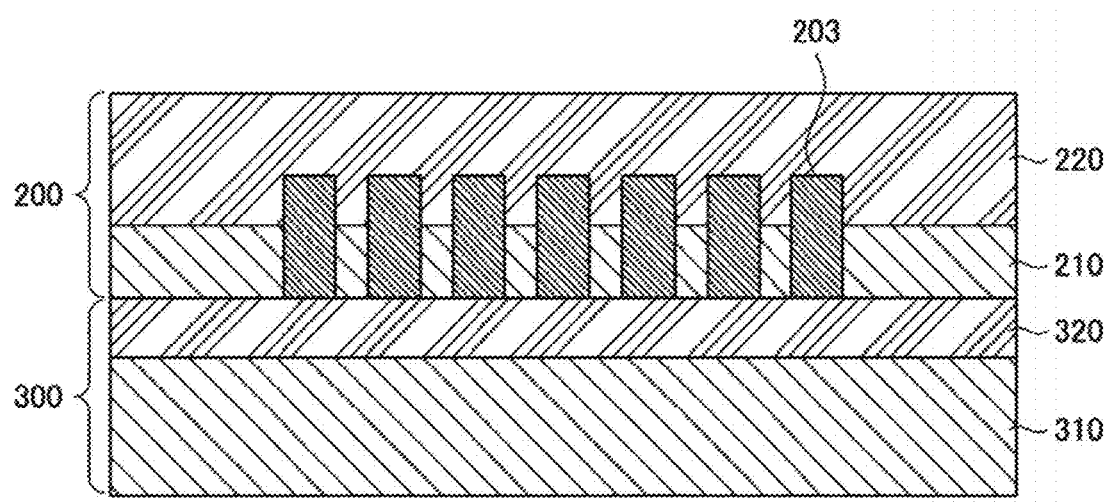
FIG. 4C is a schematic vertical sectional view illustrating one step in the other method for forming the second substrate.

Subsequently, as illustrated in FIG. 4C, the opening substrate 300, in which the multi-layer wiring layer 320 and the semiconductor substrate 310 are laminated, is bonded to the surface of the circuit board 200 on the semiconductor substrate 210 side. Specifically, the circuit board 200 and the opening substrate 300 are bonded together such that the surface of the circuit board 200 on the semiconductor substrate 210 side and the surface of the opening substrate 300 on the multi-layer wiring layer 320 side are opposed to each other (that is, back-to-face).

Figure 4D:
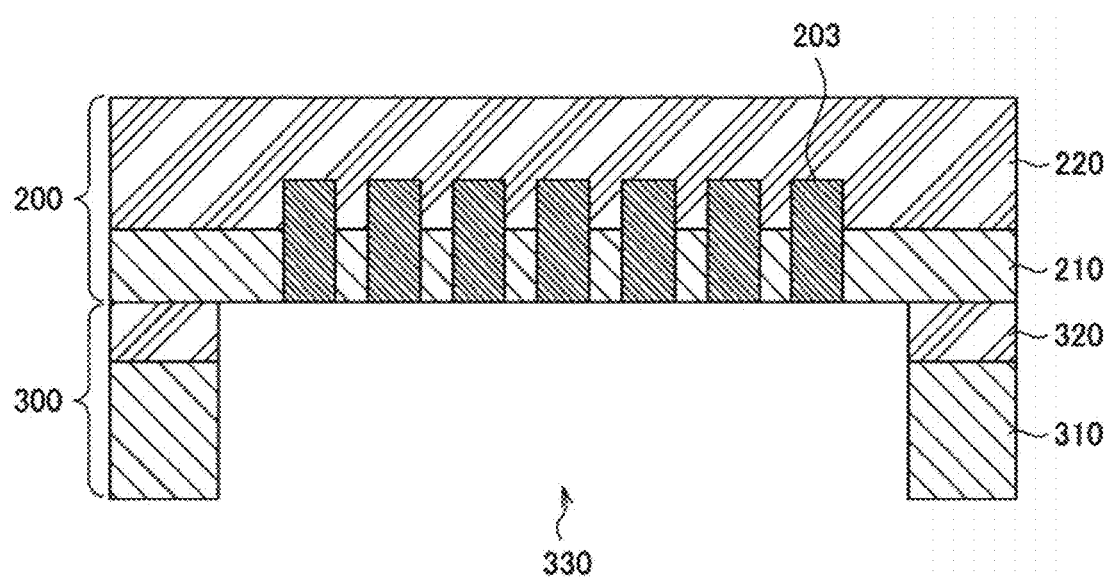
FIG. 4D is a schematic vertical sectional view illustrating one step in the other method for forming the second substrate.

After that, as illustrated in FIG. 4D, the opening 330 is formed such that the electrode 203 formed in the circuit board 200 is exposed from the surface of the opening substrate 300 on the semiconductor substrate 310 side. For example, photolithography and etching can be used to remove predetermined regions in the semiconductor substrate 310 and the multi-layer wiring layer 320 to form the opening 330 for exposing the electrode 203.

Through the steps described above, the second substrate 20, in which the opening 330 is provided in a predetermined region and which can be electrically connected to the sub-chip 400 inside the opening 330, can be formed. By bonding the surface of such a second substrate 20 on the multi-layer wiring layer 220 side of the circuit board 200 to the first substrate 10, the solid-state imaging device 1 can be manufactured as in the manufacturing method described above with reference to FIGS. 3A, 3B, 3C, 3D, 3E, 3F, 3G, and 3H.

Figure 5A:
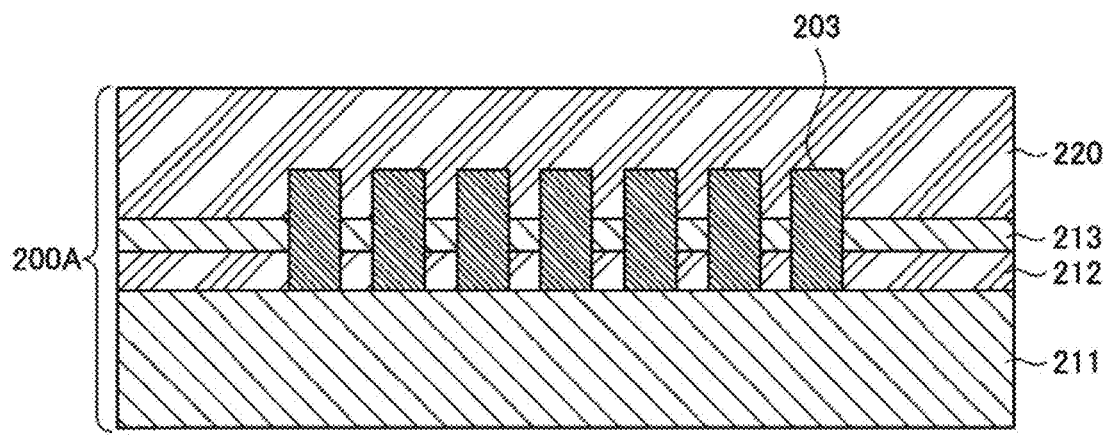
FIG. 5A is a schematic vertical sectional view illustrating one step in still another method for forming the second substrate.
Figure 5B:
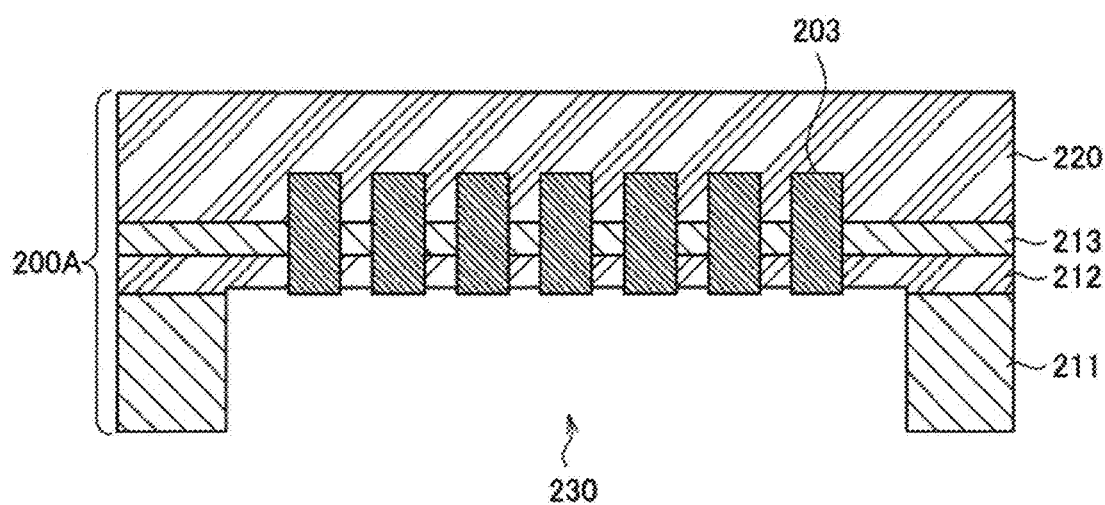
FIG. 5B is a schematic vertical sectional view illustrating one step in the other method for forming the second substrate.

For example, a method to be described with reference to FIGS. 5A and 5B are methods for forming a second substrate 200A by a single substrate instead of sequentially bonding the circuit board 200 and the opening substrate 300 serving as the second substrate 20 to the first substrate 10. FIGS. 5A and 5B are schematic vertical sectional views illustrating steps in still another method for forming the second substrate 200A.

First, as illustrated in FIG. 5A, the second substrate 200A, in which the semiconductor substrate 211, the BOX layer 212, the SOI layer 213, and the multi-layer wiring layer 220 are laminated, is formed. For example, the BOX layer 212 is a layer formed from an oxide such as $SiO_2$, and the SOI layer 213 is a layer formed from semiconductor such as Si similarly to the semiconductor substrate 211. In other words, the second substrate 200A may be what is called "silicon-on-insulator (SOI) substrate". In the second substrate 200A, an electrode 203 that subsequently forms electrical connection to the sub-chip 400 is formed from the multi-layer wiring layer 220 to the semiconductor substrate 211. It should be understood that the second substrate 200A is additionally provided with a circuit having a predetermined function, such as a logic circuit, and the circuit is electrically connected to the electrode 203.

After that, as illustrated in FIG. 5B, the opening 230 is formed such that the electrode 203 is exposed from the surface on the semiconductor substrate 211 side. For example, photolithography and etching can be used to remove a predetermined region in the semiconductor substrate 211 and form the opening 230 to expose the electrode 203.

Through the steps described above, the second substrate 200A, in which the opening 230 is provided in a predetermined region and which can be electrically connected to the sub-chip 400 inside the opening 230, can be formed. By bonding the surface of such a second substrate 200A on the multi-layer wiring layer 220 side to the first substrate 10, the solid-state imaging device 1 can be manufactured as in the manufacturing method described above with reference to FIGS. 3A, 3B, 3C, 3D, 3E, 3F, 3G, and 3H.

A method to be described with reference to FIGS. 5C, 5D, 5E, and 5F are methods for forming electrodes 203 and 205 having different depths in the second substrate 200A. FIGS. 5C, 5D, 5E, and 5F are schematic vertical sectional views illustrating steps in still another method for forming the second substrate 200A.

Figure 5C:
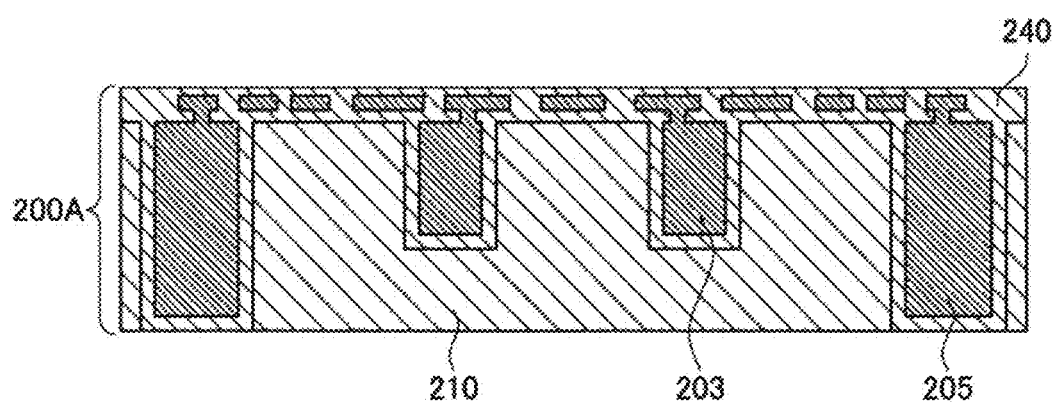
FIG. 5C is a schematic vertical sectional view illustrating another step in the other method for forming the second substrate.

First, as illustrated in FIG. 5C, the second substrate 200A including the electrodes 203 and 205 having different depths is formed. Specifically, the second substrate 200A includes a semiconductor substrate and a circuit formed on the semiconductor substrate. The circuit formed on the semiconductor substrate is a circuit for executing a predetermined function of the second substrate 200A, and is provided in a surface opposed to a surface in which the opening 230 is to be formed at a subsequent step. In the second substrate 200A, electrodes 203 and 205 are formed from the circuit toward the surface in which the opening 230 is formed. The electrode 203 is provided at a depth reaching the middle of the inside of the second substrate 200A, and the electrode 205 is provided at a depth passing through the second substrate 200A.

FIGS. 5C, 5D, 5E, and 5F clearly illustrate insulating material 240 interposed between the circuit and the electrodes 203 and 205 and the semiconductor substrate constituting the second substrate 200A. The insulating material 240 electrically insulates between the circuit and the electrodes 203 and 205 and the semiconductor substrate constituting the second substrate 200A, thereby preventing current from flowing from the circuit and the electrodes 203 and 205 to the semiconductor substrate. As the insulating material 240, for example, publicly known insulating material exemplified by a silicon oxide such as $SiO2$ or a silicon nitride such as SiN can be used. Although not illustrated in the other sectional views, the insulating material 240 for electrically insulating the metal material of wiring and through-vias and the semiconductor substrate is similarly interposed therebetween.

Figure 5D:
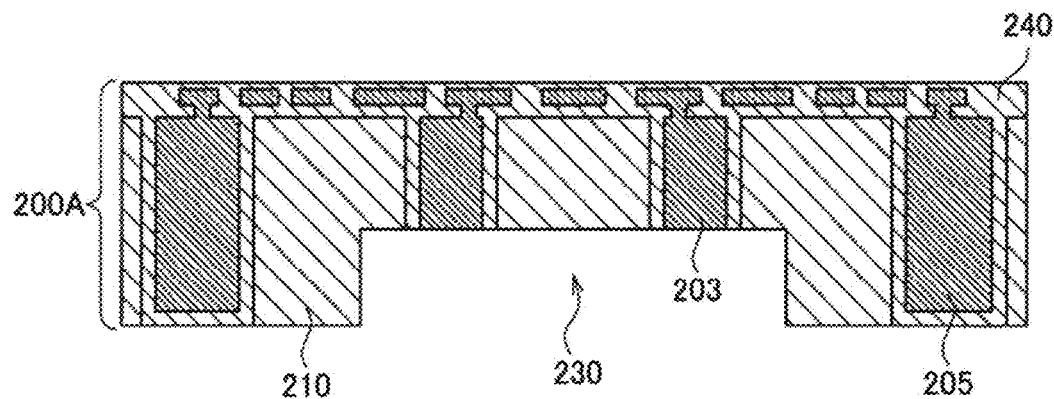
FIG. 5D is a schematic vertical sectional view illustrating another step in the other method for forming the second substrate.

Next, as illustrated in FIG. 5D, the opening 230 is formed such that the electrode 203 is exposed from one surface of the second substrate 200A. The opening 230 is not formed in a region where the electrode 205 passing through the second substrate 200A is formed. For example, photolithography and etching can be used to remove a predetermined region in the second substrate 200A and form the opening 230 to expose the electrode 203.

Figure 5E:
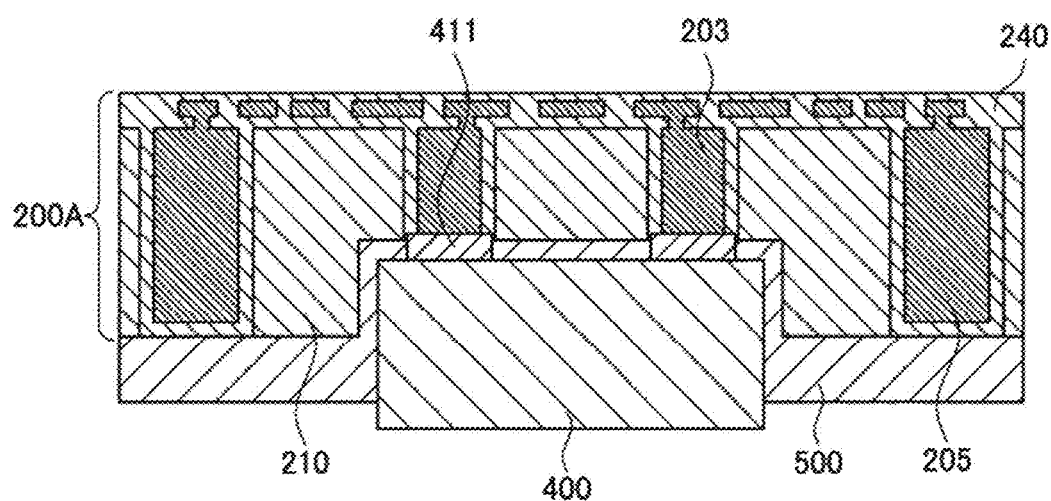
FIG. 5E is a schematic vertical sectional view illustrating another step in the other method for forming the second substrate.

Subsequently, as illustrated in FIG. 5E, the sub-chip 400 is disposed inside the opening 230, and the sub-chip 400 and the second substrate 200A are bonded through the opening 230. Specifically, the sub-chip 400 is disposed inside the opening 230 such that the position of the electrode 411 provided in the sub-chip 400 corresponds to the position of the electrode 203 provided in the second substrate 200A. In this manner, the sub-chip 400 and the second substrate 200A are electrically connected to each other through the electrode 203 and the electrode 411.

After that, for example, the sub-chip 400 and the second substrate 200A are bonded together by using plasma bonding. A gap between the second substrate 200A and the sub-chip 400 may be filled with organic resin 500. As the organic resin 500, any publicly known resin used for a sealant or a filler can be used.

Figure 5F:
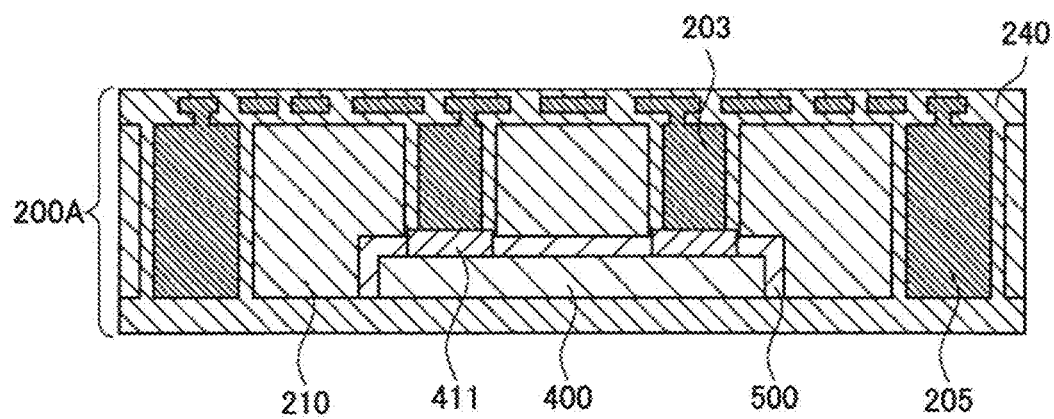
FIG. 5F is a schematic vertical sectional view illustrating another step in the other method for forming the second substrate.

Next, as illustrated in FIG. 5F, the second substrate 200A and the sub-chip 400 are thinned from the surface on which the sub-chip 400 is provided. Specifically, BGR and CMP are used to thin the second substrate 200A and the sub-chip 400 until the electrode 205 is exposed. With this, the second substrate 200A and the sub-chip 400 can be simultaneously thinned at a single step. The electrode 205 exposed by the thinning can be used as an external input/output terminal of the second substrate 200A. An insulating material 240 may be formed on the thinned surfaces of the second substrate 200A and the sub-chip 400 in order to protect the sub-chip 400 and the electrode 205.

By bonding the second substrate 200A described above to the first substrate 10, the solid-state imaging device 1 can be manufactured as in the manufacturing method described above with reference to FIGS. 3A, 3B, 3C, 3D, 3E, 3F, 3G, and 3H. The second substrate 200A may be bonded to the first substrate 10 immediately after the opening 230 is formed.

<3. Modifications of solid-state imaging device>

Figure 6A:
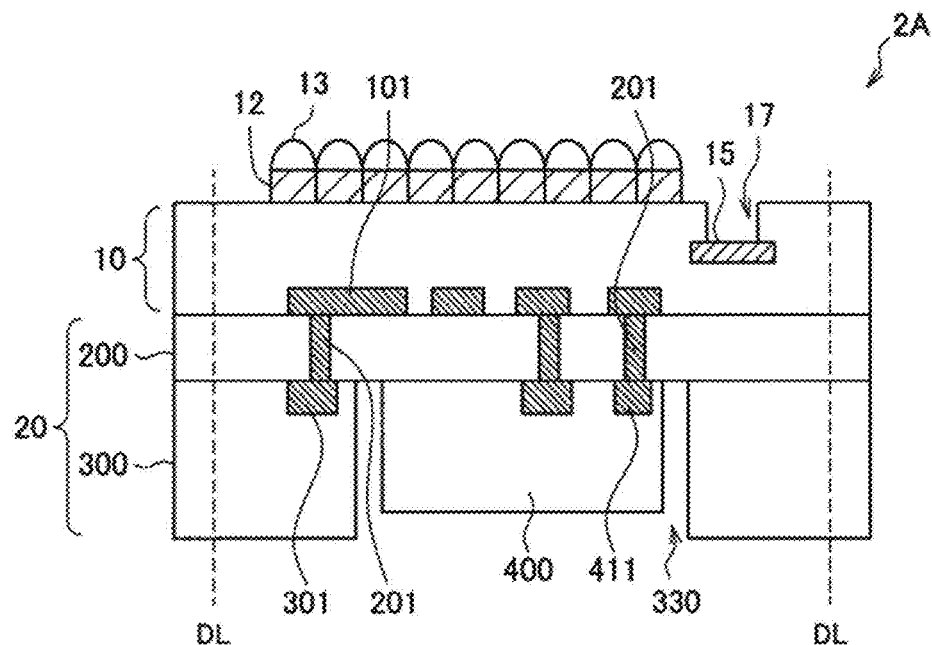
FIG. 6A is a vertical sectional view for schematically describing a configuration of a solid-state imaging device according to a first modification.
Figure 6B:
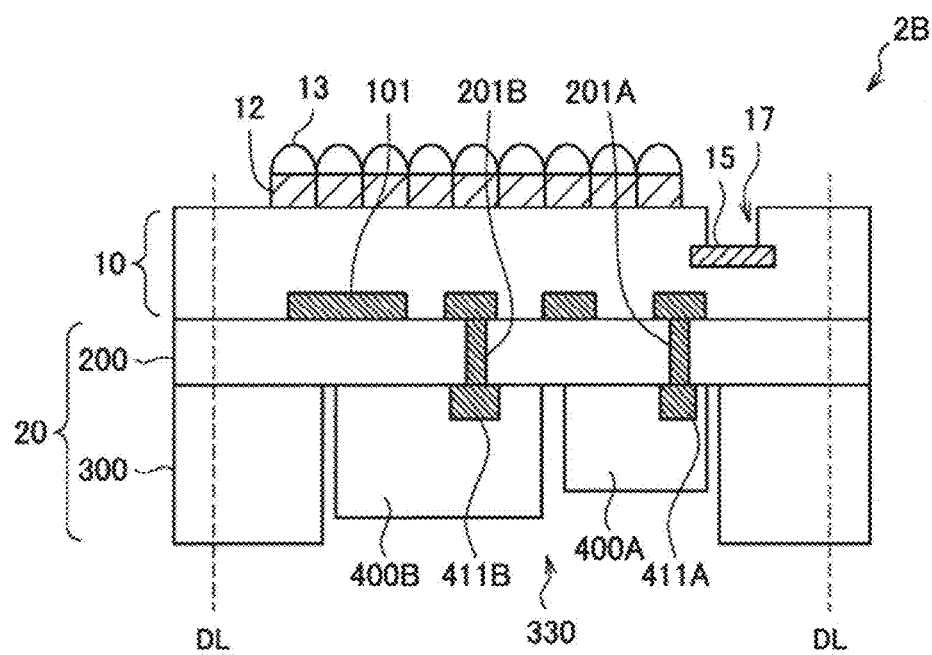
FIG. 6B is a vertical sectional view for schematically describing a configuration of a solid-state imaging device according to a second modification.

Next, solid-state imaging devices according to modifications of the present embodiment are described with reference to FIGS. 6A and 6B. FIG. 6A is a vertical sectional view for schematically describing a configuration of a solid-state imaging device 2A according to a first modification. FIG. 6B is a vertical sectional view for schematically describing a configuration of a solid-state imaging device 2B according to a second modification.

As illustrated in FIG. 6A, the solid-state imaging device 2A according to the first modification is different from the solid-state imaging device 1 illustrated in FIG. 1 in that an electrode 301 and a circuit (not shown) are formed in the opening substrate 300. Specifically, in the opening substrate 300, circuits such as transistors, wiring, and electrodes may be formed in regions excluding the region where the opening 330 is to be formed, and may function as circuits having predetermined functions that operate independently or in cooperation with circuits provided in the circuit board 200.

Configurations other than the above-mentioned configuration are substantially the same as those in the solid-state imaging device 1 illustrated in FIG. 1, and hence descriptions are omitted here.

As illustrated in FIG. 6B, the solid-state imaging device 2B according to the second modification is different from the solid-state imaging device 1 illustrated in FIG. 1 in that a plurality of sub-chips 400A and 400B are bonded inside the opening 330 in the opening substrate 300.

Specifically, the sub-chips 400A and 400B are bonded inside the opening 330 in the opening substrate 300, and are electrically connected to the first substrate 10 through an electrode 411A and a through-via 201A and through an electrode 411B and a through-via 201B, respectively. The sub-chips 400A and 400B may include circuits (not shown) having different functions, or may include circuits (not shown) having the same functions. The number of sub-chips bonded inside the opening 330 is not limited to two, and may be three or more. Also in this case, the sub-chips 400A and 400B bonded to the opening 330 are provided so as not to protrude from the opening 330.

Configurations other than the above-mentioned configuration are substantially the same as those in the solid-state imaging device 1 illustrated in FIG. 1, and hence descriptions thereof are omitted here.

<4. Specific example of solid-state imaging device>

Subsequently, a solid-state imaging device according to each specific example of the present embodiment is described with reference to FIGS. 7A, 7B, 7C, 7D, 7E, 8A, 8B, 8C, 8D, 8E, 8F, 8G, 9A, 9B, 9C, 9D, 10A, 1013, 11, 12A, 12B, 13A, 13B, 14A, 14B, 15A, 15B, 16A, 16B, 16C, 16D, 16E, and 17.

FIRST SPECIFIC EXAMPLE

Referring to FIGS. 7A, 7B, 7C, 7D, and 7E, a solid-state imaging device according to a first specific example is described. FIGS. 7A, 7B, 7C, 7D, and 7E are vertical sectional views schematically illustrating steps in a method for manufacturing a solid-state imaging device 3A according to the first specific example. In the solid-state imaging device 3A according to the first specific example, the opening 230 is provided in the second substrate 20, and the sub-chip 400 is buried inside the opening 230, thereby directly electrically connecting the second substrate 20 and the sub-chip 400.

Figure 7A:
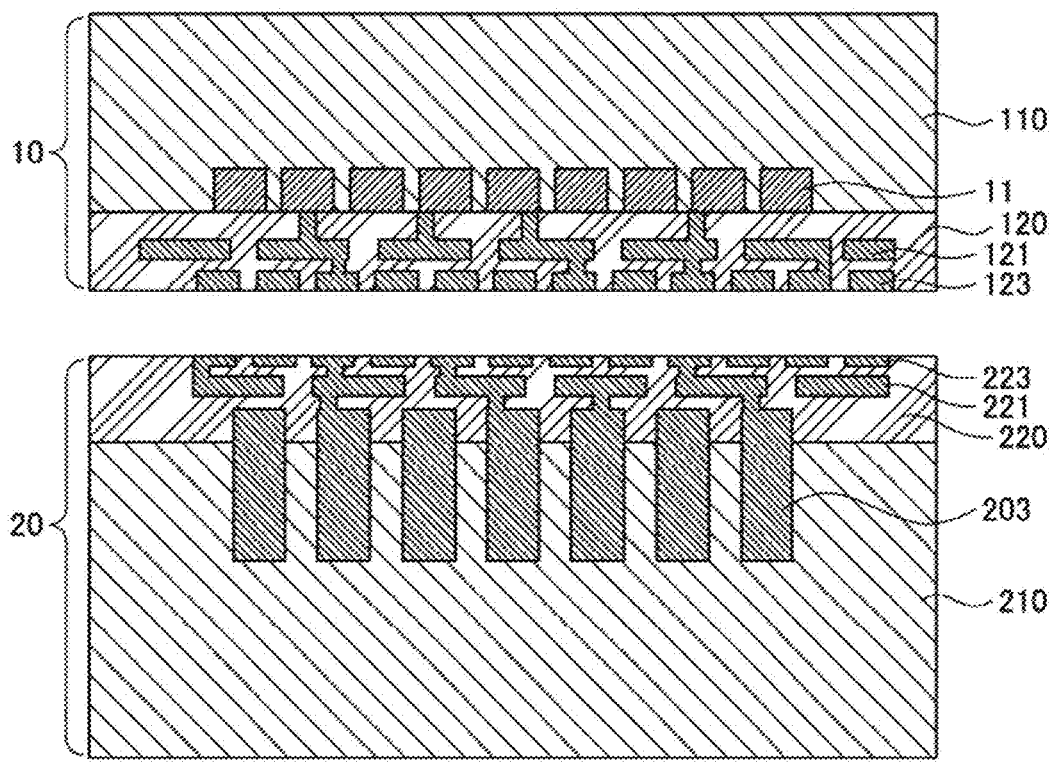
FIG. 7A is a vertical sectional view schematically illustrating one step in a method for manufacturing a solid-state imaging device according to a first specific example.

Specifically, as illustrated in FIG. 7A, first, a first substrate 10, in which a semiconductor substrate 110 and a multi-layer wiring layer 120 are laminated, is prepared. In the semiconductor substrate 110, a photodiode 11 is formed at a position corresponding to a pixel. In the multi-layer wiring layer 120, wiring 121 and an electrode 123 electrically connected to the photodiode 11 are formed. The electrode 123 is formed so as to be exposed on the topmost layer of the multi-layer wiring layer 120, so as to form an electrode bonding structure with an electrode 223 in the second substrate 20 described below.

A second substrate, in which a semiconductor substrate 210 and a multi-layer wiring layer 220 are laminated, is prepared. In the semiconductor substrate 210, the electrode 203 that subsequently forms an electrode bonding structure with the sub-chip 400 is formed in the region where the opening 230 is to be formed. In the multi-layer wiring layer 220, wiring 221 and electrodes 223 constituting a logic circuit for processing information on signals from the first substrate 10 are formed. The electrode 223 is formed so as to be exposed on the topmost layer of the multi-layer wiring layer 220, so as to form an electrode bonding structure with the electrode 123 in the first substrate 10.

Figure 7B:
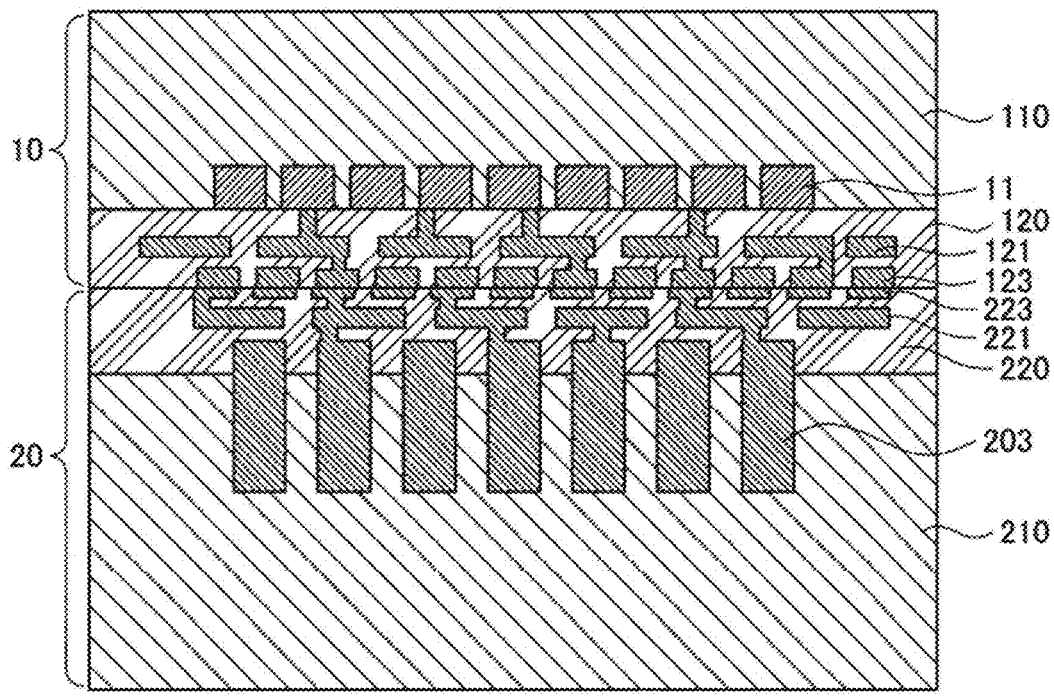
FIG. 7B is a vertical sectional view schematically illustrating one step in a method for manufacturing the solid-state imaging device according to the first specific example.

Next, as illustrated in FIG. 7B, the first substrate 10 and the second substrate 20 are bonded together such that the multi-layer wiring layer 120 of the first substrate 10 and the multi-layer wiring layer 220 of the second substrate 20 are opposed to each other (that is, face-to-face). In this case, the electrode 123 exposed on the surface of the multi-layer wiring layer 120 and the electrode 223 exposed on the surface of the multi-layer wiring layer 220 are brought into direct contact with each other and then bonded by thermal treatment to form an electrode bonding structure. In this manner, the first substrate 10 and the second substrate 20 are electrically connected.

Figure 7C:
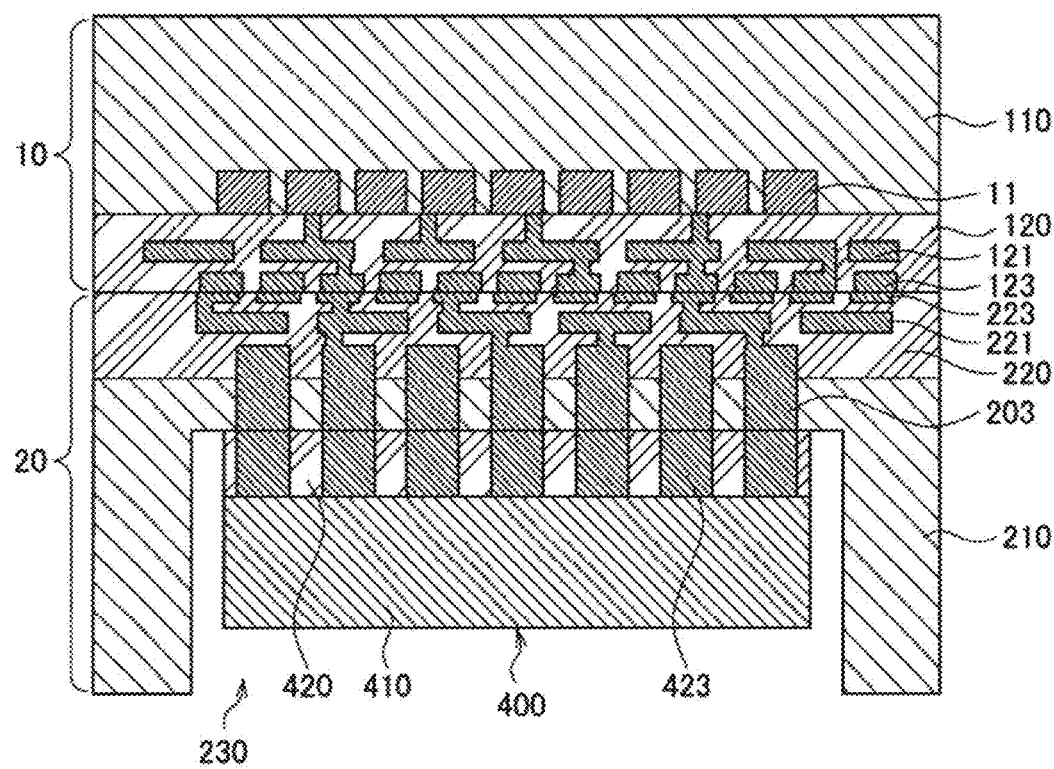
FIG. 7C is a vertical sectional view schematically illustrating one step in the method for manufacturing the solid-state imaging device according to the first specific example.

Subsequently, as illustrated in FIG. 7C, the opening 230 is provided in the surface of the laminate body of the first substrate 10 and the second substrate 20 on the semiconductor substrate 210 side, and the sub-chip 400 is placed inside the opening 230. Specifically, the sub-chip 400 is formed by laminating a semiconductor substrate 410 and a multi-layer wiring layer 420, and the multi-layer wiring layer 420 is provided with electrodes 423 for electrical connection to the second substrate 20. The opening 230 is provided at a depth and in a region that exposes the electrodes 203 provided in the semiconductor substrate 210. In this manner, the electrode 203 in the second substrate 20 and the electrode 423 in the sub-chip 400 form an electrode bonding structure, and the second substrate 20 and the sub-chip 400 are electrically connected to each other.

The semiconductor substrate 410 in the sub-chip 400 may be formed from material different from those of the semiconductor substrate 110 in the first substrate 10 and the semiconductor substrate 210 in the second substrate 20. In the solid-state imaging device 3A according to the first specific example, even the sub-chip 400 having the semiconductor substrate 410 made of material different from those of the semiconductor substrates 110 and 210 can be used without any particular problem.

Figure 7D:
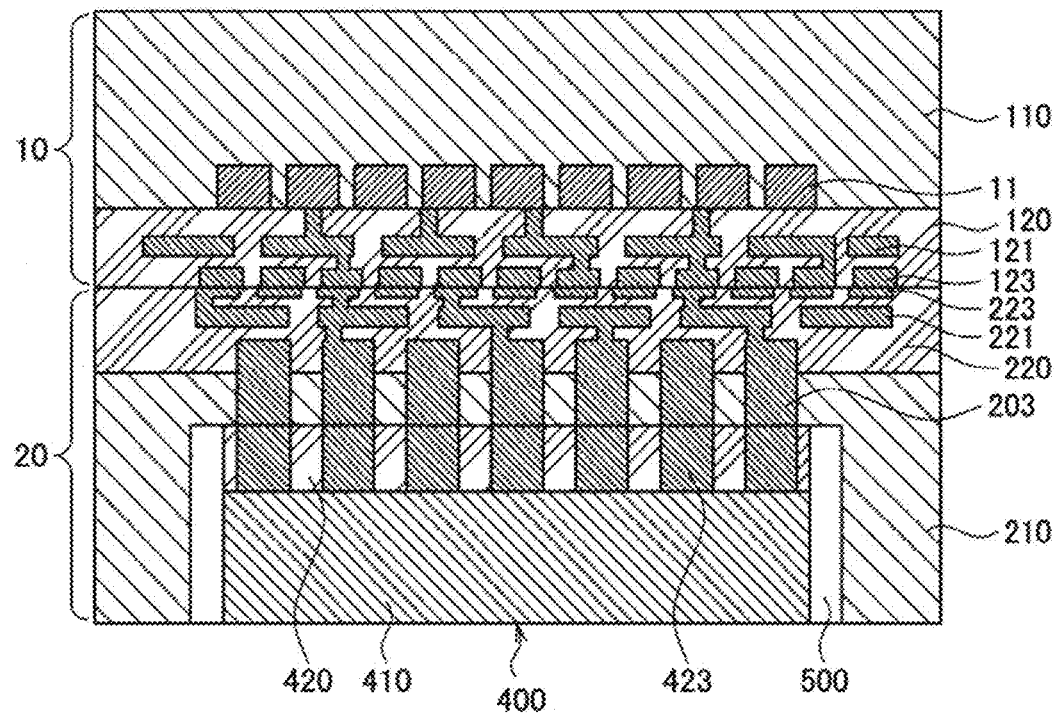
FIG. 7D is a vertical sectional view schematically illustrating one step in the method for manufacturing the solid-state imaging device according to the first specific example.

Subsequently, as illustrated in FIG. 7D, the surface of the laminate body of the first substrate 10, the second substrate 20, and the sub-chip 400 on the semiconductor substrates 210 and 410 side is thinned, and then organic resin 500 is filled between the second substrate 20 and the sub-chip 400. As the organic resin 500, any publicly known resin used as a sealant or a filler can be used.

Figure 7E:
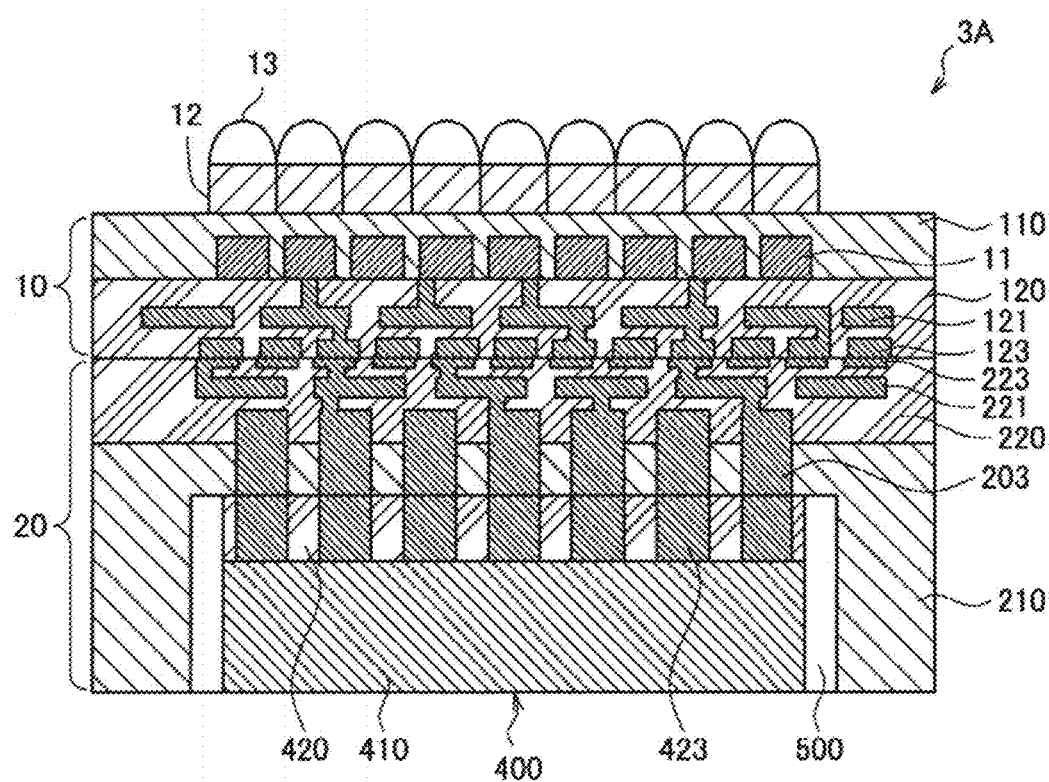
FIG. 7E is a vertical sectional view schematically illustrating one step in the method for manufacturing the solid-state imaging device according to the first specific example.

After that, as illustrated in FIG. 7E, the surface of the laminate body of the first substrate 10, the second substrate 20, and the sub-chip 400 on the semiconductor substrate 110 side is thinned, and then the color filter layer 12 and the micro lens array 13 are formed on the thinned surface. In this manner, what is called "back-illuminated solid-state imaging device 3A" can be formed.

(SECOND SPECIFIC EXAMPLE)

Referring to FIGS. 8A, 8B, 8C, 8D, 8E, 8F, and 8G, a solid-state imaging device according to a second specific example is described. FIGS. 8A, 8B, 8C, 8D, 8E, 8F, and 8G are vertical sectional views schematically illustrating steps in a method for manufacturing a solid-state imaging device 3B according to the second specific example. In the solid-state imaging device 3B according to the second specific example, an opening 230 is provided in a second substrate 20, and a sub-chip 400 is buried inside the opening 230, and then the second substrate 20 and the sub-chip 400 are electrically connected through wiring 601 in a multi-layer wiring layer 600 formed on the opening 230.

Figure 8A:
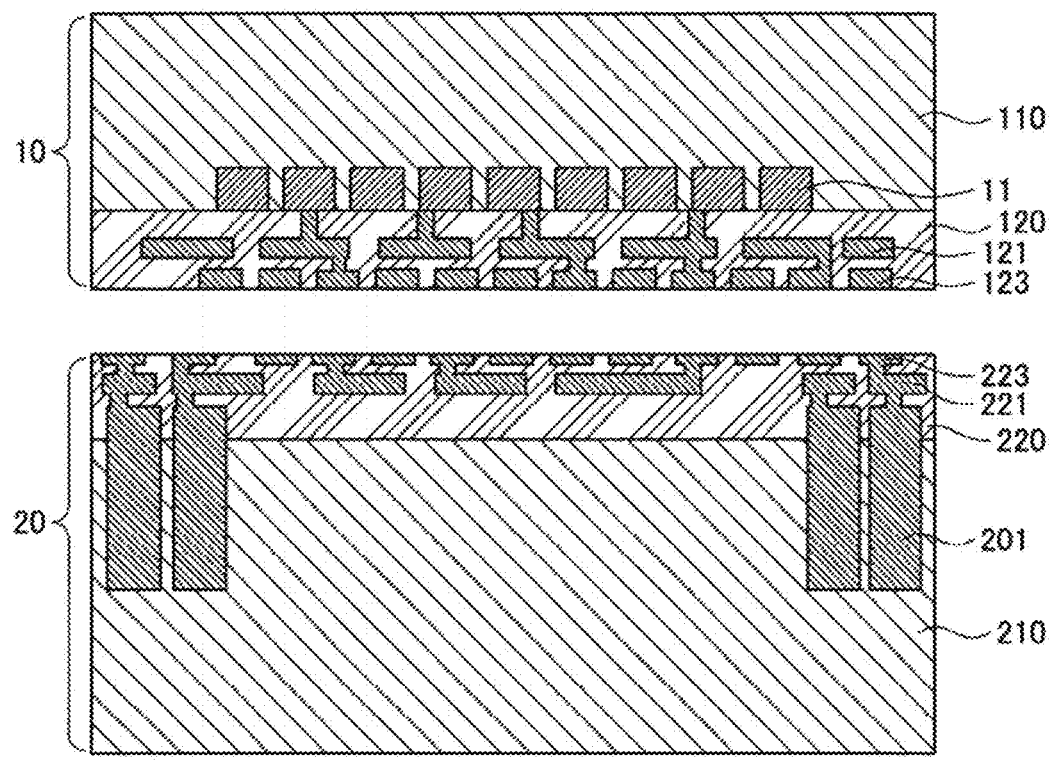
FIG. 8A is a vertical sectional view schematically illustrating one step in a method for manufacturing a solid-state imaging device according to a second specific example.

Specifically, as illustrated in FIG. 8A, first, the first substrate 10, in which the semiconductor substrate 110 and the multi-layer wiring layer 120 are laminated, is prepared. In the semiconductor substrate 110, a photodiode 11 is formed at a position corresponding to a pixel is formed. In the multi-layer wiring layer 120, wiring 121 and an electrode 123 electrically connected to the photodiode 11 are formed. The electrode 123 is formed so as to be exposed on the topmost layer of the multi-layer wiring layer 120, so as to form an electrode bonding structure with an electrode 223 in the second substrate 20 described below.

The second substrate, in which the semiconductor substrate 210 and the multi-layer wiring layer 220 are laminated, is prepared. In the semiconductor substrate 210, the through-vias 201 are formed in a region in which the opening 230 is not to be formed. In the multi-layer wiring layer 220, wiring 221 and electrodes 223 constituting a logic circuit for processing information on signals from the first substrate 10 are formed. The electrode 223 is formed so as to be exposed on the topmost layer of the multi-layer wiring layer 220, so as to form an electrode bonding structure with the electrode 123 in the first substrate 10.

Figure 8B:
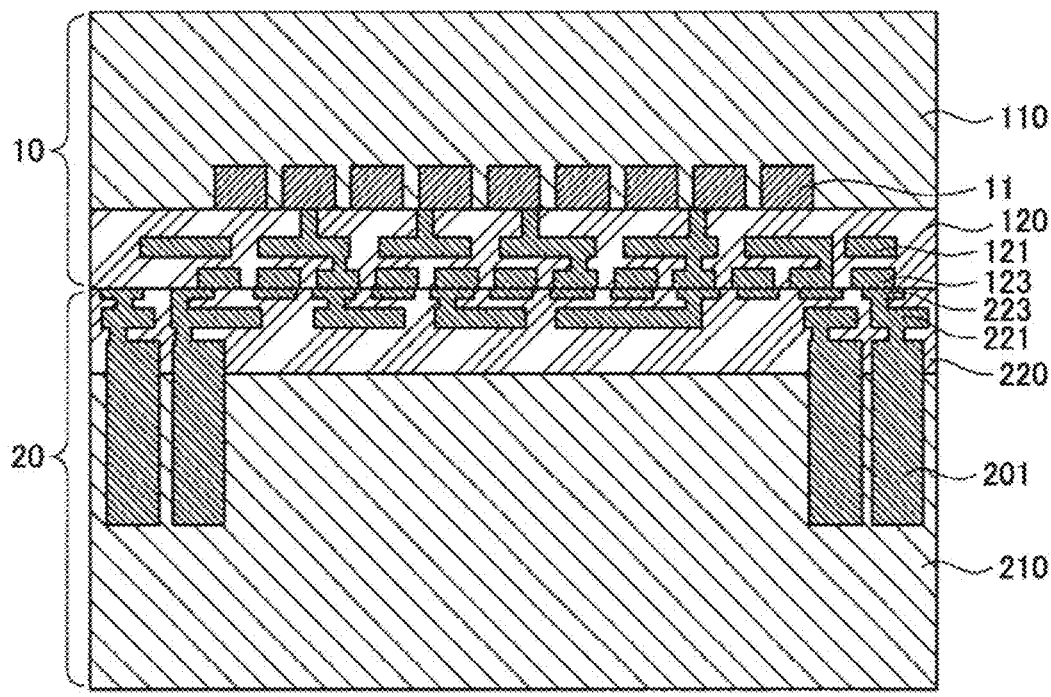
FIG. 8B is a vertical sectional view schematically illustrating one step in the method for manufacturing the solid-state imaging device according to the second specific example.

Next, as illustrated in FIG. 8B, the first substrate 10 and the second substrate 20 are bonded together such that the multi-layer wiring layers 120 and 220 thereof are opposed to each other (that is, face-to-face). In this case, the electrodes 123 and 223 exposed on the surfaces of the multi-layer wiring layers 120 and 220 are brought into direct contact with each other and then bonded by thermal treatment to form an electrode bonding structure. In this manner, the first substrate 10 and the second substrate 20 are electrically connected.

Figure 8C:
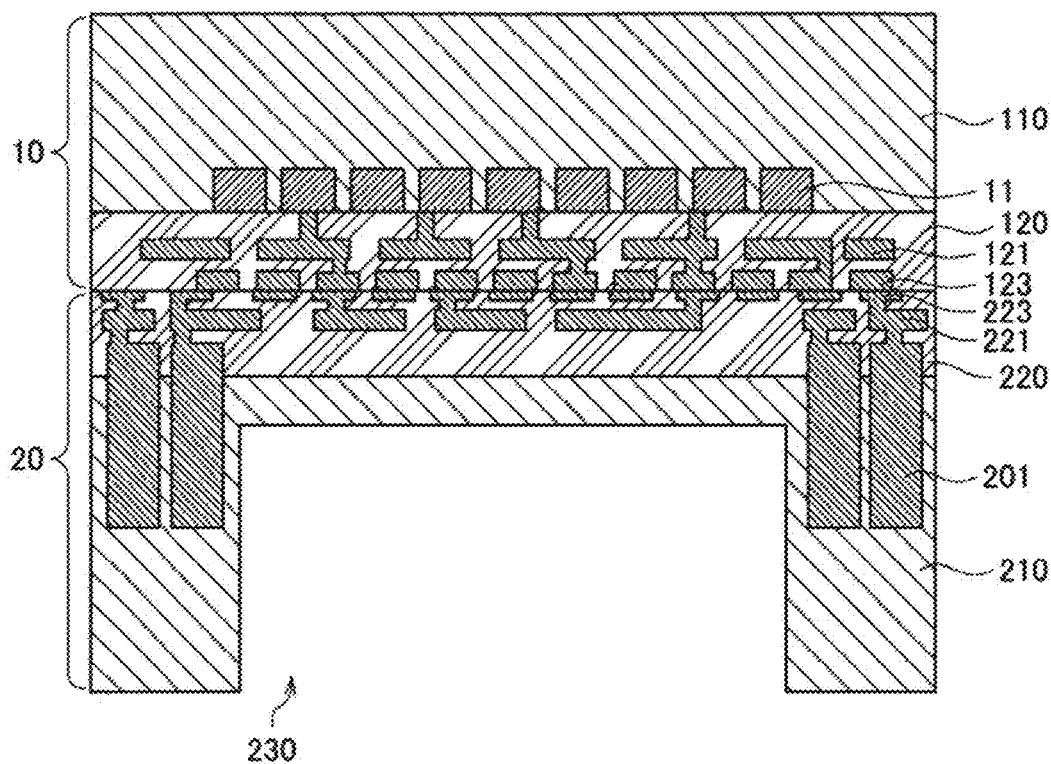
FIG. 8C is a vertical sectional view schematically illustrating one step in the method for manufacturing the solid-state imaging device according to the second specific example.

Subsequently, as illustrated in FIG. 8C, the opening 230 is provided in the surface of the laminate body of the first substrate 10 and the second substrate 20 on the semiconductor substrate 210 side. In the second specific example, the through-via 201 and the like formed in the semiconductor substrate 210 are not exposed by the opening 230.

Figure 8D:
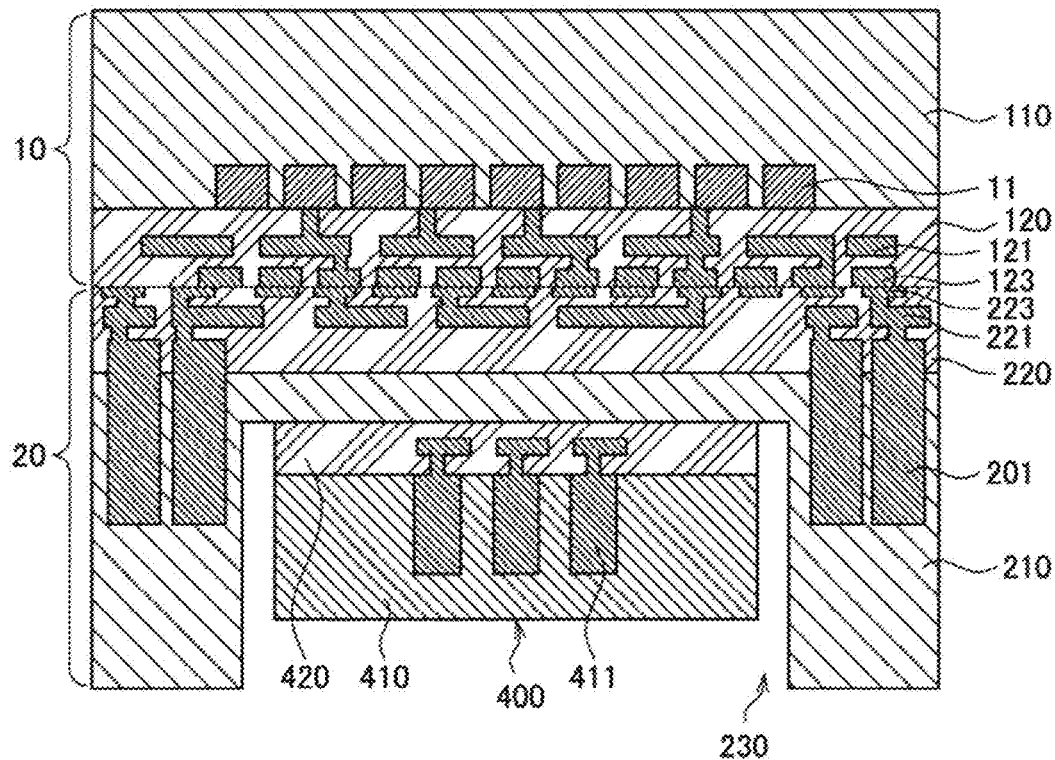
FIG. 8D is a vertical sectional view schematically illustrating one step in the method for manufacturing the solid-state imaging device according to the second specific example.

Next, as illustrated in FIG. 8D, the sub-chip 400 is placed inside the opening 230. Specifically, the sub-chip 400 is formed by laminating a semiconductor substrate 410 and a multi-layer wiring layer 420, and the semiconductor substrate 410 is provided with an electrode 411 for electrical connection to wiring 601 (described later) in the multi-layer wiring layer 600 formed on the opening 230.

The semiconductor substrate 410 in the sub-chip 400 may be formed from material different from those of the semiconductor substrate 110 in the first substrate 10 and the semiconductor substrate 210 in the second substrate 20. In the solid-state imaging device 3B according to the second specific example, even the sub-chip 400 having the semiconductor substrate 410 made of material different from those of the semiconductor substrates 110 and 210 can be used without any particular problem.

Figure 8E:
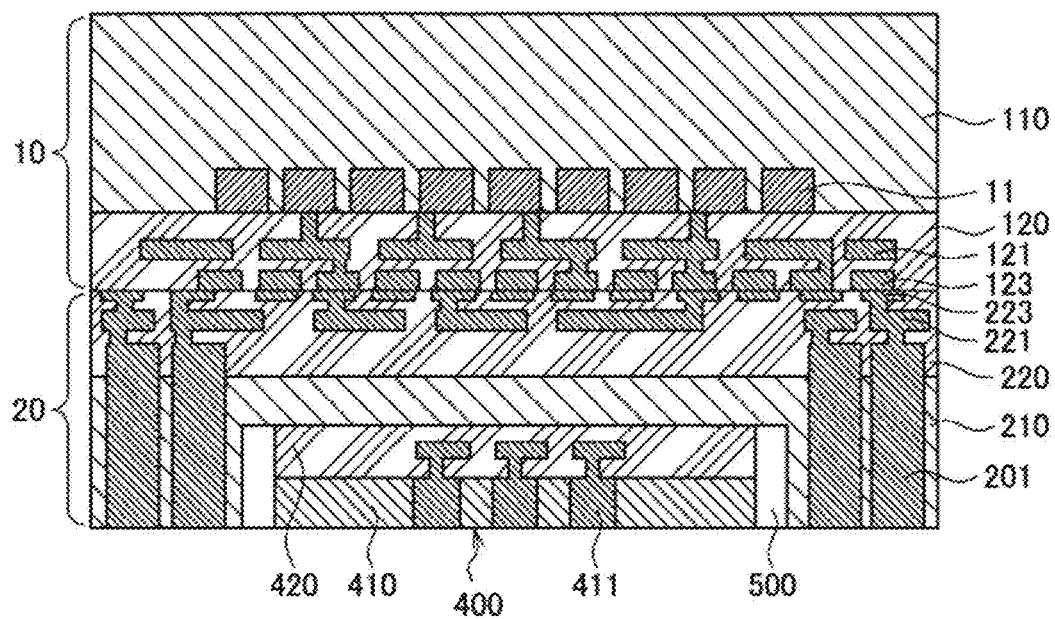
FIG. 8E is a vertical sectional view schematically illustrating one step in the method for manufacturing the solid-state imaging device according to the second specific example.

After that, as illustrated in FIG. 8E, the surface of the laminate body of the first substrate 10, the second substrate 20, and the sub-chip 400 on the semiconductor substrates 210 and 410 side is thinned, and then organic resin 500 is filled between the second substrate 20 and the sub-chip 400. As the organic resin 500, any publicly known resin used as a sealant or a filler can be used. The laminate body of the first substrate 10, the second substrate 20, and the sub-chip 400 is thinned until the through-via 201 formed in the semiconductor substrate 210 and the electrode 411 formed in the semiconductor substrate 410 is exposed.

Figure 8F:
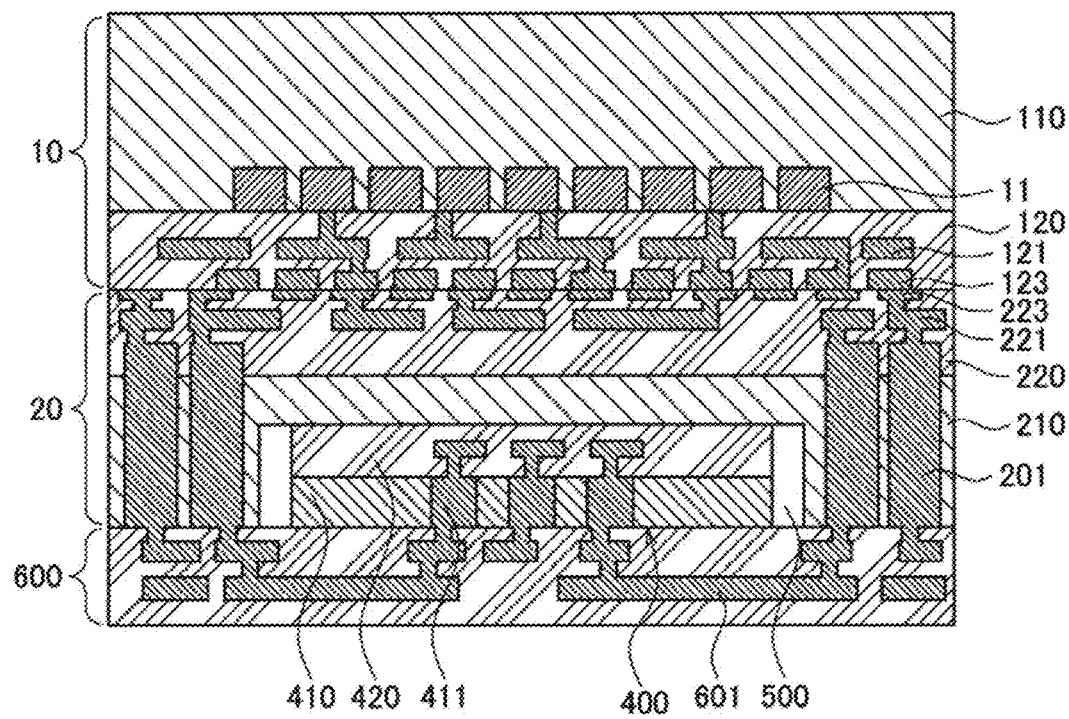
FIG. 8F is a vertical sectional view schematically illustrating one step in the method for manufacturing the solid-state imaging device according to the second specific example.

Subsequently, as illustrated in FIG. 8F, the multi-layer wiring layer 600 is formed on the opening 230, and the through-via 201 in the semiconductor substrate 210 and the electrode 411 in the sub-chip 400 are electrically connected through the wiring 601 formed in the multi-layer wiring layer 600. Instead of the multi-layer wiring layer 600, the laminate body of the semiconductor substrate and the multi-layer wiring layer may be used.

Figure 8G:
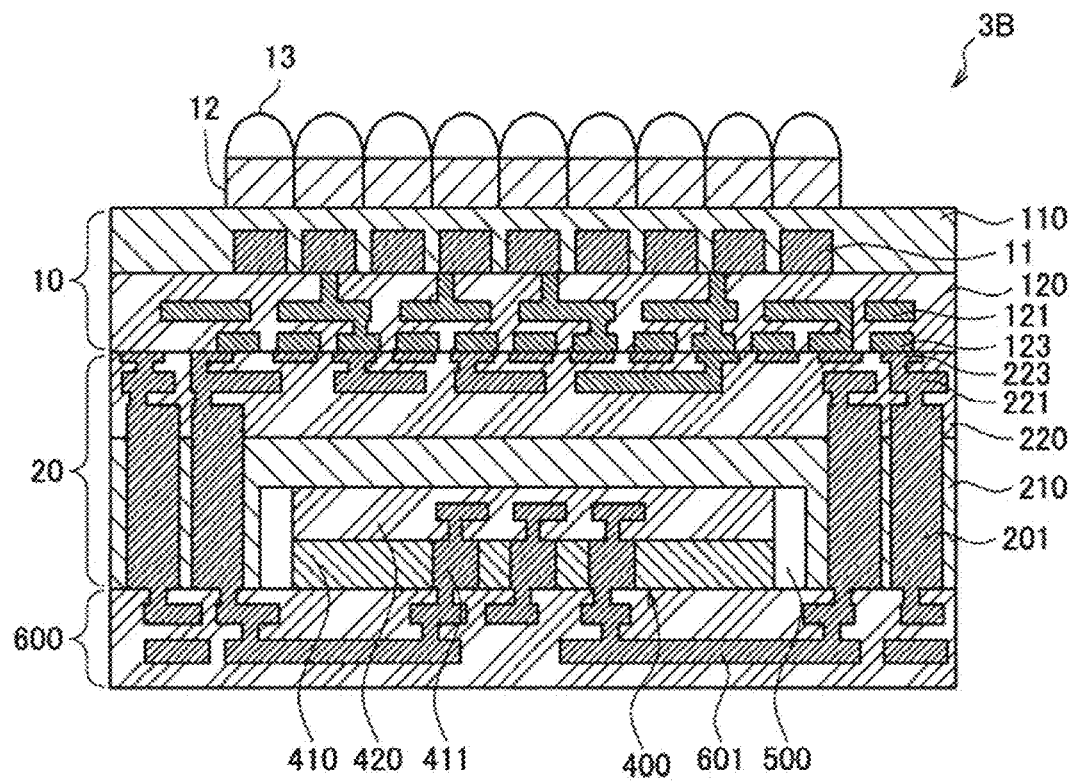
FIG. 8G is a vertical sectional view schematically illustrating one step in the method for manufacturing the solid-state imaging device according to the second specific example.

Furthermore, as illustrated in FIG. 8G, the surface of the laminate body of the first substrate 10, the second substrate 20, and the sub-chip 400 on the semiconductor substrate 110 side is thinned, and then the color filter layer 12 and the micro lens array 13 are formed on the thinned surface. In this manner, what is called "back-illuminated solid-state imaging device 3B" can be formed.

THIRD SPECIFIC EXAMPLE

Referring to FIGS. 9A, 9B, 9C, and 9D, a solid-state imaging device according to a third specific example is described. FIGS. 9A, 9B, 9C, and 9D are vertical sectional views schematically illustrating steps in a method for manufacturing a solid-state imaging device 3C according to the third specific example. The solid-state imaging device 3C according to the third specific example is different from the solid-state imaging device 3B according to the second specific example in that a third substrate 700 is further provided on the multi-layer wiring layer 600 provided above the opening 230.

Figure 9A:
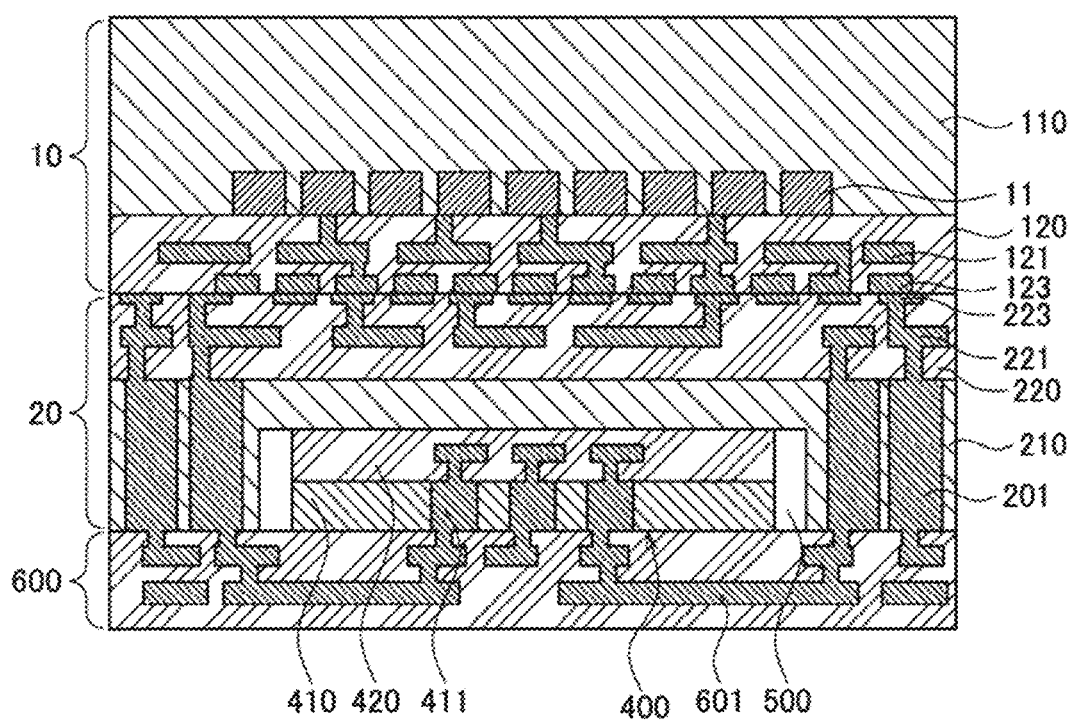
FIG. 9A is a vertical sectional view schematically illustrating one step in a method for manufacturing a solid-state imaging device according to a third specific example.

Specifically, as illustrated in FIG. 9A, a laminate body of the first substrate 10, the second substrate 20, the sub-chip 400, and the multi-layer wiring layer 600 is formed through the steps described above in the second specific example with reference to FIGS. 8A, 8B, 8C, 8D, 8E, and 8F.

Figure 9B:
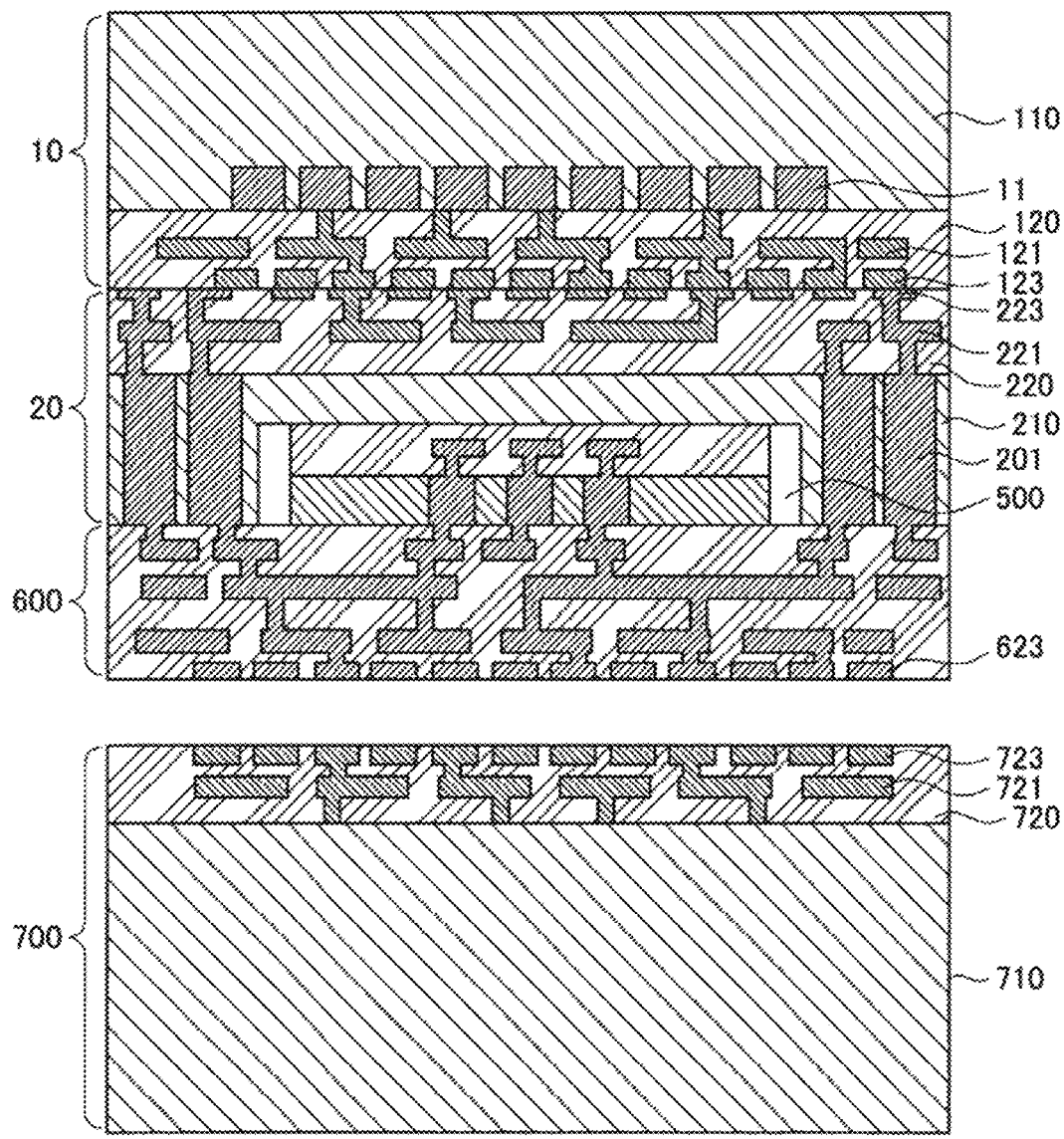
FIG. 9B is a vertical sectional view schematically illustrating one step in the method for manufacturing the solid-state imaging device according to the third specific example.

Subsequently, as illustrated in FIG. 9B, the third substrate 700, in which the semiconductor substrate 710 and the multi-layer wiring layer 720 are laminated, is prepared. In the multi-layer wiring layer 720, wiring 721 constituting a circuit having a predetermined function is formed. In the multi-layer wiring layer 720, an electrode 723 is formed so as to be exposed on the topmost layer of the multi-layer wiring layer 720. The electrode 723 is provided in order to form an electrode bonding structure with the electrode 623 in the multi-layer wiring layer 600. On the other hand, the multi-layer wiring layer 600 is provided with an electrode 623 exposed on the surface opposed to the surface bonded to the second substrate 20 and the sub-chip 400. The electrode 623 is provided in order to form an electrode bonding structure with an electrode 723 in the multi-layer wiring layer 720.

Figure 9C:
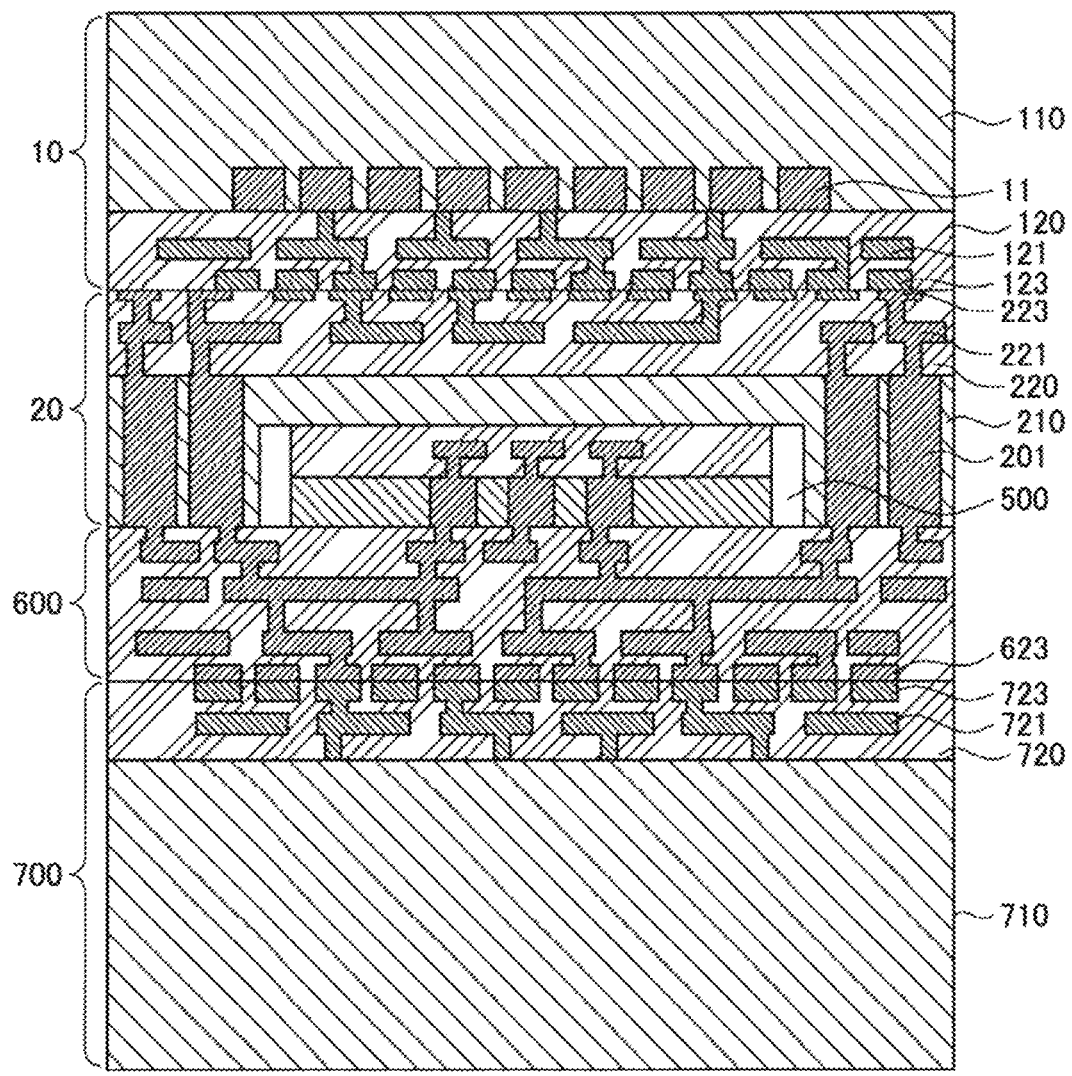
FIG. 9C is a vertical sectional view schematically illustrating one step in the method for manufacturing the solid-state imaging device according to the third specific example.

Next, as illustrated in FIG. 9C, the multi-layer wiring layer 600 and the multi-layer wiring layer 720 in the third substrate 700 are bonded together so as to be opposed to each other. In this case, the electrode 623 exposed on the surface of the multi-layer wiring layer 600 and the electrode exposed on the surface of the multi-layer wiring layer 720 are brought into direct contact with each other and then bonded by thermal treatment to form an electrode bonding structure. In this manner, the multi-layer wiring layer 600 and the third substrate 700 are electrically connected to each other. Thus, the first substrate 10, the second substrate 20, the sub-chip 400, the multi-layer wiring layer 600, and the third substrate 700 are electrically connected to one another.

Figure 9D:
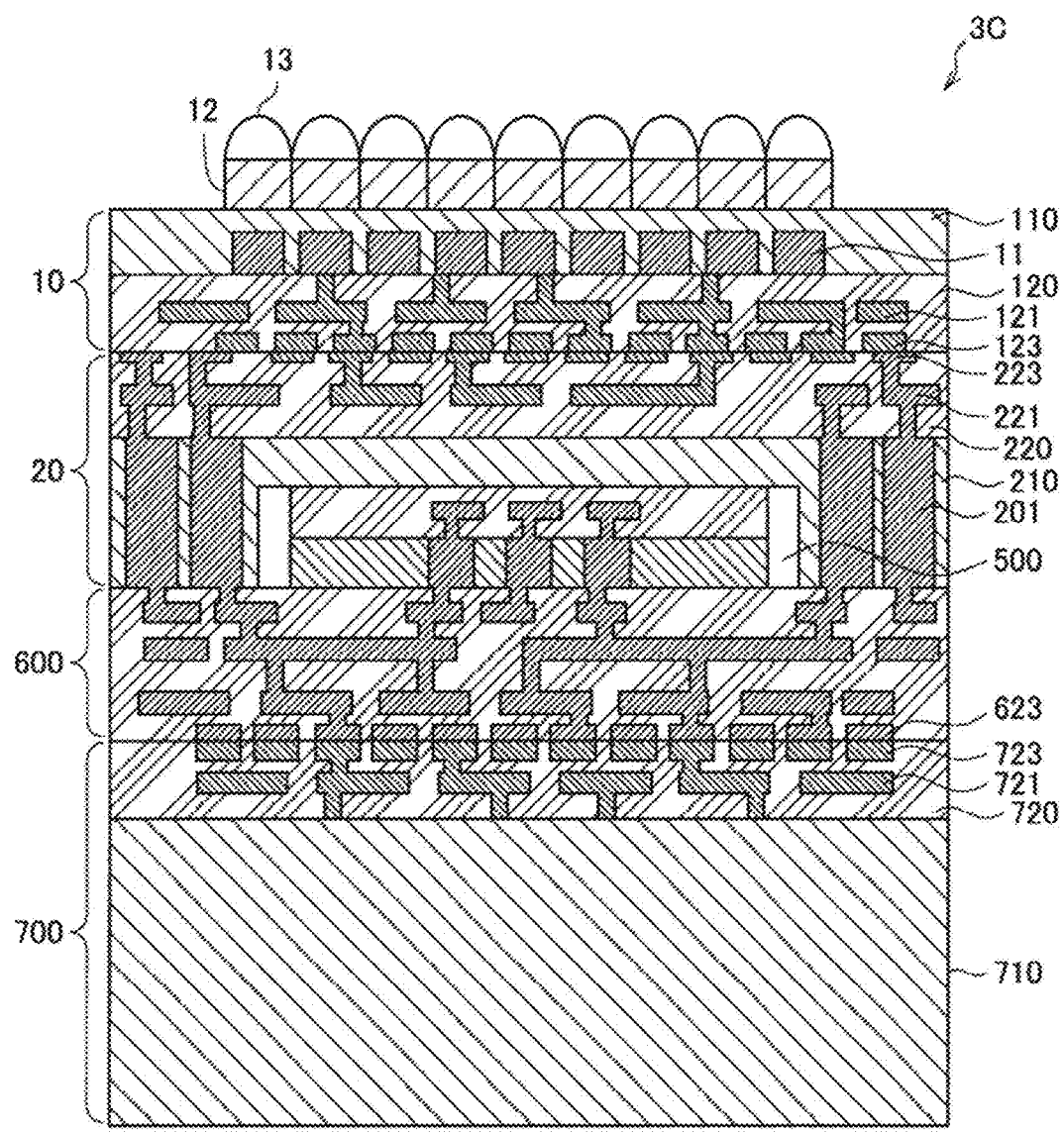
FIG. 9D is a vertical sectional view schematically illustrating one step in the method for manufacturing the solid-state imaging device according to the third specific example.

Furthermore, as illustrated in FIG. 9D, the surface of the laminate body of the first substrate 10, the second substrate 20, the sub-chip 400, the multi-layer wiring layer 600, and the third substrate 700 on the semiconductor substrate 110 side is thinned, and then the color filter layer 12 and the micro lens array 13 are formed on the thinned surface. In this manner, what is called "back-illuminated solid-state imaging device 3C" can be formed.

FOURTH SPECIFIC EXAMPLE

Figure 10B:
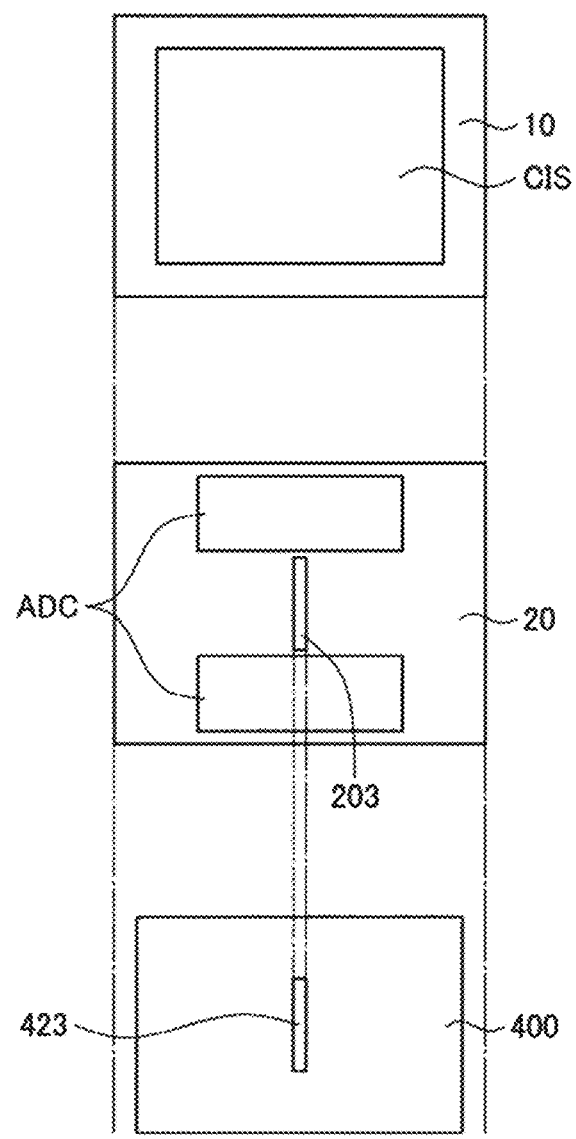
FIG. 10B is a plan view illustrating planar arrangement of substrates and a sub-chip in the solid-state imaging device according to the fourth specific example.

Referring to FIGS. 10A, 10B, and 11, a solid-state imaging device according to a fourth specific example is described. FIG. 10A is a vertical sectional view schematically illustrating a laminate structure of a solid-state imaging device 3D according to the fourth specific example, and FIG. 10B is a plan view illustrating planar arrangement of substrates and a sub-chip in the solid-state imaging device 3D according to the fourth specific example. FIG. 11 is a vertical sectional view schematically illustrating one step in a method for manufacturing the solid-state imaging device 3D according to the fourth specific example.

As illustrated in FIG. 10A, the solid-state imaging device 3D includes a first substrate 10, in which a semiconductor substrate 110 and a multi-layer wiring layer 120 are laminated, a second substrate 20, in which a semiconductor substrate 210 and a multi-layer wiring layer 220 are laminated, and a sub-chip 400 provided inside an opening formed in the semiconductor substrate 210.

In the semiconductor substrate 110 in the first substrate 10, a photodiode is formed at a position corresponding to a pixel. In the multi-layer wiring layer 120, wiring or an electrode electrically connected to the photodiode is formed. On a light receiving surface of the first substrate 10, an insulating layer 130 including a color filter layer and a micro lens array is provided, and the pad opening portion 17 for exposing a pad formed inside the multi-layer wiring layer 120 is further provided.

In the multi-layer wiring layer 220 in the second substrate 20, wiring and electrodes constituting a logic circuit for processing information on signals from the first substrate 10 are formed. In the semiconductor substrate 210, an opening for placing the sub-chip 400 therein is provided, and the electrode 203 electrically connected to the sub-chip 400 is formed in a region corresponding to the opening.

In the multi-layer wiring layer 420 in the sub-chip 400, a memory circuit for storing signals from the first substrate 10 is formed. In the multi-layer wiring layer 420, an electrode 423 for electrical connection to the electrode 203 in the second substrate 20 is provided. Organic resin or inorganic insulating material may be injected between the sub-chip 400 and the second substrate 20 so as to fill a gap therebetween.

The planar arrangement of the first substrate 10, the second substrate 20, and the sub-chip 400 is described with reference to FIG. 10B. As illustrated in FIG. 10B, the first substrate 10 is provided with a pixel circuit CIS over substantially the entire surface, and the second substrate 20 is provided with analog-digital conversion circuits (AD conversion circuits) ADC, an electrode 203 that is a connection electrode for the sub-chip 400, and a logic circuit (not shown). The sub-chip 400 is provided with an electrode 423 that is a connection electrode for the second substrate 20, and a memory circuit (not shown).

In the second substrate 20, the AD conversion circuits ADC and the electrode 203 are provided in different regions. For example, the electrode 203 may be provided at the center of the second substrate 20, and the AD conversion circuits ADC may be provided on both sides of the electrode 203.

The solid-state imaging device 3D according to the fourth specific example enables the planar areas and the design rules of the first substrate 10 and the second substrate 20 and the planar area and the design rule of the sub-chip 400 to be independently changed. In the solid-state imaging device 3D, the first substrate 10 or the second substrate 20 can be used as a support. Furthermore, in the solid-state imaging device 3D, a multi-layer wiring layer or a substrate can be further laminated on the sub-chip 400 and the second substrate 20 on the surface of the solid-state imaging device 3D opposed to the light receiving surface.

As illustrated in FIG. 11, the sub-chip 400 may protrude from the opening surface of the opening provided in the semiconductor substrate 210 in the manufacturing process for the solid-state imaging device 3D depending on the thickness of the sub-chip 400 and the depth of the opening provided in the semiconductor substrate 210. In such a case, the solid-state imaging device 3D enables the semiconductor substrate 410 in the sub-chip 400 and the semiconductor substrate 210 in the second substrate 20 to be simultaneously thinned by CMP or BGR. In the solid-state imaging device 3D, the first substrate 10 is used as a support to ensure the strength as a whole, and hence the semiconductor substrate 410 and the semiconductor substrate 210 can be thinned without additionally bonding a carrier wafer serving as a support. Consequently, the solid-state imaging device 3D according to the fourth specific example can further simplify the manufacturing steps.

FIFTH SPECIFIC EXAMPLE

Figure 12A:
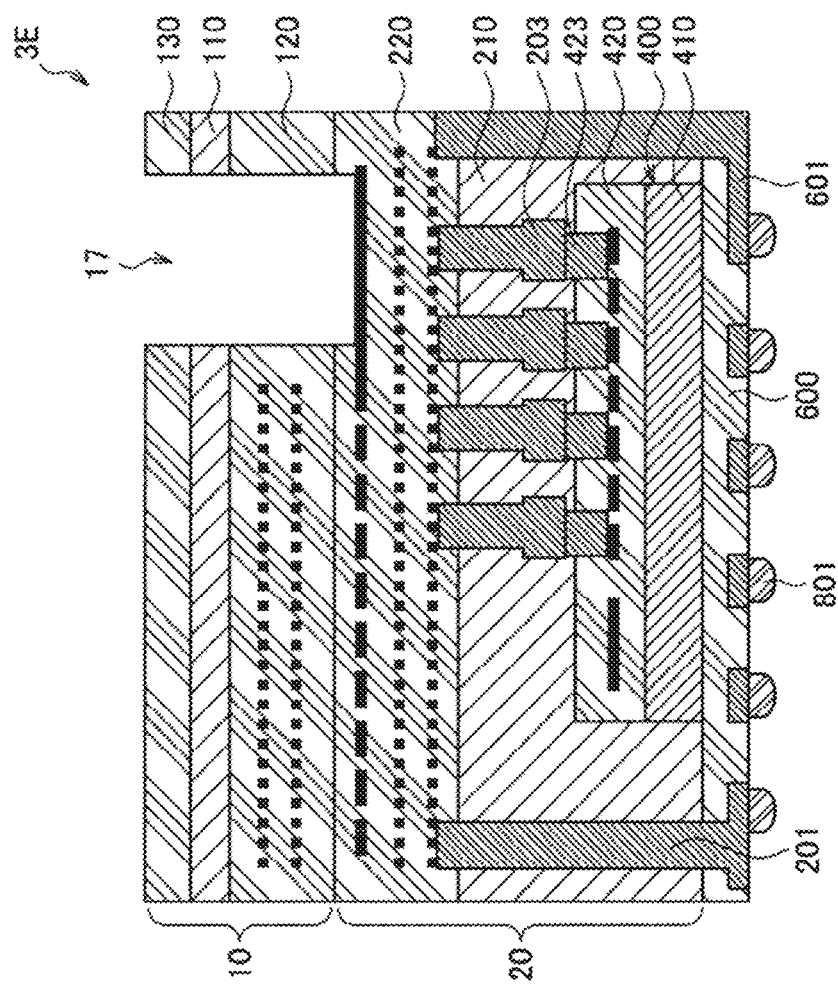
FIG. 12A is a vertical sectional view schematically illustrating a laminate structure of a solid-state imaging device according to a fifth specific example.
Figure 12B:
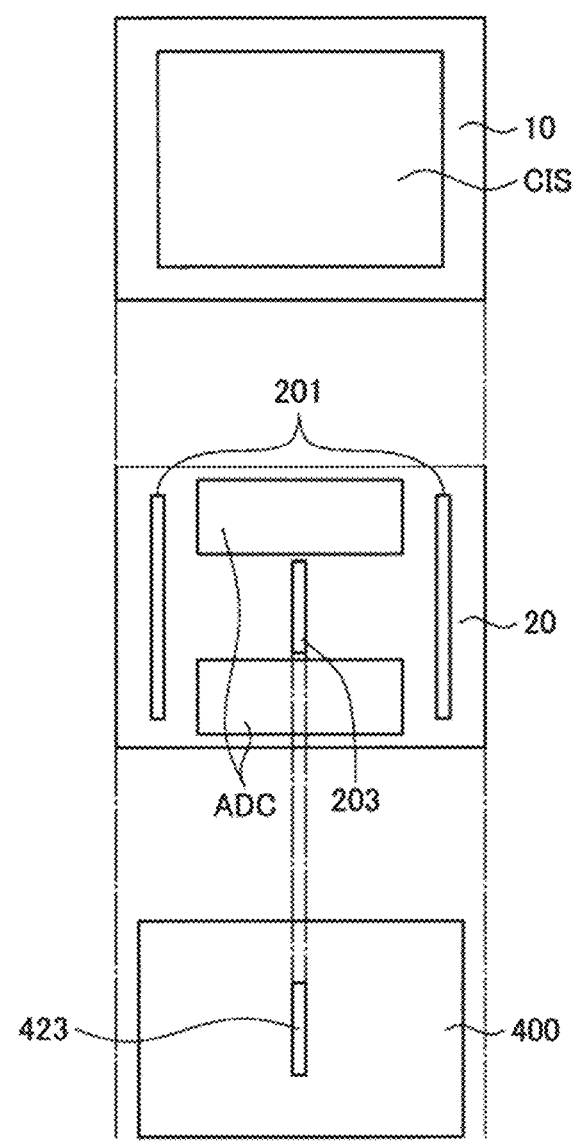
FIG. 12B is a plan view illustrating planar arrangement of substrates and a sub-chip in the solid-state imaging device according to the fifth specific example.

Referring to FIGS. 12A and 12B, a solid-state imaging device according to a fifth specific example is described. FIG. 12A is a vertical sectional view schematically illustrating a laminate structure of a solid-state imaging device 3E according to the fifth specific example, and FIG. 12B is a plan view illustrating planar arrangement of substrates and a sub-chip in the solid-state imaging device 3E according to the fifth specific example.

As illustrated in FIG. 12A, the solid-state imaging device 3E includes a first substrate 10, in which a semiconductor substrate 110 and a multi-layer wiring layer 120 are laminated, a second substrate 20, in which a semiconductor substrate 210 and a multi-layer wiring layer 220 are laminated, a sub-chip 400 provided inside an opening formed in the semiconductor substrate 210, and a multi-layer wiring layer 600 provided on the sub-chip 400 so as to cover the opening formed in the semiconductor substrate 210.

In the semiconductor substrate 110 in the first substrate 10, a photodiode is formed at a position corresponding to a pixel. In the multi-layer wiring layer 120, wiring or an electrode electrically connected to the photodiode is formed. On a light receiving surface of the first substrate 10, an insulating layer 130 including a color filter layer and a micro lens array is provided, and the pad opening portion 17 for exposing a pad formed inside the multi-layer wiring layer 120 is further provided.

In the multi-layer wiring layer 220 in the second substrate 20, wiring and electrodes constituting a logic circuit for processing information on signals from the first substrate 10 are formed. The semiconductor substrate 210 is provided with an opening for placing the sub-chip 400 therein. The electrode 203 electrically connected to the sub-chip 400 is formed in a region corresponding to the opening, and the through-via 201 passing through the semiconductor substrate 210 is formed in a region other than the region corresponding to the opening.

In the multi-layer wiring layer 420 in the sub-chip 400, a memory circuit for storing therein signals from the first substrate 10. The multi-layer wiring layer 420 is provided with an electrode 423 for electrical connection to the electrode 203 in the second substrate 20. Organic resin or inorganic insulating material may be injected between the sub-chip 400 and the second substrate 20 so as to fill a gap therebetween.

The multi-layer wiring layer 600 includes wiring 601 electrically connected to the through-via 201 that is provided in the surfaces of the semiconductor substrates 210 and 410 on the surface of the solid-state imaging device 3E opposed to the light receiving surface and that passes through the semiconductor substrate 210. In the wiring 601, for example, a bump 801 is provided on the surface exposed on the surface of the multi-layer wiring layer 600, and the bump 801 may serve as an external input/output terminal of the second substrate 20. In such a case, the wiring 601 provided with the bump 801 may be provided also on the multi-layer wiring layer 600 on any of the semiconductor substrate 210 and the semiconductor substrate 410. The wiring 601 may be electrically connected to a through-via passing through the semiconductor substrate 410 so that the wiring in the second substrate 20 and the wiring in the sub-chip 400 are electrically connected to each other.

The planar arrangement of the first substrate 10, the second substrate 20, and the sub-chip 400 is described with reference to FIG. 12B. As illustrated in FIG. 12B, the first substrate 10 is provided with a pixel circuit CIS over substantially the entire surface, and the second substrate 20 is provided with AD conversion circuits ADC, an electrode 203 that is a connection electrode for the sub-chip 400, through-vias 201 that are connection electrodes for the multi-layer wiring layer 600, and a logic circuit (not shown). The sub-chip 400 is provided with an electrode 423 that is a connection electrode for the second substrate 20, and a memory circuit (not shown).

In the second substrate 20, the AD conversion circuits ADC, the electrode 203, and the through-vias 201 are provided in different regions. For example, the electrode 203 may be provided at the center of the second substrate 20, and the AD conversion circuits ADC may be provided on both sides of the electrode 203. The through-vias 201 may be provided on both sides of the electrode 203 in a direction orthogonal to the direction in which the AD conversion circuits ADC are provided.

The solid-state imaging device 3E according to the fifth specific example enables the wiring or the external input/output terminal to be formed in the multi-layer wiring layer 600 (that is, the surface of the solid-state imaging device 3E opposed to the light receiving surface) provided on the surfaces of the semiconductor substrates 210 and 410 on the side opposed to the light receiving surface. The surface of the solid-state imaging device 3E opposed to the light receiving surface is formed by the rigid semiconductor substrates 210 and 410, and hence the multi-layer wiring layer 600 can be formed on the entire surface, and wiring or an external input/output terminal can be formed on the entire surface with free layout.

SIXTH SPECIFIC EXAMPLE

Figure 13B:
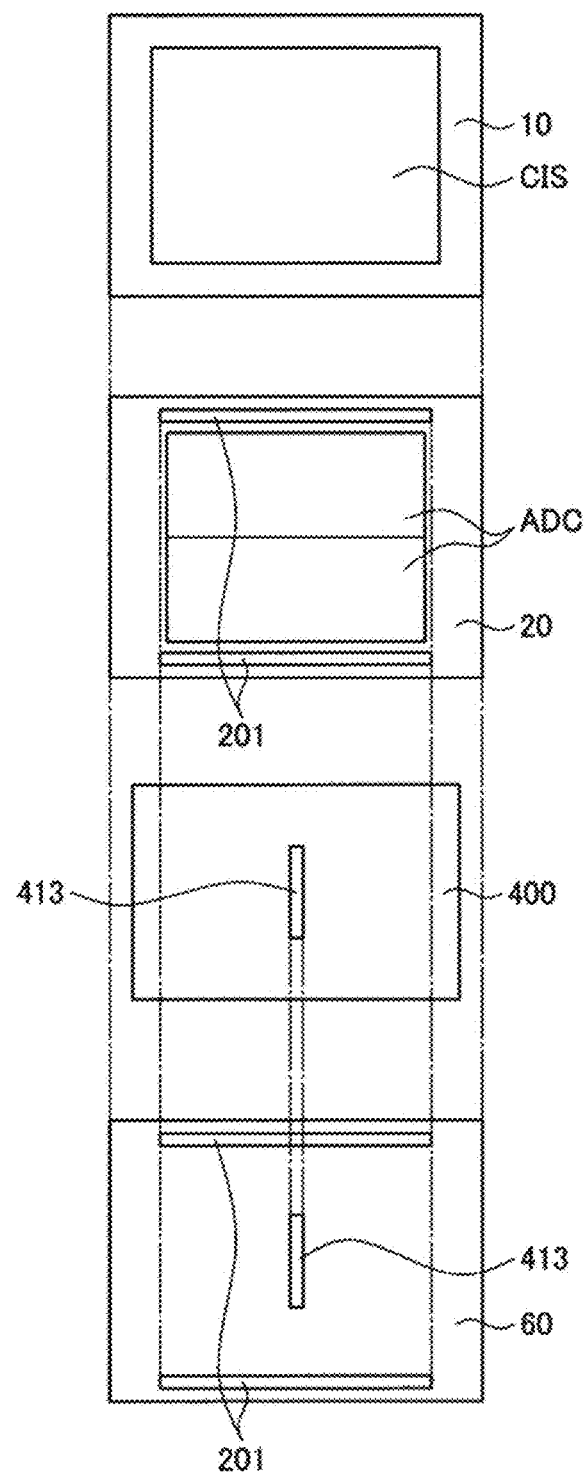
FIG. 13B is a plan view illustrating planar arrangement of substrates and a sub-chip in the solid-state imaging device according to the sixth specific example.

Referring to FIGS. 13A and 13B, a solid-state imaging device according to a sixth specific example is described. FIG. 13A is a vertical sectional view schematically illustrating a laminate structure of a solid-state imaging device 3F according to the sixth specific example, and FIG. 13B is a plan view illustrating planar arrangement of substrates and a sub-chip in the solid-state imaging device 3F according to the sixth specific example.

As illustrated in FIG. 13A, the solid-state imaging device 3F includes a first substrate 10, in which a semiconductor substrate 110 and a multi-layer wiring layer 120 are laminated, a second substrate 20, in which a semiconductor substrate 210 and a multi-layer wiring layer 220 are laminated, a sub-chip 400 provided inside an opening formed in the semiconductor substrate 210, and a third substrate 60, in which a semiconductor substrate 610 and a multi-layer wiring layer 600 are laminated.

In the semiconductor substrate 110 in the first substrate 10, a photodiode is formed at a position corresponding to a pixel. In the multi-layer wiring layer 120, wiring or an electrode electrically connected to the photodiode is formed. On a light receiving surface of the first substrate 10, an insulating layer 130 including a color filter layer and a micro lens array is provided, and the pad opening portion 17 for exposing a pad formed inside the multi-layer wiring layer 120 is further provided.

In the multi-layer wiring layer 220 in the second substrate 20, wiring and electrodes constituting an AD conversion circuit for performing information processing on a signal from the first substrate 10 are formed. The semiconductor substrate 210 is provided with an opening, in which the sub-chip 400 is provided. A through-via 201 passing through the semiconductor substrate 210 is formed in a region other than the region corresponding to the opening.

In the multi-layer wiring layer 420 in the sub-chip 400, a memory circuit for storing therein a signal from the first substrate 10 is formed. The multi-layer wiring layer 420 is provided with a through-via 413 that passes through the semiconductor substrate 410 and is electrically connected to the wiring 601 provided in the multi-layer wiring layer 600. Organic resin or inorganic insulating material may be injected between the sub-chip 400 and the second substrate 20 so as to fill a gap therebetween.

In the multi-layer wiring layer 600 in the third substrate 60, the wiring 601 electrically connected to the through-via 201 passing through the semiconductor substrate 210 is formed. In the multi-layer wiring layer 600 in the third substrate 60, wiring and electrodes constituting a logic circuit for processing information on signals from the second substrate 20 are formed. For example, the wiring 601 may be electrically connected to the through-via 201 passing through the semiconductor substrate 210 and the through-via 413 passing through the semiconductor substrate 410 so that the wiring in the second substrate 20 and the wiring in the sub-chip 400 are electrically connected to each other.

The planar arrangement of the first substrate 10, the second substrate 20, the third substrate 60, and the sub-chip 400 is described with reference to FIG. 13B. As illustrated in FIG. 13B, the first substrate 10 is provided with a pixel circuit CIS over substantially the entire surface, and the second substrate 20 is provided with an AD conversion circuit ADC and a through-via 201 that is a connection electrode for the multi-layer wiring layer 600. The sub-chip 400 is provided with a through-via 413 that is a connection electrode for the multi-layer wiring layer 600 and a memory circuit (not shown). The third substrate 60 is provided with a through-via 413 that is a connection electrode for the sub-chip 400, a through-via 201 that is a connection electrode for the second substrate 20, and a logic circuit (not shown).

In the second substrate 20, the AD conversion circuit ADC and the through-via 201 are provided in different regions. For example, the AD conversion circuit ADC may be provided at the center of the second substrate 20, and the through-vias 201 may be provided on both sides of the AD conversion circuit ADC. In the sub-chip 400 and the third substrate 60, the through-via 413 may be provided at a desired position.

The solid-state imaging device 3F according to the sixth specific example enables the third substrate 60 to be laminated on the side opposed to the light receiving surface, and hence the number of layers can be further increased with ease. Consequently, the solid-state imaging device 3F can further reduce the planar area.

SEVENTH SPECIFIC EXAMPLE

Figure 14A:
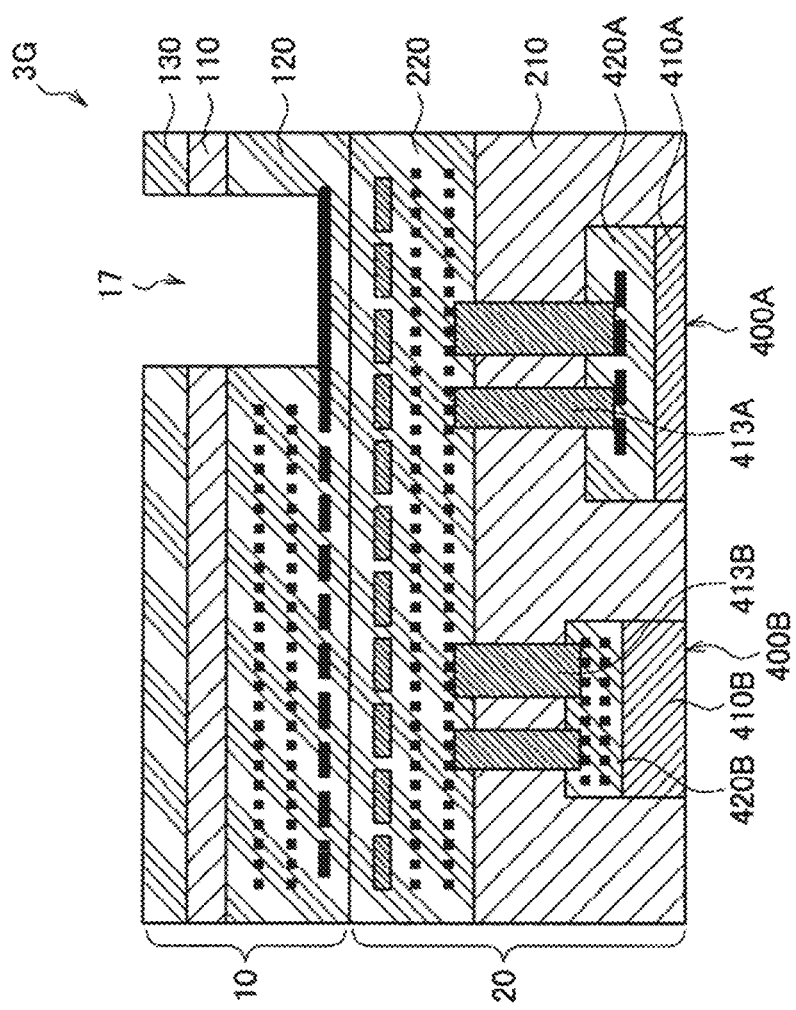
FIG. 14A is a vertical sectional view schematically illustrating a laminate structure of a solid-state imaging device according to a seventh specific example.
Figure 14B:
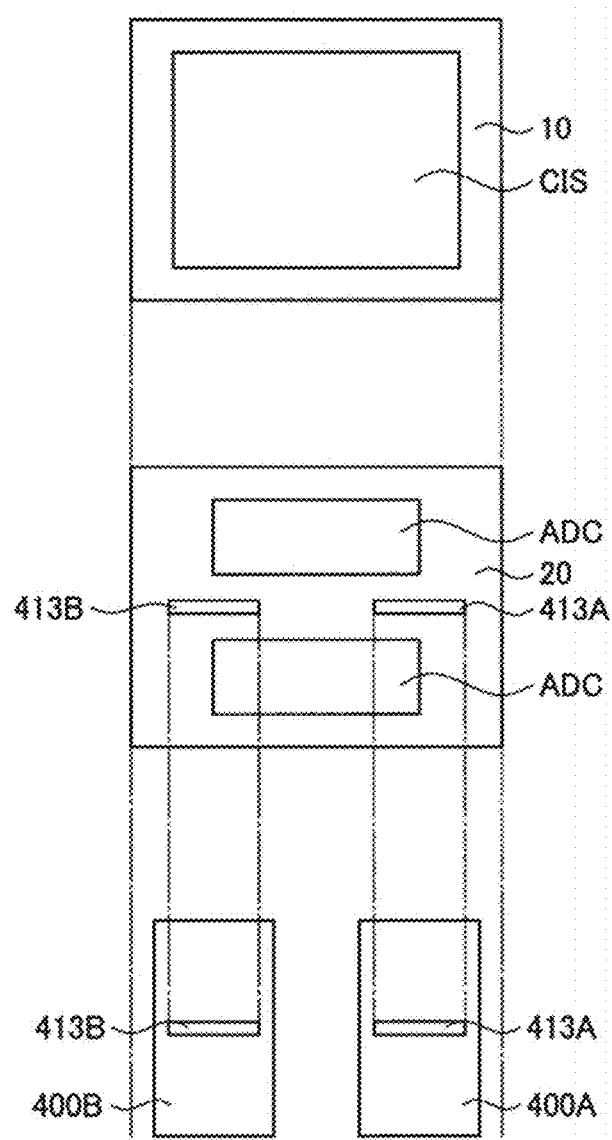
FIG. 14B is a plan view illustrating planar arrangement of substrates and sub-chips in the solid-state imaging device according to the seventh specific example.

Referring to FIGS. 14A and 14B, a solid-state imaging device according to a seventh specific example is described. FIG. 14A is a vertical sectional view schematically illustrating a laminate structure of a solid-state imaging device 3G according to the seventh specific example, and FIG. 14B is a plan view illustrating planar arrangement of substrates and sub-chips in the solid-state imaging device 3G according to the seventh specific example.

As illustrated in FIG. 14A, the solid-state imaging device 3G includes a first substrate 10, in which a semiconductor substrate 110 and a multi-layer wiring layer 120 are laminated, a second substrate 20, in which a semiconductor substrate 210 and a multi-layer wiring layer 220 are laminated, and a plurality of sub-chips 400A and 400B provided inside openings formed in the semiconductor substrate 210.

In the semiconductor substrate 110 in the first substrate 10, a photodiode is formed at a position corresponding to a pixel. In the multi-layer wiring layer 120, wiring or an electrode electrically connected to the photodiode is formed. On a light receiving surface of the first substrate 10, an insulating layer 130 including a color filter layer and a micro lens array is provided, and the pad opening portion 17 for exposing a pad formed inside the multi-layer wiring layer 120 is further provided.

In the multi-layer wiring layer 220 in the second substrate 20, wiring and electrodes constituting an AD conversion circuit for AD-converting a signal from the first substrate 10 are formed. The semiconductor substrate 210 is provided with openings, in which the sub-chips 400A and 400B are provided. In regions corresponding to the openings, through-vias 413A and 413B electrically connected to the sub-chips 400A and 400B are formed.

In the multi-layer wiring layer 420A in the sub-chip 400A, a memory circuit for storing therein a signal from the second substrate 20 is formed. The multi-layer wiring layer 420A is provided with the through-via 413A used for electrical connection to the wiring in the multi-layer wiring layer 220 in the second substrate 20. Organic resin or inorganic insulating material may be injected between the sub-chip 400A and the second substrate 20 so as to fill a gap therebetween.

In a multi-layer wiring layer 420B in the sub-chip 400B, a logic circuit for processing information on signals from the second substrate 20 is formed. The multi-layer wiring layer 420B is provided with a through-via 413B for electrical connection to wiring in the multi-layer wiring layer 220 in the second substrate 20. Organic resin or inorganic insulating material may be injected between the sub-chip 400B and the second substrate 20 so as to fill a gap therebetween.

The planar arrangement of the first substrate 10, the second substrate 20, and the sub-chips 400A and 400B is described with reference to FIG. 14B. As illustrated in FIG. 14B, the first substrate 10 is provided with a pixel circuit CIS over substantially the entire surface, and the second substrate 20 is provided with an AD conversion circuit ADC, the through-via 413A that is a connection electrode for the sub-chip 400A, and the through-via 413B that is a connection electrode for the sub-chip 400B. The sub-chip 400A is provided with the through-via 413A that is a connection electrode for the second substrate 20 and a memory circuit (not shown), and the sub-chip 400B is provided with the through-via 413B that is a connection electrode for the second substrate 20 and a logic circuit (not shown).

In the second substrate 20, for example, the through-vias 413A and 413B may be provided correspondingly to the arrangement of the sub-chips 400A and 400B, and the AD conversion circuit ADC may be provided in a region different from the through-vias 413A and 413B.

The solid-state imaging device 3G according to the seventh specific example enables the sub-chips 400A and 400B to be laminated on the first substrate 10 and the second substrate 20. Furthermore, the solid-state imaging device 3G enables a multi-layer wiring layer or a substrate to be further laminated on the sub-chips 400A and 400B and the second substrate 20 on the surface opposed to the light receiving surface.

EIGHTH SPECIFIC EXAMPLE

Figure 15A:
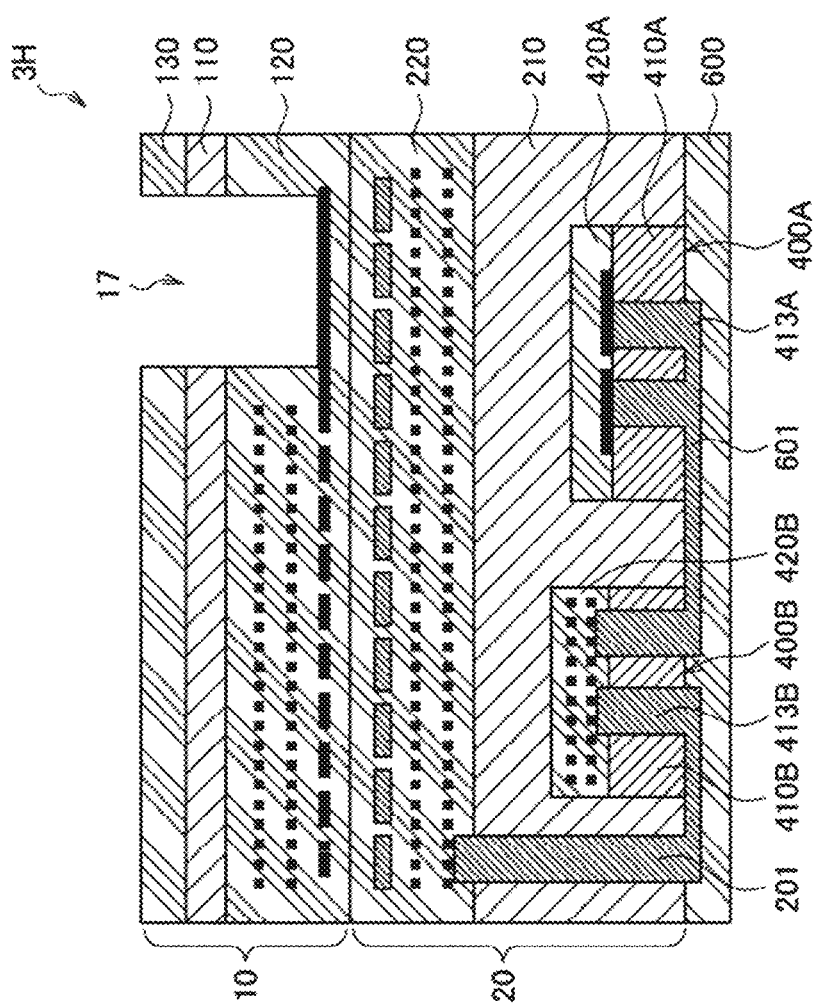
FIG. 15A is a vertical sectional view schematically illustrating a laminate structure of a solid-state imaging device according to an eighth specific example.
Figure 15B:
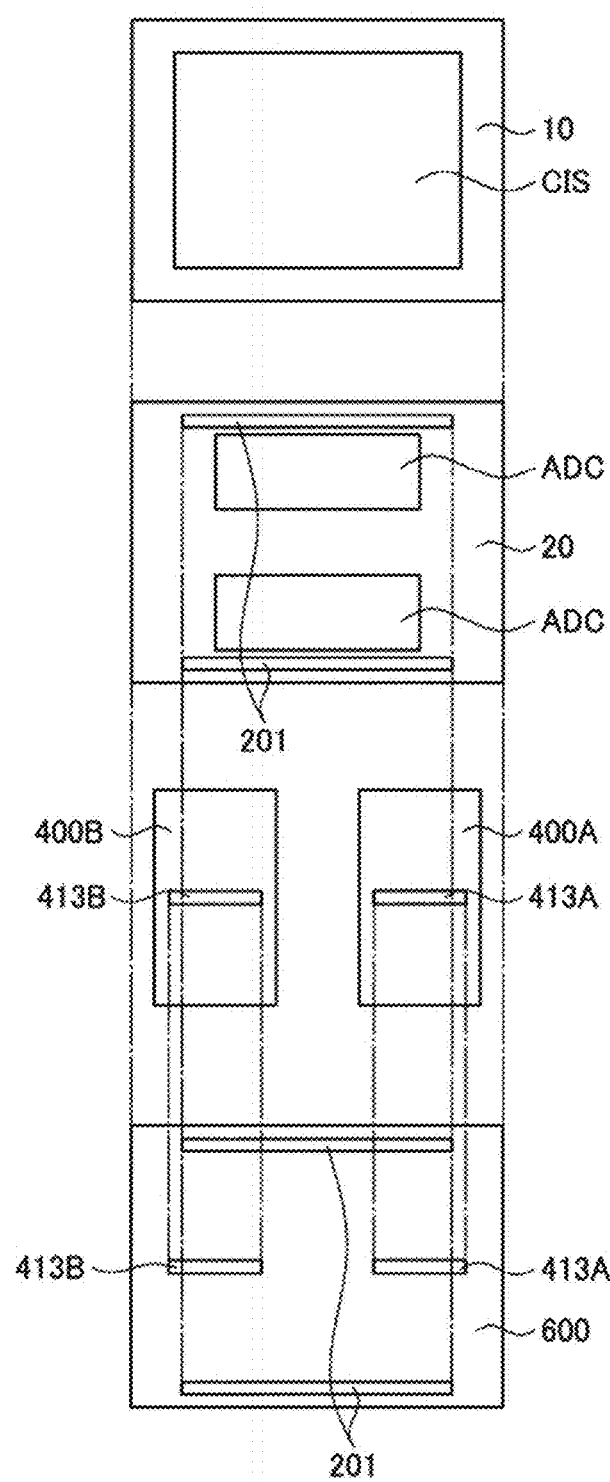
FIG. 15B is a plan view illustrating planar arrangement of substrates and sub-chips in the solid-state imaging device according to the eighth specific example.

Referring to FIGS. 15A and 15B, a solid-state imaging device according to an eighth specific example is described. FIG. 15A is a vertical sectional view schematically illustrating a laminate structure of a solid-state imaging device 3H according to the eighth specific example, and FIG. 15B is a plan view illustrating planar arrangement of substrates and sub-chips in the solid-state imaging device 3H according to the eighth specific example.

As illustrated in FIG. 15A, the solid-state imaging device 3H includes a first substrate 10, in which a semiconductor substrate 110 and a multi-layer wiring layer 120 are laminated, a second substrate 20, in which a semiconductor substrate 210 and a multi-layer wiring layer 220 are laminated, a plurality of sub-chips 400A and 400B provided inside openings formed in the semiconductor substrate 210, and a multi-layer wiring layer 600 provided on the sub-chips 400A and 400B so as to cover the openings formed in the semiconductor substrate 210.

In the semiconductor substrate 110 in the first substrate 10, a photodiode is formed at a position corresponding to a pixel. In the multi-layer wiring layer 120, wiring or an electrode electrically connected to the photodiode is formed. On a light receiving surface of the first substrate 10, an insulating layer 130 including a color filter layer and a micro lens array is provided, and the pad opening portion 17 for exposing a pad formed inside the multi-layer wiring layer 120 is further provided.

In the multi-layer wiring layer 220 in the second substrate 20, wiring and electrodes constituting an AD conversion circuit for AD-converting a signal from the first substrate 10 are formed. The semiconductor substrate 210 is provided with openings, in which the sub-chips 400A and 400B are placed. In a region other than the regions corresponding to the openings, a through-via 201 passing through the semiconductor substrate 210 is formed.

In a multi-layer wiring layer 420A in the sub-chip 400A, a memory circuit for storing therein a signal from the second substrate 20 is formed. The multi-layer wiring layer 420A is provided with a through-via 413A passing through the semiconductor substrate 410A and electrically connected to wiring 601 provided in the multi-layer wiring layer 600. Organic resin or inorganic insulating material may be injected between the sub-chip 400A and the second substrate 20 so as to fill a gap therebetween.

In a multi-layer wiring layer 420B in the sub-chip 400B, a logic circuit for processing information on signals from the second substrate 20 is formed. The multi-layer wiring layer 420B is provided with a through-via 413B passing through the semiconductor substrate 410B and electrically connected to wiring 601 provided in the multi-layer wiring layer 600. Organic resin or inorganic insulating material may be injected between the sub-chip 400B and the second substrate 20 so as to fill a gap therebetween.

In the multi-layer wiring layer 600, the wiring 601 electrically connected to the through-via 201 passing through the semiconductor substrate 210 is formed. For example, the wiring 601 may be electrically connected to the through-via 201 passing through the semiconductor substrate 210, the through-via 413A passing through the semiconductor substrate 410A, and the through-via 413B passing through the semiconductor substrate 410B so that the wiring in the second substrate 20 and the wiring in the sub-chips 400A and 400B are electrically connected to each other.

The planar arrangement of the first substrate 10, the second substrate 20, the sub-chips 400A and 400B, and the multi-layer wiring layer 600 is described with reference to FIG. 15B. As illustrated in FIG. 15B, the first substrate 10 is provided with a pixel circuit CIS over substantially the entire surface, and the second substrate 20 is provided with an AD conversion circuit ADC, and the through-via 201 that is a connection electrode for the multi-layer wiring layer 600. The sub-chip 400A is provided with the through-via 413A that is a connection electrode for the multi-layer wiring layer 600 and a memory circuit (not shown), and the sub-chip 400B is a provided with a through-via 413B that is a connection electrode for the multi-layer wiring layer 600 and a logic circuit (not shown).

In the multi-layer wiring layer 600, for example, the through-vias 413A and 413B are provided correspondingly to the arrangement of the sub-chips 400A and 400B, and the through-via 201 is provided in a region different from the region in the second substrate 20 where the AD conversion circuit ADC is provided.

The solid-state imaging device 3H according to the eighth specific example enables the sub-chips 400A and 400B to be laminated on the first substrate 10 and the second substrate 20. In the solid-state imaging device 3H, the wiring electrically connected to the sub-chips 400A and 400B can be more freely laid out. Furthermore, the solid-state imaging device 3H enables a multi-layer wiring layer or a substrate to be further laminated on the sub-chips 400A and 400B and the second substrate 20 on the surface opposed to the light receiving surface.

NINTH SPECIFIC EXAMPLE

Referring to FIGS. 16A, 16B, 16C, 16D, and 16E, a solid-state imaging device according to a ninth specific example is described. FIGS. 16A, 16B, 16C, 16D, and 16E are vertical sectional views schematically illustrating steps in a method for manufacturing a solid-state imaging device 3I according to the ninth specific example. In the solid-state imaging device 3I according to the ninth specific example, when an opening 230 is provided in a second substrate 20, a slit pattern 510 functioning as an alignment mark or a monitor mark is simultaneously formed.

Figure 16A:
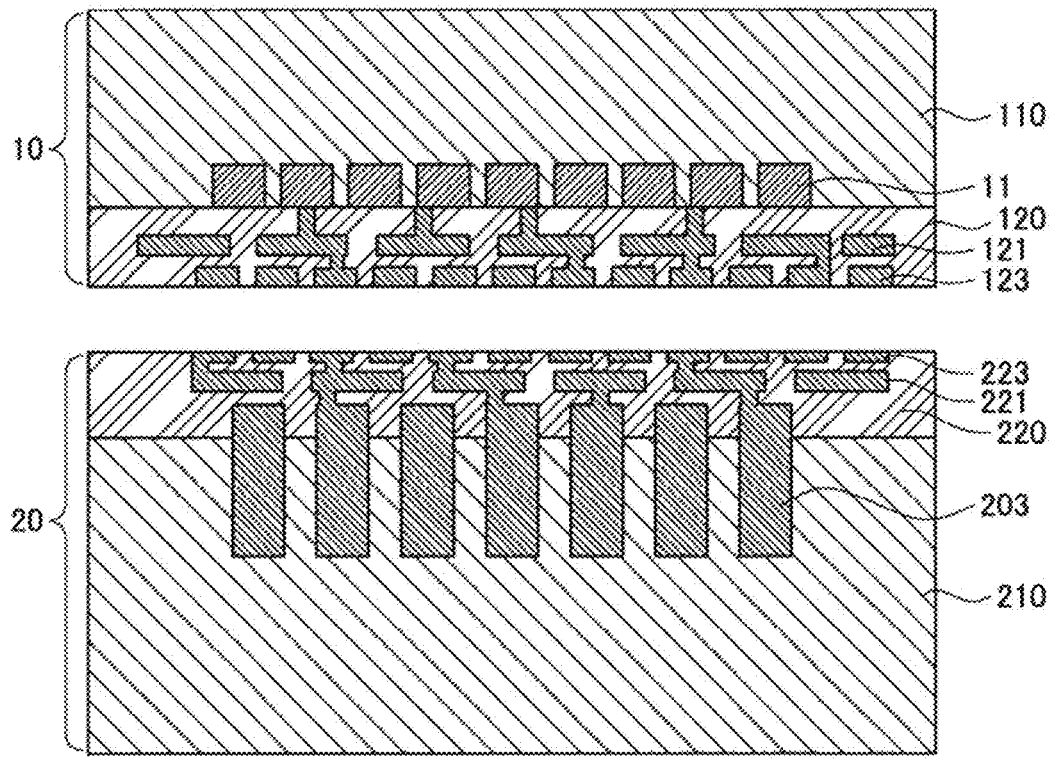
FIG. 16A is a vertical sectional view schematically illustrating one step in a method for manufacturing a solid-state imaging device according to a ninth specific example.

Specifically, as illustrated in FIG. 16A, first, a first substrate 10, in which a semiconductor substrate 110 and a multi-layer wiring layer 120 are laminated, is prepared. In the semiconductor substrate 110, a photodiode 11 is formed at a position corresponding to a pixel. In the multi-layer wiring layer 120, wiring 121 and electrodes 123 electrically connected to the photodiode 11 are formed. The electrode 123 is formed so as to be exposed on the topmost layer of the multi-layer wiring layer 120, so as to form an electrode bonding structure with an electrode 223 in the second substrate 20 described below.

A second substrate, in which a semiconductor substrate 210 and a multi-layer wiring layer 220 are laminated, is prepared. In the semiconductor substrate 210, the electrode 203 that subsequently forms an electrode bonding structure with the sub-chip 400 is formed in the region where the opening 230 is to be formed. In the multi-layer wiring layer 220, wiring 221 and electrodes 223 constituting a logic circuit for processing information on signals from the first substrate 10 are formed. The electrode 223 is formed so as to be exposed on the topmost layer of the multi-layer wiring layer 220, so as to form an electrode bonding structure with the electrode 123 in the first substrate 10.

Figure 16B:
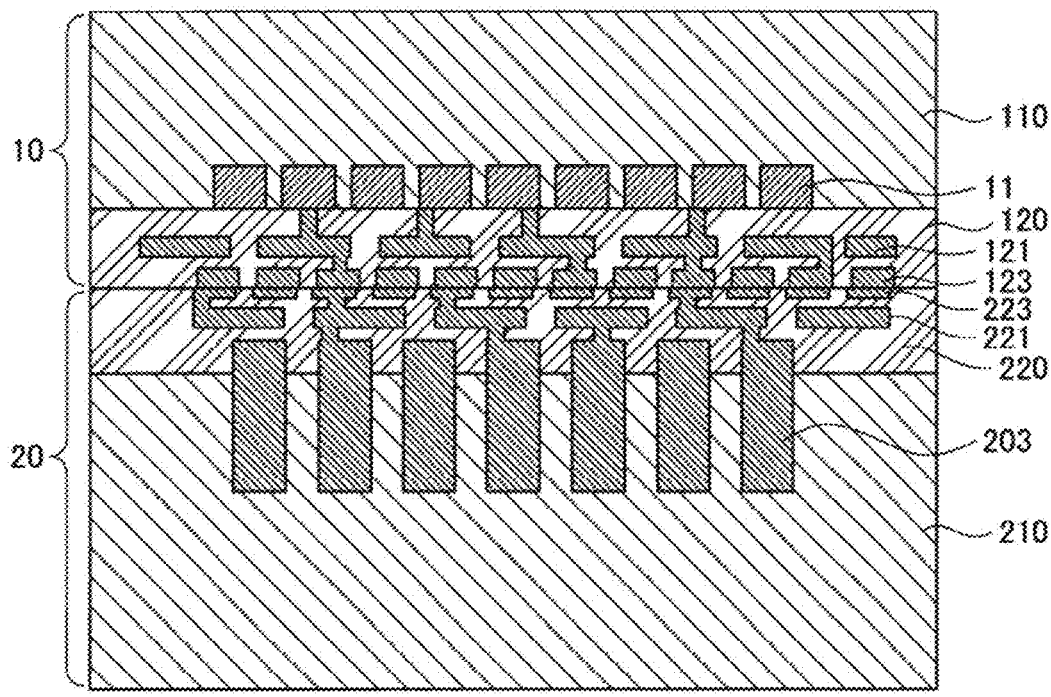
FIG. 16B is a vertical sectional view schematically illustrating one step in the method for manufacturing the solid-state imaging device according to the ninth specific example.

Next, as illustrated in FIG. 16B, the first substrate 10 and the second substrate 20 are bonded together such that the multi-layer wiring layer 120 of the first substrate 10 and the multi-layer wiring layer 220 of the second substrate 20 are opposed to each other. In this case, the electrode 123 exposed on the surface of the multi-layer wiring layer 120 and the electrode 223 exposed on the surface of the multi-layer wiring layer 220 are brought into direct contact with each other and then bonded by thermal treatment to form an electrode bonding structure. In this manner, wiring in the first substrate 10 and wiring in the second substrate 20 are electrically connected.

Figure 16C:
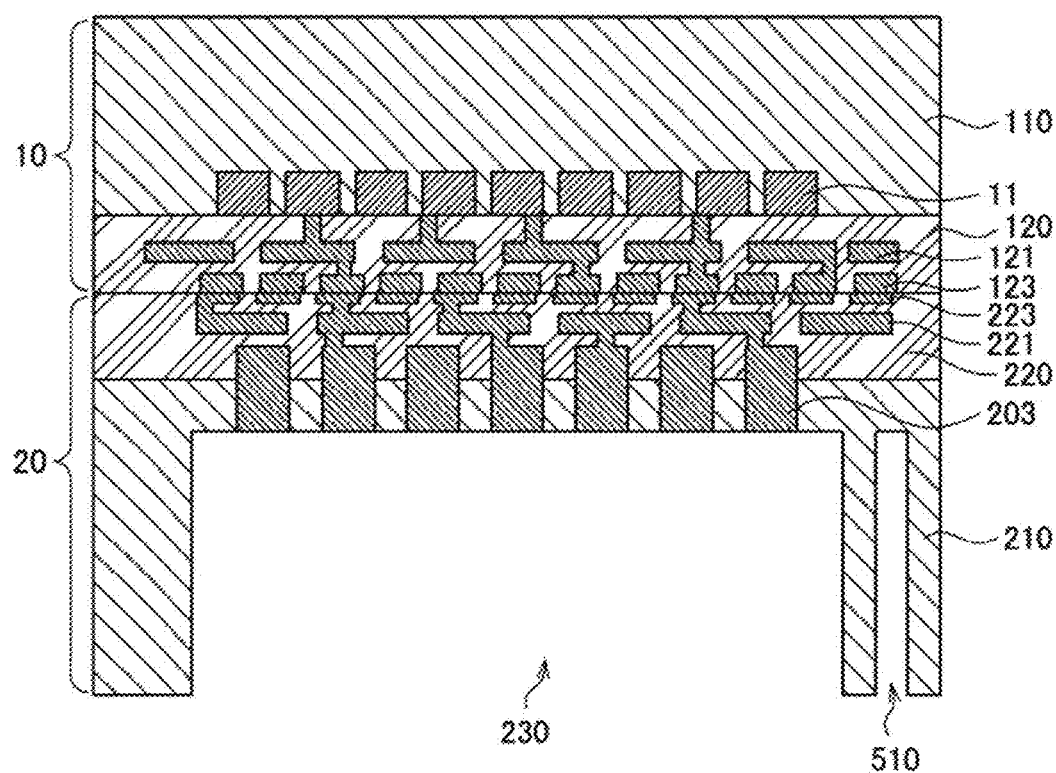
FIG. 16C is a vertical sectional view schematically illustrating one step in the method for manufacturing the solid-state imaging device according to the ninth specific example.

Subsequently, as illustrated in FIG. 16C, the opening 230 is provided in the surface of the laminate body of the first substrate 10 and the second substrate 20 on the semiconductor substrate 210 side. The opening 230 is provided at a depth and in a region that exposes the electrode 203 provided in the semiconductor substrate 210.

Furthermore, in the semiconductor substrate 210, the slit pattern 510 having substantially the same depth as that of the opening 230 is formed. The slit pattern 510 can be formed simultaneously with the opening 230, and can thus have substantially the same depth as that of the opening 230. Depending on the opening width or the influence of micro loading effect, the slit pattern 510 does not always have the same depth as that of the opening 230. For example, the slit pattern 510 may be used as an alignment mark for positioning the second substrate 20 and the sub-chip 400 when the sub-chip 400 is provided in the opening 230, or may be used as a monitor mark for detecting the thickness of the semiconductor substrate 210 when the semiconductor substrate 210 is polished by BGR or CMP. As long as these functions can be implemented, the slit pattern 510 may be formed in any planar shape such as a linear shape, a polygonal shape, and a circular shape.

Figure 16D:
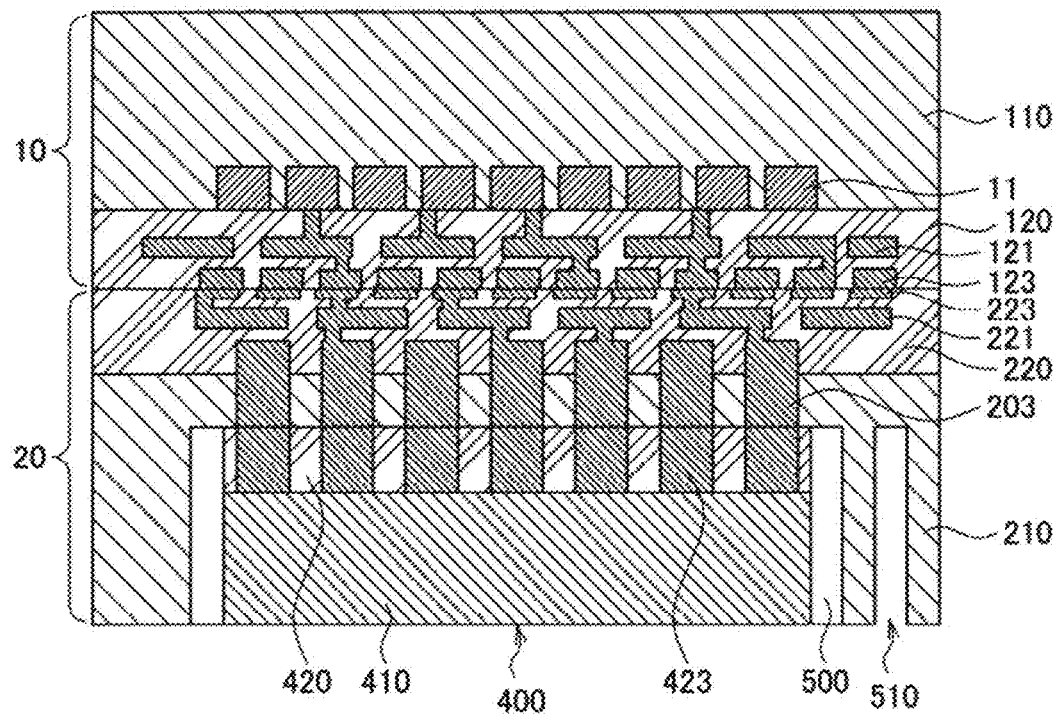
FIG. 16D is a vertical sectional view schematically illustrating one step in the method for manufacturing the solid-state imaging device according to the ninth specific example.

Next, as illustrated in FIG. 16D, the sub-chip 400 is placed inside the opening 230, and the surface of the laminate body of the first substrate 10, the second substrate 20, and the sub-chip 400 on the semiconductor substrates 210 and 410 side is thinned. Specifically, the sub-chip 400 is formed by laminating the semiconductor substrate 410 and the multi-layer wiring layer 420, and the multi-layer wiring layer 420 is provided with an electrode 423 for electrical connection to the second substrate 20. In this manner, the electrode 203 in the second substrate 20 and the electrode 423 in the sub-chip 400 can form an electrode bonding structure. Consequently, the second substrate 20 and the sub-chip 400 are electrically connected to each other.

After that, the surface of the laminate body of the first substrate 10, the second substrate 20, and the sub-chip 400 on the semiconductor substrates 210 and 410 side is thinned, and organic resin 500 is filled between the second substrate 20 and the sub-chip 400. As the organic resin 500, any publicly known resin used as a sealant or a filler can be used. During the thinning of the surface on the semiconductor substrate 210 and 410 side, the thickness of the semiconductor substrate 210 is monitored by the slit pattern 510, and the end points of the thinning of the semiconductor substrates 210 and 410 are determined.

Figure 16E:
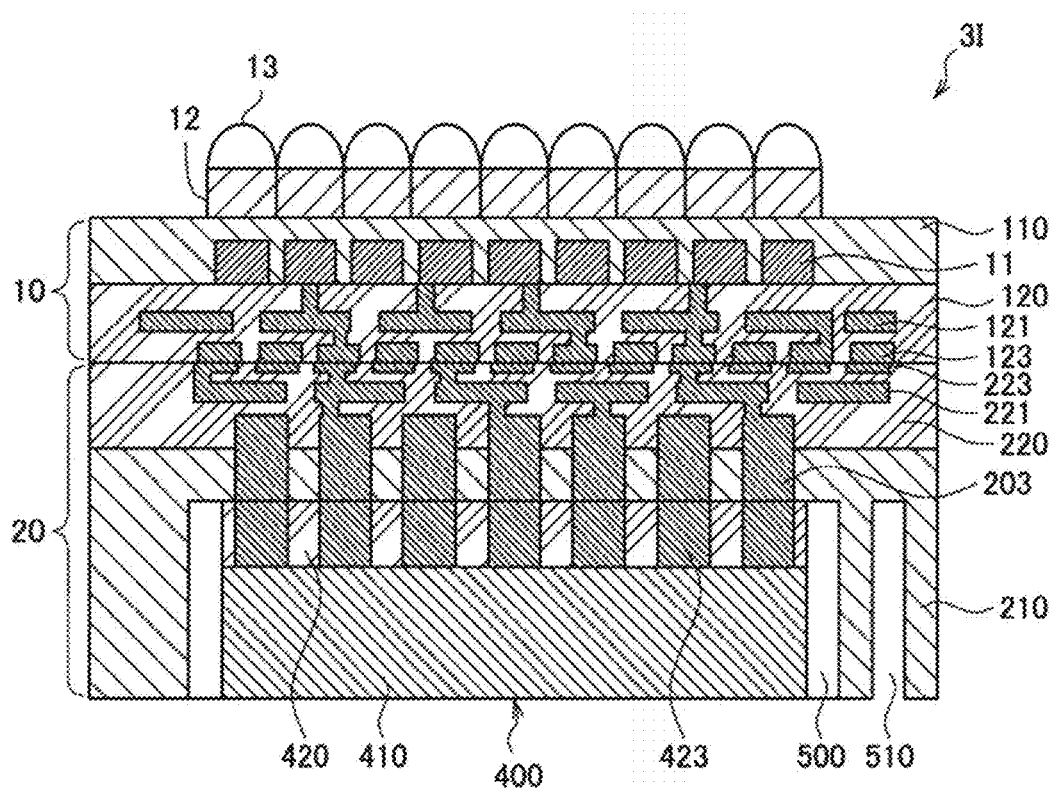
FIG. 16E is a vertical sectional view schematically illustrating one step in the method for manufacturing the solid-state imaging device according to the ninth specific example.

After that, as illustrated in FIG. 16E, the surface of the laminate body of the first substrate 10, the second substrate 20, and the sub-chip 400 on the semiconductor substrate 110 side is thinned, and then the color filter layer 12 and the micro lens array 13 are formed on the thinned surface. In this manner, what is called "back-illuminated solid-state imaging device 3I" can be formed.

TENTH SPECIFIC EXAMPLE

Figure 17:
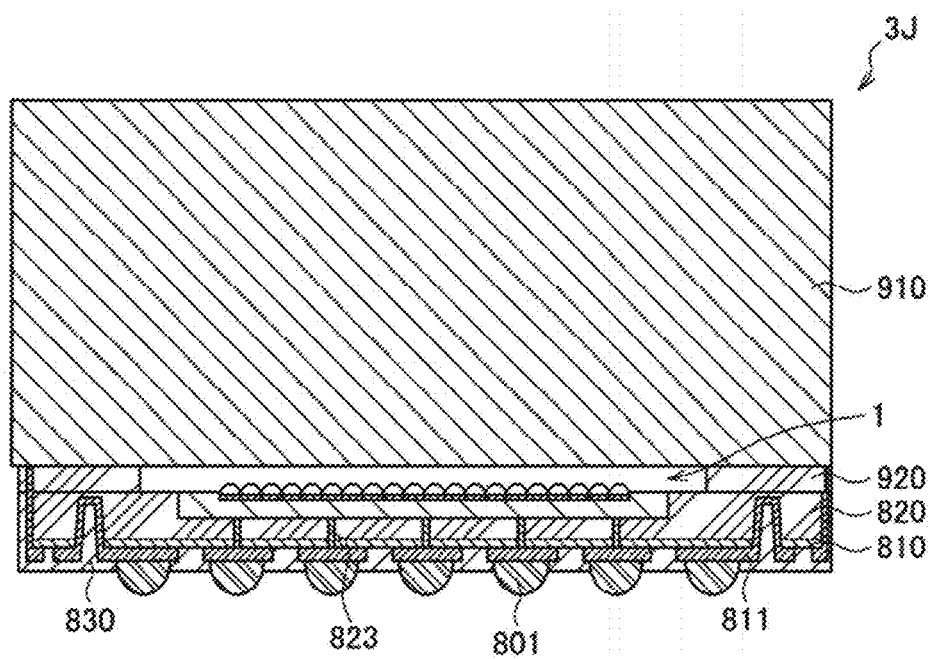
FIG. 17 is a vertical sectional view schematically illustrating a structure of a solid-state imaging device according to a tenth specific example.

Referring to FIG. 17, a tenth specific example is described. FIG. 17 is a vertical sectional view schematically illustrating a structure of an image sensor 3J according to a tenth specific example.

As illustrated in FIG. 17, the image sensor 3J includes the above-mentioned solid-state imaging device 1 including the first substrate 10, the second substrate 20, and the sub-chip 400, a support substrate 820 that supports the solid-state imaging device 1, cover glass 910 provided on the light receiving surface side of the solid-state imaging device 1, a spacer 920 provided between the support substrate 820 and the cover glass 910, an insulating layer 810 provided on a surface of the support substrate 820 on the side opposite to the light receiving surface of the solid-state imaging device 1, a through-via 823 provided to pass through the support substrate 820 and the insulating layer 810, a wiring layer 811 provided on the insulating layer 810, a solder resist 830 provided on the wiring layer 811, and bumps 801 provided on the wiring layer 811 so as to protrude from the solder resist 830.

In the image sensor 3J, cover glass 910 for protecting the solid-state imaging device 1 is provided on a light receiving surface of the solid-state imaging device 1 on which the micro lens array and the color filter layer are provided. The bumps 801 for extracting image information photoelectrically converted by the solid-state imaging device 1 are provided on a surface opposed to the light receiving surface. In the solid-state imaging device 1 according to the present embodiment, the sub-chip 400 can be provided on the surface of the solid-state imaging device 1 opposed to the light receiving surface, and the surface of the solid-state imaging device 1 opposed to the light receiving surface can have a rigid structure like the semiconductor substrates 210 and 410. Consequently, the solid-state imaging device 1 enables a structure such as the support substrate 820 and the through-via 823 to be formed in the surface of the solid-state imaging device 1 opposed to the light receiving surface. Thus, the solid-state imaging device 1 can extract signals from the surface of the solid-state imaging device 1 opposed to the light receiving surface.

For example, such an image sensor 3J can be easily mounted on a single chip together with another semiconductor device in a mixed manner through an interposer, and can thus be applied to system-on-a-chip (SoC). The image sensor 3J can protect the solid-state imaging device 1 from external environments by the cover glass 910 and the support substrate 820, and can thus improve the ease of handling.

5. <Application Examples>

The technology according to the present disclosure can be applied to various products described below.

(Application to Solid-State Imaging Device)

Figure 18:
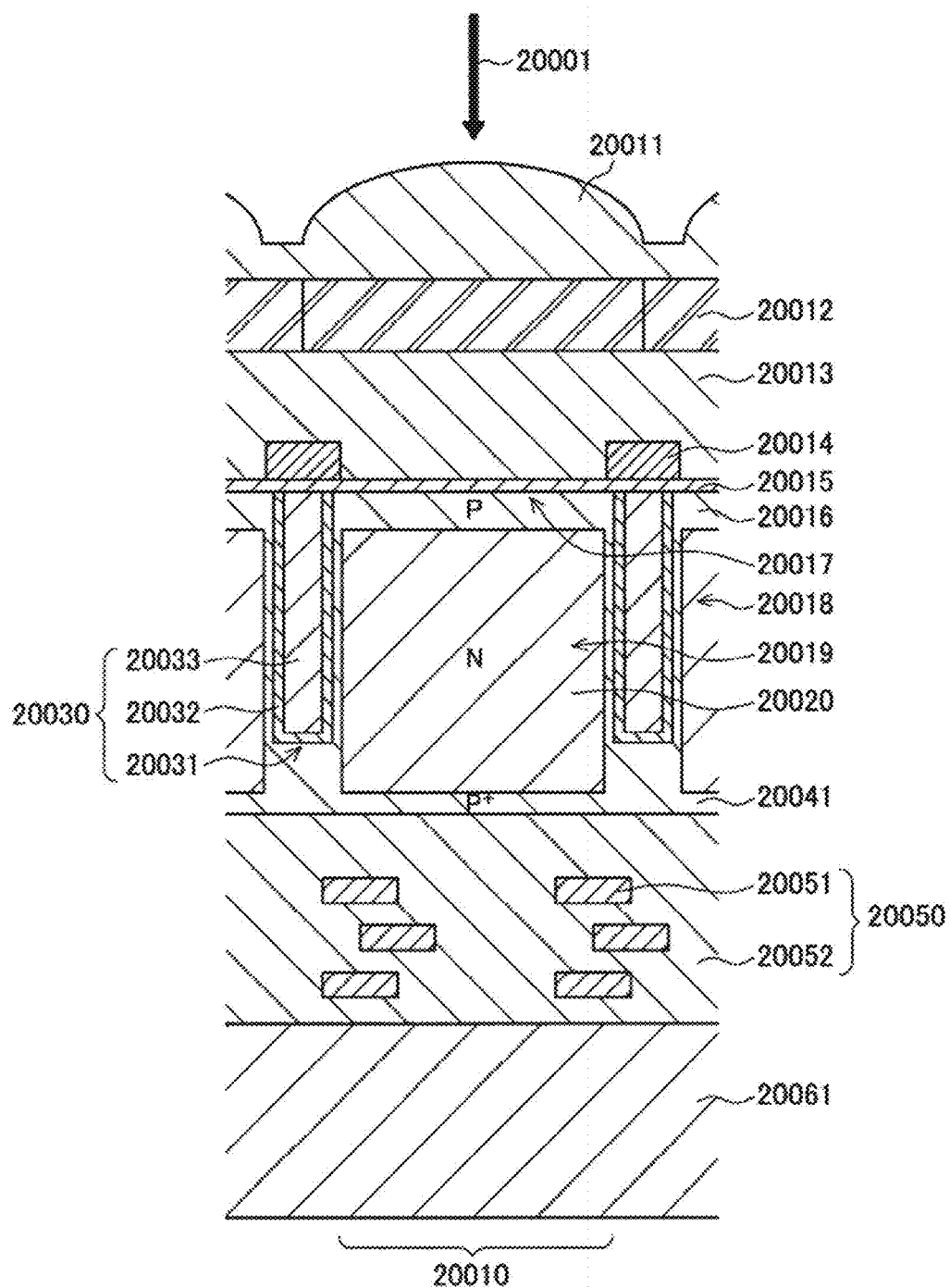
FIG. 18 is a sectional view illustrating a configuration example of a solid-state imaging device to which a technology according to the present disclosure may be applied.

For example, the technology according to the present disclosure may be applied to a solid-state imaging device having a pixel structure illustrated in FIG. 18. FIG. 18 is a sectional view illustrating a configuration example of a solid-state imaging device to which the technology according to the present disclosure may be applied.

In the solid-state imaging device, a photodiode (PD) 20019 receives incident light 20001 entering from the rear surface (top surface in FIG. 18) side of a semiconductor substrate 20018. A planarization film 20013 and a color filter (CF) 20012, and a micro lens 20011 are provided above the PD 20019, and the incident light 20001 that has entered sequentially through the portions is received by a light receiving surface 20017 and photoelectrically converted.

For example, in a PD 20019, an n-type semiconductor region 20020 is formed as a charge accumulation region for accumulating charges (electrons). In the PD 20019, the n-type semiconductor region 20020 is provided inside p-type semiconductor regions 20016 and 20041 in a semiconductor substrate 20018. On the front surface (lower surface) side of the semiconductor substrate 20018 in the n-type semiconductor region 20020, a p-type semiconductor region 20041 whose impurity concentration is higher than that on the rear surface (upper surface) side is provided. In other words, the PD 20019 has a hole-accumulation diode (HAD) structure, and the p-type semiconductor regions 20016 and 20041 are formed so as to suppress the generation of dark current at each interface on the upper surface side and the lower surface side of the n-type semiconductor region 20020.

Pixel separation portions 20030 for electrically separating a plurality of pixels 20010 are provided inside the semiconductor substrate 20018, and the PD 20019 is provided in a region sectioned by the pixel separation portions 20030. In FIG. 18, when the solid-state imaging device is seen from the upper surface side, for example, the pixel separation portions 20030 are formed in a grid pattern so as to be interposed between the pixels 20010, and the PD 20019 is formed in a region sectioned by the pixel separation portions 20030.

In each PD 20019, an anode is grounded, and in the solid-state imaging device, signal charges (for example, electrons) accumulated by the PD 20019 are read through a transfer Tr (MOS FET) (not shown), and output to a VSL (vertical signal line) (not shown) as an electric signal.

A wiring layer 20050 is provided on the surface (lower surface) of the semiconductor substrate 20018 opposed to the rear surface (upper surface), on which components such as a light shielding film 20014, a CF 20012, and a micro lens 20011 are provided.

The wiring layer 20050 includes wiring 20051 and an insulating layer 20052, and is formed such that the wiring 20051 is electrically connected to each element in the insulating layer 20052. The wiring layer 20050 is what is called "multi-layer wiring layer", and is formed such that an inter-layer insulating film constituting the insulating layer 20052 and the wiring 20051 are alternatingly laminated a plurality of times. As the wiring 20051, wiring to a Tr for reading charges from the PD 20019, such as a transfer Tr, and each piece of wiring such as VSL are laminated through the insulating layer 20052.

A support substrate 20061 is provided on a surface of the wiring layer 20050 on a side opposite to the side where the PD 20019 is provided. For example, a substrate made of silicon semiconductor having a thickness of several hundreds of pm is provided as the support substrate 20061.

The light shielding film 20014 is provided on the rear surface (in FIG. 18, upper surface) side of the semiconductor substrate 20018.

The light shielding film 20014 is configured to shield a part of incident light 20001 entering from above the semiconductor substrate 20018 toward the rear surface of the semiconductor substrate 20018.

The light shielding film 20014 is provided above the pixel separation portion 20030 provided inside the semiconductor substrate 20018. The light shielding film 20014 is provided on the rear surface (upper surface) of the semiconductor substrate 20018 so as to protrude to have a convex shape through an insulating film 20015 such as a silicon oxide film. On the other hand, the light shielding film 20014 is not provided above the PD 20019 provided inside the semiconductor substrate 20018 such that the incident light 20001 enters the PD 20019, and this region is opened.

In other words, in FIG. 18, when the solid-state imaging device is seen from the upper surface side, the planar shape of the light shielding film 20014 has a grid pattern, and an opening, through which the incident light 20001 passes to the light receiving surface 20017, is formed.

The light shielding film 20014 is formed from light shielding material for blocking light. For example, the light shielding film 20014 is formed by sequentially laminating a titanium (Ti) film and a tungsten (W) film. Other than that, for example, the light shielding film 20014 can be formed by sequentially laminating a titanium nitride (TiN) film and a tungsten (W) film.

The light shielding film 20014 is covered with a planarization film 20013. The planarization film 20013 is formed by using insulating material that transmits light.

The pixel separation portion 20030 has a groove portion 20031, a fixed charge film 20032, and an insulating film 20033.

The fixed charge film 20032 is formed on the rear surface (upper surface) side of the semiconductor substrate 20018 so as to cover the groove portion 20031 that sections the pixels 20010.

Specifically, the fixed charge film 20032 is provided so as to cover the inner surface of the groove portion 20031 formed on the rear surface (upper surface) side of the semiconductor substrate 20018 with a constant thickness. The insulating film 20033 is provided (loaded) so as to fill the inside of the groove portion 20031 covered with the fixed charge film 20032.

The fixed charge film 20032 is formed by using high dielectric substance having negative fixed charges so that a positive charge (hole) accumulation region is formed at an interface part with the semiconductor substrate 20018 to suppress the generation of dark current. By forming the fixed charge film 20032 having negative fixed charges, an electric field is applied to the interface with the semiconductor substrate 20018 due to the negative fixed charges, and the positive charge (hole) accumulation region is formed.

For example, the fixed charge film 20032 can be formed from a hafnium oxide film ($HfO_2$ film). Other than that, for example, the fixed charge film 20032 can be formed so as to contain at least one of oxides of hafnium, zirconium, aluminum, tantalum, titanium, magnesium, yttrium, and lanthanoid elements.

The technology according to the present disclosure can be applied to the solid-state imaging device having the pixel structure described above.

(Application to Endoscopic Surgical System)

For example, the technology according to the present disclosure may be applied to an endoscopic surgical system.

Figure 19A:
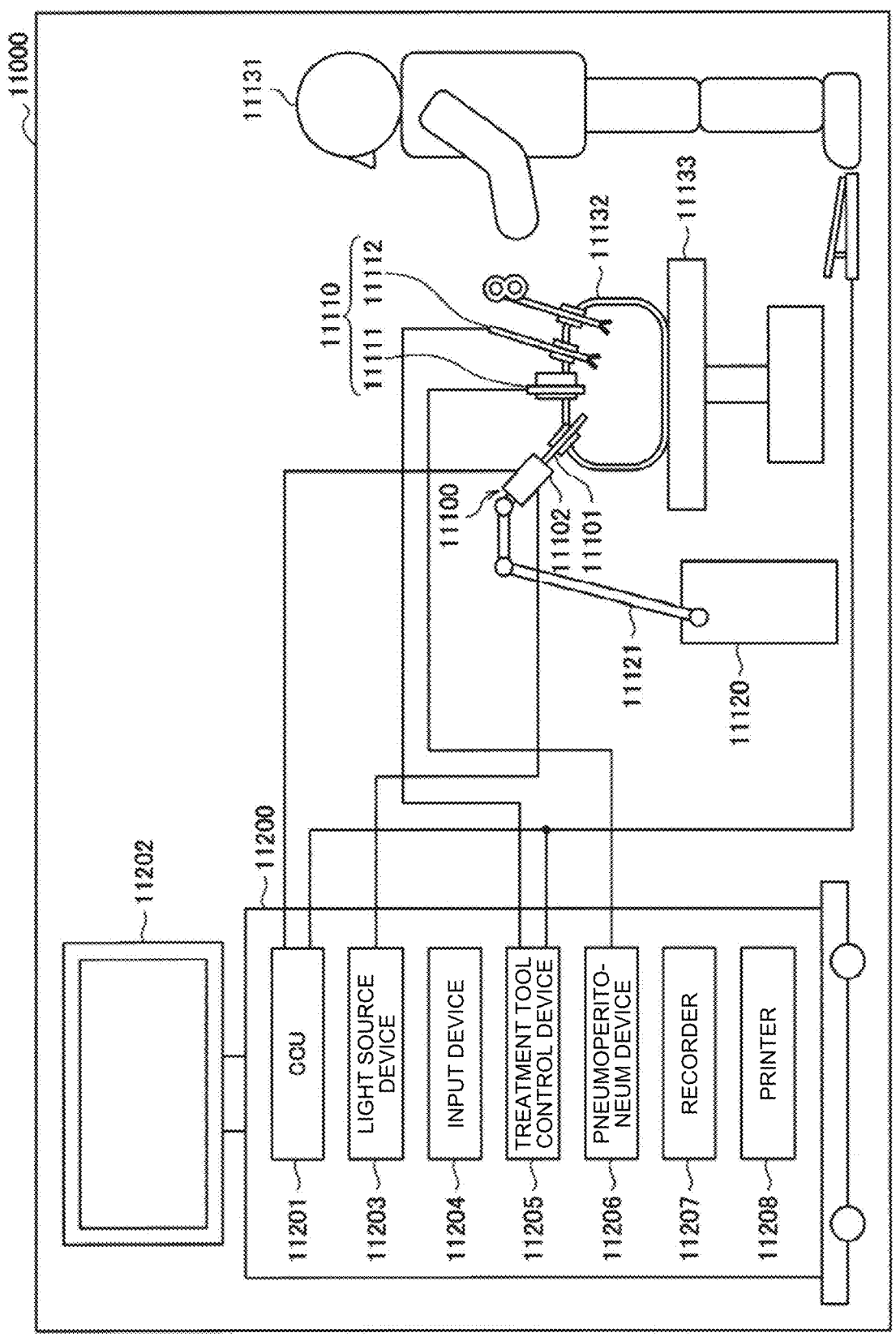
FIG. 19A is a diagram illustrating an example of a schematic configuration of an endoscopic surgical system.

FIG. 19A is a diagram illustrating an example of a schematic configuration of an endoscopic surgical system to which the technology according to the present disclosure (the present technology) may be applied.

FIG. 19A illustrates a situation where an operator (doctor) 11131 uses an endoscopic surgical system 11000 to make a surgery on a patient 11132 on a patient bed 11133. As illustrated in FIG. 19A, the endoscopic surgical system 11000 includes an endoscope 11100, other surgical tools 11110 such as a pneumoperitoneum tube 11111 and an energy treatment tool 11112, a support arm device 11120 that supports the endoscope 11100, and a cart 11200, on which various kinds of devices for an endoscopic surgery are mounted.

The endoscope 11100 includes a lens barrel 11101 whose region with a predetermined length from the tip is to be inserted into a body cavity of the patient 11132, and a camera head 11102 connected to the base of the lens barrel 11101. FIG. 19A illustrates an example of the endoscope 11100 configured as what is called "rigid scope" having the rigid lens barrel 11101, but the endoscope 11100 may be configured as what is called "flexible scope" having a flexible lens barrel.

At the tip of the lens barrel 11101, an opening portion, through which an objective lens is fitted, is provided. A light source device 11203 is connected to the endoscope 11100. Light generated by the light source device 11203 is guided to the tip of the lens barrel by a light guide extended to the inside of the lens barrel 11101, and is applied toward an object to be observed in the body cavity of the patient 11132 through the objective lens. The endoscope 11100 may be a forward-viewing endoscope, a forward-oblique viewing endoscope, or a lateral-viewing endoscope.

An optical system or an imaging element is provided inside the camera head 11102. Reflected light (observation light) from the object to be observed is condensed to the imaging element by the optical system. The observation light is photoelectrically converted by the imaging element, and an electric signal corresponding to the observation light, that is, an image signal corresponding to an observation image is generated. The image signal is transmitted to a camera control unit (CCU) 11201 as RAW data.

The CCU 11201 includes a central processing unit (CPU) or a graphics processing unit (GPU), and comprehensively controls the operations of the endoscope 11100 and a display device 11202. The CCU 11201 further receives an image signal from the camera head 11102, and performs various kinds of image processing for displaying an image based on the image signal, such as development processing (demosaicing), on the image signal.

Under control of the CCU 11201, the display device 11202 displays an image based on the image signal subjected to image processing by the CCU 11201.

The light source device 11203 includes a light source such as a light emitting diode (LED), and supplies irradiation light for photographing a surgical part to the endoscope 11100.

The input device 11204 is an input interface for the endoscopic surgical system 11000. A user can input various kinds of information and instructions to the endoscopic surgical system 11000 through the input device 11204. For example, the user inputs an instruction to change imaging conditions (such as type of irradiation light, magnification, and focal length) of the endoscope 11100.

A treatment tool control device 11205 controls the driving of the energy treatment tool 11112 for cauterization and cutting of tissue or sealing of blood vessels. A pneumoperitoneum device 11206 sends gas into the body cavity of the patient 11132 through the pneumoperitoneum tube 11111 in order to expand the body cavity for the purpose of securing the field of view of the endoscope 11100 and securing an operation space for the operator. A recorder 11207 is a device capable of recording various kinds of information on a surgery. A printer 11208 is a device capable of printing various kinds of information on a surgery in various forms such as text, images, and graphs.

For example, the light source device 11203 for supplying irradiation light for photographing a surgical part to the endoscope 11100 may be an LED, a laser light source, or a white light source configured by a combination thereof. When a white light source is configured by a combination of RGB laser light sources, the output intensity and output timing of each color (each wavelength) can be accurately controlled, and hence white balance of taken images can be adjusted by the light source device 11203. In this case, laser light from the RGB laser light sources is applied to an observation target in a time-division manner, and the driving of the imaging element in the camera head 11102 is controlled in synchronization with the irradiation timing, so that images corresponding to each of RGB can be taken in a time-division manner. This method can obtain a color image without the need of providing a color filter to the imaging element.

The driving of the light source device 11203 may be controlled such that the intensity of output light is changed every predetermined period. By controlling the driving of the imaging element in the camera head 11102 in synchronization with the timing of changing the intensity of light to acquire images in a time-division manner and combining the images, an image with a high dynamic range without what is called "crushed shadows" or "blown-out highlights" can be generated.

The light source device 11203 may be capable of supplying light in a predetermined wavelength band corresponding to special light observation. In special light observation, for example, what is called "narrow band imaging" is performed, in which the wavelength dependency of absorption of light in body tissue is used, and light in a narrower bandwidth than irradiation light (that is, white light) during normal observation is applied to photograph predetermined tissue such as blood vessels in a mucous membrane surface with high contrast. Alternatively, in special light observation, fluorescent observation for obtaining images by fluorescence generated by application of excitation light may be performed. In fluorescent observation, excitation light can be applied to body tissue and fluorescence from the body tissue can be observed (auto-fluorescence observation) or a reagent such as indocyanine green (ICG) can be locally injected in body tissue and excitation light corresponding to the fluorescent wavelength of the reagent can be applied to the body tissue to obtain a fluorescent image. The light source device 11203 may be capable of supplying narrow band light and/or excitation light that supports such special light observation.

Figure 19B:
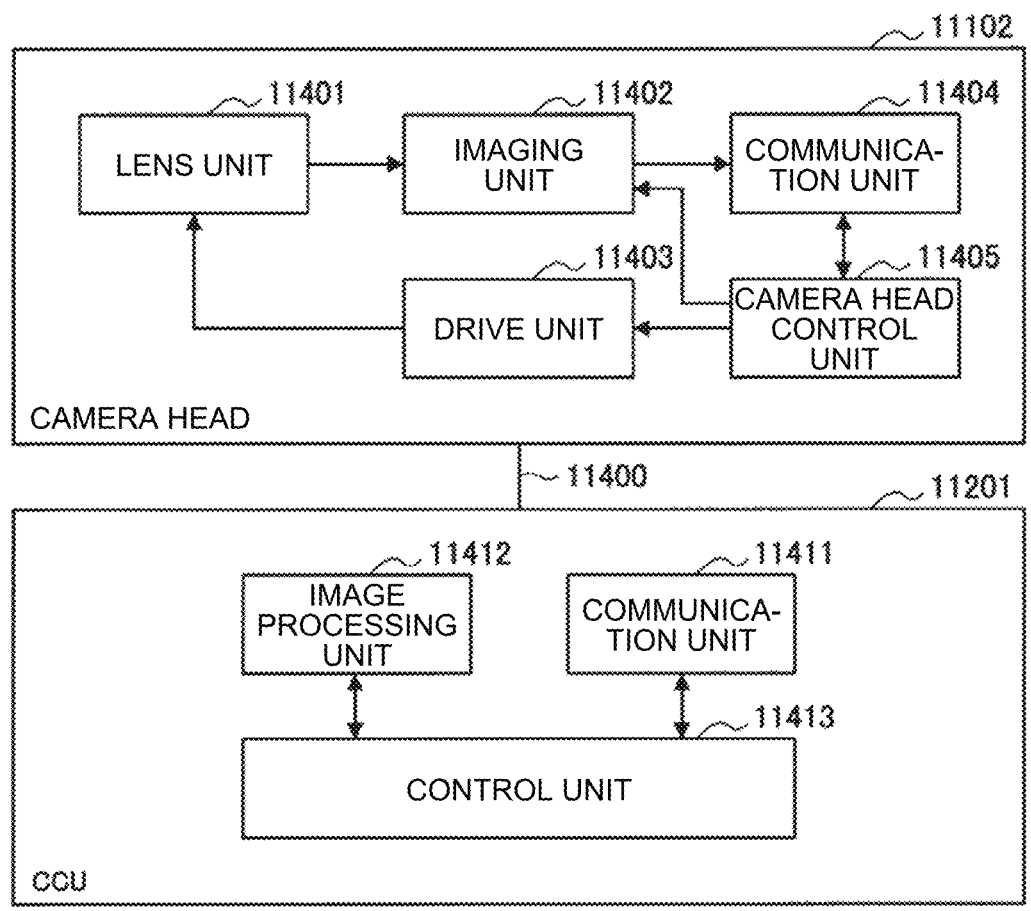
FIG. 19B is a block diagram illustrating an example of a functional configuration of a camera head and a CCU.

FIG. 19B is a block diagram illustrating an example of functional configurations of the camera head 11102 and the CCU 11201 illustrated in FIG. 19A.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other through a transmission cable 11400.

The lens unit 11401 is an optical system provided at a connection portion to the lens barrel 11101. Observation light taken from the tip of the lens barrel 11101 is guided to the camera head 11102, and enters the lens unit 11401. The lens unit 11401 is configured by a combination of a plurality of lenses including a zoom lens and a focus lens.

The imaging unit 11402 includes an imaging element. The number of imaging elements constituting the imaging unit 11402 may be one (what is called "single type") or plural (what is called "multiple type"). When the imaging unit 11402 is a multiple-type imaging unit, for example, image signals corresponding to each of RGB may be generated by imaging elements, and the image signals may be combined to obtain a color image. Alternatively, the imaging unit 11402 may include a pair of imaging elements for acquiring image signals for right eye and left eye corresponding to three-dimensional (3D) display. The 3D display enables the operator 11131 to more accurately grasp the depth of biological tissue in a surgical part. When the imaging unit 11402 is configured by a multiple-type imaging unit, a plurality of systems of lens units 11401 may be provided correspondingly to imaging elements.

The imaging unit 11402 is not necessarily required to be provided to the camera head 11102. For example, the imaging unit 11402 may be provided inside the lens barrel 11101 immediately behind an objective lens.

The drive unit 11403 is configured by an actuator. Under control of the camera head control unit 11405, the drive unit 11403 moves the zoom lens and the focus lens in the lens unit 11401 along an optical axis by a predetermined distance. In this manner, the magnification and the focal point of an image taken by the imaging unit 11402 may be adjusted as appropriate.

The communication unit 11404 is configured by a communication device for transmitting and receiving various kinds of information to and from the CCU 11201. The communication unit 11404 transmits an image signal obtained from the imaging unit 11402 to the CCU 11201 through the transmission cable 11400 as RAW data.

The communication unit 11404 receives a control signal for controlling the driving of the camera head 11102 from the CCU 11201, and supplies the control signal to the camera head control unit 11405. For example, the control signal includes information on imaging conditions, such as information for designating a frame rate of a taken image, information for designating an exposure value during imaging, and/or information for designating the magnification and the focal point of a taken image.

The above-mentioned imaging conditions, such as the frame rate, the exposure value, the magnification, and the focal point, may be designated by a user as appropriate, or may be automatically set by the control unit 11413 in the CCU 11201 based on an acquired image signal. In the latter case, what is called "auto exposure (AE) function", "auto focus (AF) function", and "auto white balance (AWB) function" are installed in the endoscope 11100.

The camera head control unit 11405 controls the driving of the camera head 11102 based on a control signal from the CCU 11201 received through the communication unit 11404.

The communication unit 11411 is configured by a communication device for transmitting and receiving various kinds of information to and from the camera head 11102. The communication unit 11411 receives an image signal transmitted through the transmission cable 11400 from the camera head 11102.

The communication unit 11411 transmits a control signal for controlling the driving of the camera head 11102 to the camera head 11102. The image signal and the control signal can be transmitted by electric communication or optical communication.

The image processing unit 11412 performs various kinds of image processing on image signals as RAW data transmitted from the camera head 11102.

The control unit 11413 performs various kinds of control related to the imaging of a surgical part by the endoscope 11100 and the display of a taken image obtained by the imaging of the surgical part. For example, the control unit 11413 generates a control signal for controlling the driving of the camera head 11102.

The control unit 11413 causes the display device 11202 to display a taken image in which a surgical part appears, based on an image signal subjected to image processing by the image processing unit 11412. In this case, the control unit 11413 may recognize various kinds of objects in the taken image by using various kinds of image recognition technology. For example, the control unit 11413 can recognize surgical tools such as forceps, particular biological sites, bleeding, and mist during the use of the energy treatment tool 11112 by detecting the shape and color of edges of objects included in the taken image. When causing the display device 11202 to display the taken image, the control unit 11413 may use the recognition result to cause various kinds of surgery assist information to be displayed on an image of the surgical part in a superimposed manner. The superimposed display of the surgical assist information presented to the operator 11131 can reduce the burden on the operator 11131 and enables the operator 11131 to advance a surgery reliably.

The transmission cable 11400 that connects the camera head 11102 and the CCU 11201 is an electric signal cable supporting communication of electric signals, an optical fiber supporting optical communication, or a composite cable thereof.

In the illustrated example, wired communication using the transmission cable 11400 is performed, but the communication between the camera head 11102 and the CCU 11201 may be performed in a wireless manner.

An example of the endoscopic surgical system to which the technology according to the present disclosure may be applied has been described above. The technology according to the present disclosure may be applied to, for example, the endoscope 11100 and the imaging unit 11402 in the camera head 11102 in the configurations described above. Specifically, the solid-state imaging device according to the present embodiment can be applied to the imaging unit 10402. This application allows the endoscopic surgical system to obtain a clearer surgical part image, and hence the operator can reliably check a surgical part. Alternatively, the endoscopic surgical system can obtain a surgical part image with a lower latency, and hence the operator can perform treatment with the same feeling as in the case where the operator directly observes a surgical part.

The endoscopic surgical system has been described as an example. However, the technology according to the present disclosure may be applied to other systems, such as a microscopic surgical system.

Application to Mobile Body

For example, the technology according to the present disclosure may be applied to devices mounted on any kind of mobile bodies, including automobiles, electric vehicles, hybrid electric vehicles, motorcycles, bicycles, personal mobilities, airplanes, drones, ships, and robots.

Figure 20A:
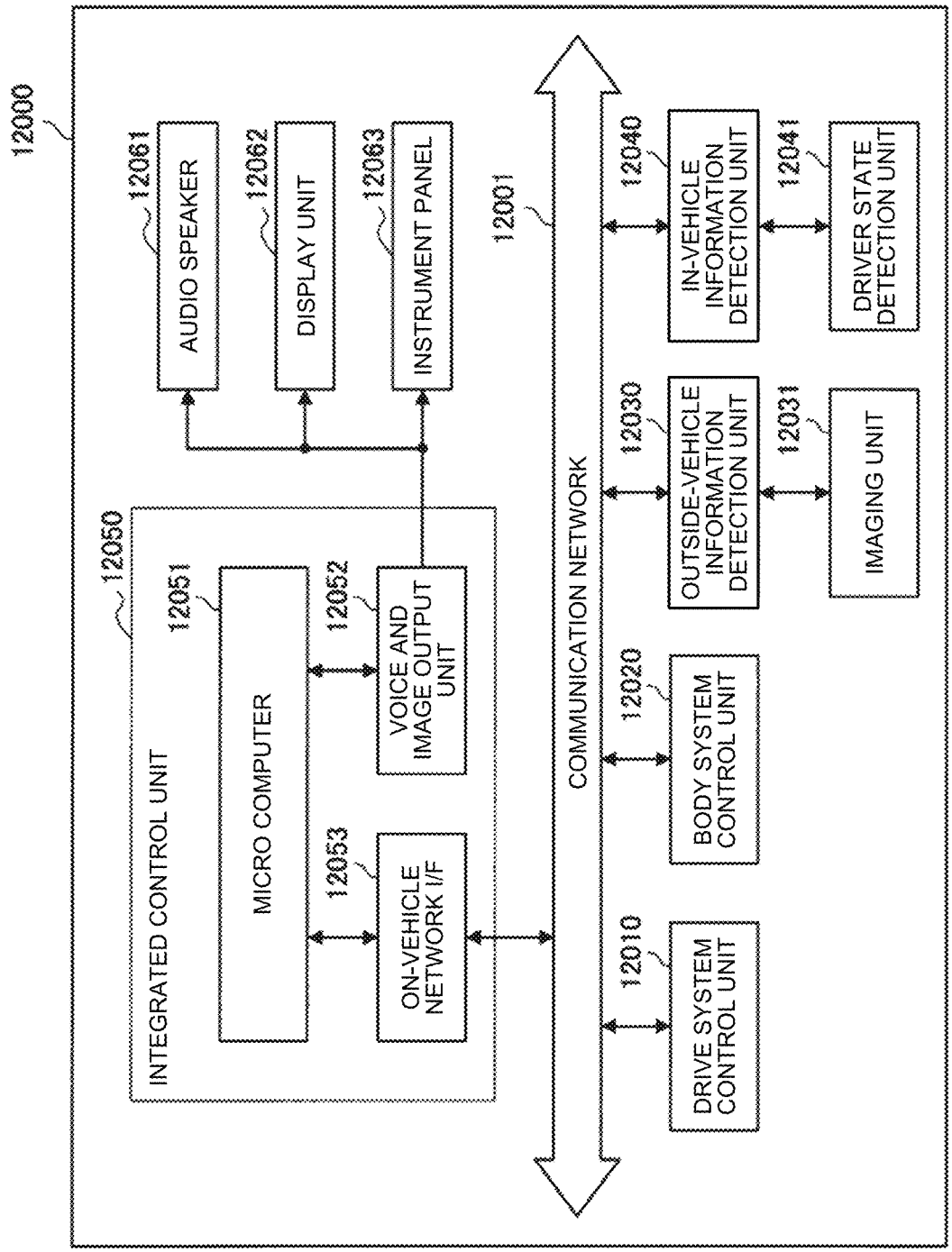
FIG. 20A is a block diagram illustrating an example of a schematic configuration of a vehicle control system.

FIG. 20A is a block diagram illustrating a schematic configuration example of a vehicle control system as an example of a mobile control system to which the technology according to the present disclosure may be applied.

A vehicle control system 12000 includes a plurality of electronic control units connected through a communication network 12001. In the example illustrated in FIG. 20A, the vehicle control system 12000 includes a drive system control unit 12010, a body system control unit 12020, an outside-vehicle information detection unit 12030, an in-vehicle information detection unit 12040, and an integrated control unit 12050. As a functional configuration of the integrated control unit 12050, a microcomputer 12051, a voice and image output unit 12052, and an on-vehicle network interface (I/F) 12053 are illustrated.

The drive system control unit 12010 controls the operation of devices related to a drive system in a vehicle in accordance with various kinds of computer programs. For example, the drive system control unit 12010 functions as a control device such as a drive power generation device for generating drive power for a vehicle, such as an internal combustion engine and a drive motor, a drive power transmission mechanism for transmitting drive power to a wheel, a steering mechanism for adjusting a steering angle of a vehicle, and a braking device for generating braking force for a vehicle.

The body system control unit 12020 controls the operation of various kinds of devices mounted to the vehicle body in accordance with various kinds of computer programs. For example, the body system control unit 12020 functions as a control device for a keyless entry system, a smart key system, a power window device, or various kinds of lamps such as a head lamp, a back lamp, a brake lamp, a blinker, and a fog lamp. In this case, radio waves transmitted from a mobile terminal substituting for a key or signals from various kinds of switches may be input to the body system control unit 12020. The body system control unit 12020 receives input of the radio waves or the signals to control a door lock device, a power window device, and a lamp of the vehicle.

The outside-vehicle information detection unit 12030 detects information outside a vehicle having the vehicle control system 12000 mounted thereon. For example, the imaging unit 12031 is connected to the outside-vehicle information detection unit 12030. The outside-vehicle information detection unit 12030 causes the imaging unit 12031 to take an image outside the vehicle, and receives the taken image. Based on the received image, the outside-vehicle information detection unit 12030 may perform object detection processing or distance detection processing for persons, cars, obstacles, signs, or characters on a road surface.

The imaging unit 12031 is an optical sensor for receiving light and outputting an electric signal corresponding to the amount of received light. The imaging unit 12031 can output the electric signal as an image, and output the electric signal as information for ranging. Light received by the imaging unit 12031 may be visible light or invisible light such as infrared rays.

The in-vehicle information detection unit 12040 detects information inside the vehicle. For example, a driver state detection unit 12041 for detecting the state of a driver is connected to the in-vehicle information detection unit 12040. For example, the driver state detection unit 12041 includes a camera for imaging a driver, and the in-vehicle information detection unit 12040 may calculate the degree of fatigue or degree of concentration of the driver or determine whether the driver is asleep based on detection information input from the driver state detection unit 12041.

The microcomputer 12051 can calculate a control target value for a drive power generation device, a steering mechanism, or a braking device based on information inside or outside the vehicle acquired by the outside-vehicle information detection unit 12030 or the in-vehicle information detection unit 12040, and output a control instruction to the drive system control unit 12010. For example, the microcomputer 12051 can perform collaborative control for the purpose of implementing functions of an advanced driver assistance system (ADAS) including vehicle collision avoidance or impact alleviation, tracking traveling, vehicle speed keeping traveling, and vehicle collision warning based on following distance, or vehicle lane deviation warning.

The microcomputer 12051 can perform collaborative control for the purpose of automatic driving to autonomously drive independently of driver's operation by controlling the drive power generation device, the steering mechanism, or the braking device based on information around the vehicle acquired by the outside-vehicle information detection unit 12030 or the in-vehicle information detection unit 12040.

The microcomputer 12051 can output a control instruction to the body system control unit 12020 based on information outside the vehicle acquired by the outside-vehicle information detection unit 12030. For example, the microcomputer 12051 can perform collaborative control for the purpose of preventing dazzle by controlling a head lamp in accordance with the position of a preceding vehicle or an oncoming vehicle detected by the outside-vehicle information detection unit 12030 and switching from high beams to low beams.

The voice and image output unit 12052 transmits an output signal of at least one of voice and images to an output device capable of notifying a vehicle occupant or the outside of the vehicle of information visually or aurally. FIG. 20A exemplifies an audio speaker 12061, a display unit 12062, and an instrument panel 12063 as output devices. For example, the display unit 12062 may include at least one of an onboard display and a head-up display.

Figure 20B:
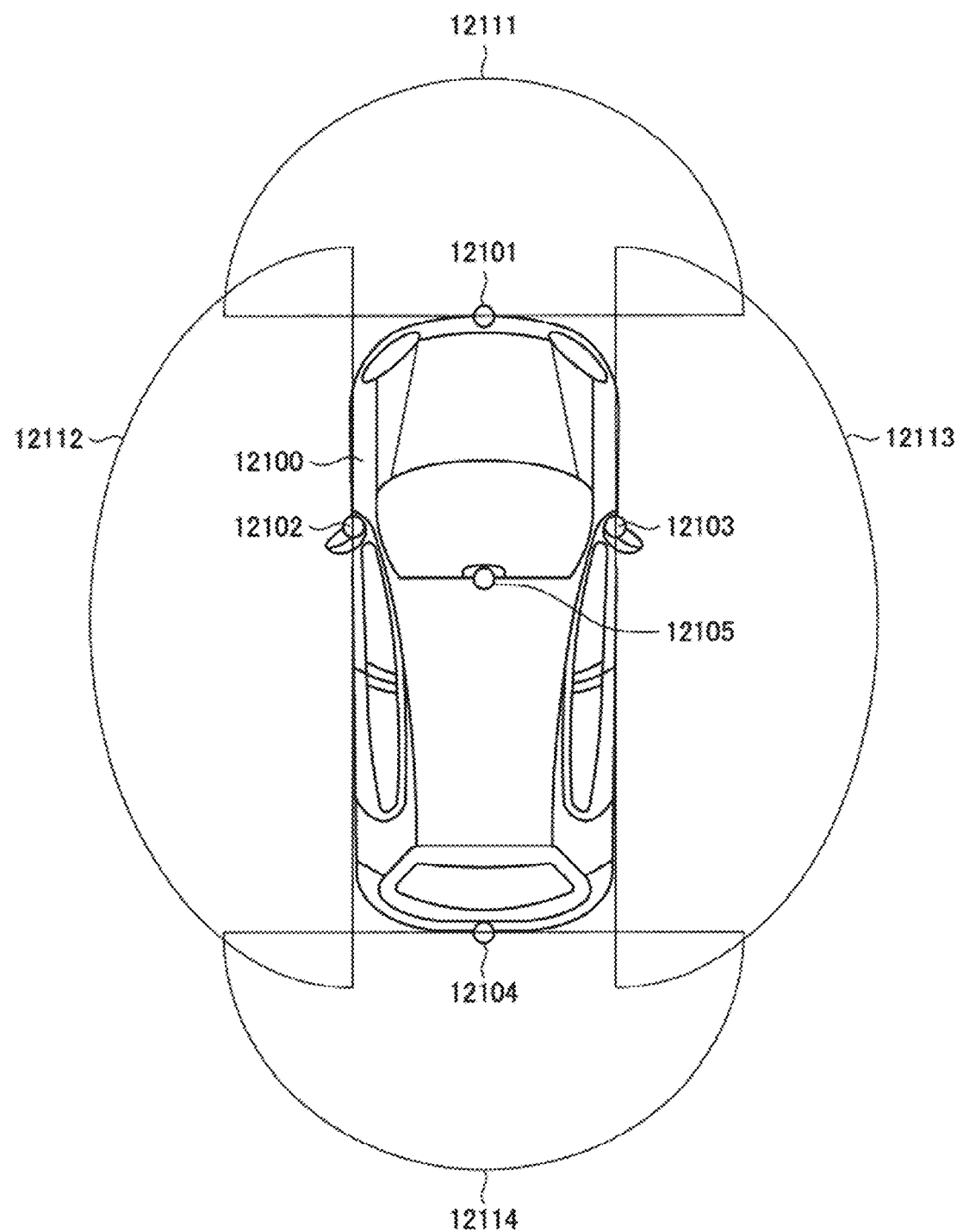
FIG. 20B is an explanatory diagram illustrating an example of installation positions of an outside-vehicle information detection unit and an imaging unit.

FIG. 20B is a diagram illustrating an example of an installation position of the imaging unit 12031.

In FIG. 20B, a vehicle 12100 has imaging units 12101, 12102, 12103, 12104, and 12105 as imaging units 12031.

For example, the imaging units 12101, 12102, 12103, 12104, and 12105 are provided at positions of a front nose, side mirrors, a rear bumper, and a back door of the vehicle 12100 and an upper part of a front window in the vehicle interior. The imaging unit 12101 provided to the front nose and the imaging unit 12105 provided at the upper part of the front window in the vehicle interior mainly acquire images in front of the vehicle 12100. The imaging units 12102 and 12103 provided to the side mirrors mainly acquire images on the sides of the vehicle 12100. The imaging unit 12104 provided to the rear bumper or the back door mainly acquires images behind the vehicle 12100. The front images acquired by the imaging units 12101 and 12105 are mainly used for detection of preceding vehicles, or pedestrians, obstacles, traffic lights, road signs, or lanes.

FIG. 20B illustrates an example of a photographing range of the imaging units 12101 to 12104. An imaging range 12111 indicates an imaging range of the imaging unit 12101 provided to the front nose. Imaging ranges 12112 and 12113 indicate imaging ranges of the imaging units 12102 and 12103 provided to the side mirrors. An imaging range 12114 indicates an imaging range of the imaging unit 12104 provided to the rear bumper or the back door. For example, pieces of image data taken by the imaging units 12101 to 12104 are superimposed to obtain an overhead image seen from above the vehicle 12100.

At least one of the imaging units 12101 to 12104 may have a function for acquiring distance information. For example, at least one of the imaging units 12101 to 12104 may be a stereo camera including a plurality of imaging elements, or may be an imaging element having pixels for phase difference detection.

For example, the microcomputer 12051 can determine distances to each three-dimensional object in the imaging ranges 12111 to 12114 and a temporal change of the distances (relative speed to the vehicle 12100) based on the distance information obtained from the imaging units 12101 to 12104, thereby extracting, as a preceding vehicle, a three-dimensional object that is closest on a traveling road of the vehicle 12100 and is traveling at a predetermined speed (for example, 0 km/h or more) in substantially the same direction as the vehicle 12100, among other three-dimensional objects. Furthermore, the microcomputer 12051 can set an following distance to be secured behind a preceding vehicle in advance to perform automatic braking control (including following stop control) and automatic acceleration control (including following start control). In this manner, the collaborative control for the purpose of automatic driving to autonomously travel independently of driver's operation can be performed.

For example, the microcomputer 12051 can classify and extract three-dimensional object data on three-dimensional objects into two-wheeled vehicles, standard-sized vehicles, large vehicles, pedestrians, and other three-dimensional objects such as telephone poles on the basis of distance information obtained from the imaging units 12101 to 12104, and use the three-dimensional object data for automatic obstacle avoidance. For example, the microcomputer 12051 distinguishes obstacles around the vehicle 12100 to obstacles that can be visually recognized by a driver of the vehicle 12100 and obstacles that are difficult to be visually recognized. The microcomputer 12051 determines a collision risk indicating the degree of danger of collision with each obstacle, and in a situation where a collision risk is equal to or higher than a set value and the vehicle can possibly collide with an obstacle, the microcomputer 12051 can assist the driving for collision avoidance by outputting warning to the driver through the audio speaker 12061 or the display unit 12062 and performing forced deceleration and avoidance steering through the drive system control unit 12010.

At least one of the imaging units 12101 to 12104 may be an infrared camera for detecting infrared rays. For example, the microcomputer 12051 can determine whether a pedestrian is present in images taken by the imaging units 12101 to 12104 to recognize the pedestrian. For example, the pedestrian is recognized by a procedure for extracting feature points in images taken by the imaging units 12101 to 12104 as infrared cameras and a procedure for determining whether an object is a pedestrian by performing pattern matching on a series of feature points indicating the contour of the object. When the microcomputer 12051 determines that a pedestrian is present in the images taken by the imaging units 12101 to 12104 and recognizes the pedestrian, the voice and image output unit 12052 controls the display unit 12062 to display the rectangular contour for emphasizing the recognized pedestrian in a superimposed manner. The voice and image output unit 12052 may control the display unit 12062 to display an icon indicating a pedestrian at a desired position.

An example of the vehicle control system to which the technology according to the present disclosure may be applied has been described above. The technology according to the present disclosure may be applied to, for example, the imaging unit 12031 in the configurations described above. Specifically, the solid-state imaging device according to the present embodiment can be applied to the imaging unit 12031. This application allows the vehicle control system to obtain an easier-to-view photographed image and can thus reduce the fatigue of the driver.

<6. Conclusion>

As described above, in the solid-state imaging device 1 according to the present embodiment, the second substrate 20 formed by the circuit board 200 and the opening substrate 300 can be used as a support, and a space for mounting the sub-chip 400 therein can be provided in the opening substrate 300 by the opening 330. Consequently, the solid-state imaging device 1 enables a discrete sub-chip 400 to be additionally mounted, and hence the degree of freedom of the size and layout of chips to be laminated can be increased. Even in such a case, the solid-state imaging device 1 can suppress the increase in thickness as a whole.

For example, the solid-state imaging device according to the present embodiment described above may be mounted to an electronic device described below. For example, the solid-state imaging device according to the present embodiment may be mounted on an imaging unit in a smartphone or a digital camera capable of electronically photographing an observation target. The solid-state imaging device according to the present embodiment may be mounted on an imaging unit in any electronic device including a video camera, a glass-type wearable device, a head mounted display (HMD), a tablet PC, and a game device.

While preferable embodiments of the present disclosure have been described above in detail with reference to the accompanying drawings, the technical scope of the present disclosure is not limited to the examples. It is obvious that a person with ordinary skills in the technical field of the present disclosure could conceive of various kinds of changes and modifications within the range of the technical concept described in the claims. It should be understood that the changes and the modifications belong to the technical scope of the present disclosure.

The effects described herein are merely demonstrative or illustrative and are not limited. In other words, the technology according to the present disclosure could exhibit other effects obvious to a person skilled in the art from the descriptions herein together with or in place of the above-mentioned effects.

The following configurations also belong to the technical scope of the present disclosure.

(1)

A solid-state imaging device, comprising:

a first substrate that has one principal surface on which a pixel portion in which pixels are arranged is formed;

a second substrate which is bonded to a surface of the first substrate opposed to the one principal surface and in which an opening is provided in a partial region in a surface opposed to a bonding surface to the first substrate; and at least one sub-chip which is provided inside the opening so as not to protrude from the opening and in which a circuit having a predetermined function is formed.

(2)

The solid-state imaging device according to (1), wherein the second substrate and the sub-chip are electrically connected such that electrodes formed in bonding surfaces of the second substrate and the sub-chip are in direct contact with each other.

(3)

The solid-state imaging device according to (1) or (2), wherein the second substrate is formed by bonding a plurality of substrates, and a substrate provided on a bonding surface with the sub-chip is a substrate in which a through hole corresponding to the opening is provided.

(4)

The solid-state imaging device according to (3), wherein the substrates each have a circuit having a predetermined function formed therein.

(5)

The solid-state imaging device according to (4), wherein the sub-chip has a memory circuit formed therein.

(6)

The solid-state imaging device according to (4) or (5), wherein the second substrate has formed therein at least one of a logic circuit and an analog-digital conversion circuit.

(7)

The solid-state imaging device according to any one of (1) to (6), wherein a surface height of the sub-chip on an opening surface side in the opening is substantially the same as a surface height of an opening surface of the opening.

(8)

The solid-state imaging device according to (1) or (2), wherein the first substrate and the second substrate are formed by laminating a semiconductor substrate and a multi-layer wiring layer, and the first substrate and the second substrate are bonded such that the multi-layer wiring layers are opposed to each other.

(9)

The solid-state imaging device according to (5), wherein the semiconductor substrates constituting the first substrate and the second substrate are formed from the same material.

(10)

The solid-state imaging device according to (8) or (9), wherein the sub-chip is formed by laminating a semiconductor substrate and a multi-layer wiring layer, and the semiconductor substrate constituting the sub-chip is formed from material different from both semiconductor substrates constituting the first substrate and the second substrate.

(11)

The solid-state imaging device according to any one of (1) to (10), further comprising a multi-layer wiring layer provided on the second substrate so as to cover the opening, and electrically connecting the sub-chip and the second substrate.

(12) The solid-state imaging device according to (11), wherein the first substrate, the second substrate, and the sub-chip are each formed by laminating a semiconductor substrate and a multi-layer wiring layer, and
the multi-layer wiring layer electrically connects the sub-chip and the second substrate through a second substrate through electrode passing through the semiconductor substrate in the second substrate and a sub-chip through electrode passing through the semiconductor substrate in the sub-chip.

(13) The solid-state imaging device according to (1), wherein the second substrate is formed by laminating a semiconductor substrate and a multi-layer wiring layer,
the solid-state imaging device further includes:
a second substrate through electrode passing through the semiconductor substrate in the second substrate; and
a multi-layer wiring layer provided on the second substrate so as to cover the opening, and
the multi-layer wiring layer has formed therein an external input/output terminal electrically connected to the second substrate through electrode.

(14) The solid-state imaging device according to (13), wherein the external input/output terminal is formed in the multi-layer wiring layer in a planar region overlapping with any one of the second substrate and the sub-chip.

(15) The solid-state imaging device according to (13) or (14), wherein the external input/output terminal is a solder ball.

(16) The solid-state imaging device according to (12), further comprising a third substrate which is provided on the multi-layer wiring layer and in which a circuit having a predetermined function is formed.

(17) The solid-state imaging device according to (16), wherein the second substrate has an analog-digital conversion circuit formed therein, and
the third substrate has a logic circuit formed therein.

(18) The solid-state imaging device according to any one of (1) to (17), wherein a plurality of the sub-chips are provided inside the opening.

(19) The solid-state imaging device according to any one of (1) to (18), wherein an alignment mark or a monitor mark is further formed in the surface of the second substrate in which the opening is formed.

(20) The solid-state imaging device according to (19), wherein the alignment mark or the monitor mark is a slit pattern having substantially the same depth as a depth of the opening.

REFERENCE SIGNS LIST 1, 2A, 2B, 3A, 3B, 3C solid-state imaging device
10 first substrate
12 color filter layer
13 micro lens array
15 pad
20 second substrate
200 circuit board
300 opening substrate
330 opening
400 sub-chip
110, 210, 310, 410 semiconductor substrate
120, 220, 320, 420 multi-layer wiring layer

The invention claimed is:

1. A solid-state imaging device, comprising:
a first substrate that includes:
a principal surface;
a first semiconductor substrate; and
a first multi-layer wiring layer that includes:
a first surface in contact with the first semiconductor substrate; and
a second surface opposite to the first surface and the principal surface;
a pixel portion on the principal surface, wherein the pixel portion includes a plurality of pixels;
a second substrate that includes:
a second semiconductor substrate;
a second multi-layer wiring layer that includes:
a third surface in contact with the second semiconductor substrate; and
a fourth surface in contact with the second surface of the first multi-layer wiring layer;
a specific surface opposite to the fourth surface of the second multi-layer wiring layer; and
an opening in a partial region of the second substrate, wherein the opening is on the specific surface of the second substrate; and
at least one sub-chip inside the opening, wherein the at least one sub-chip includes a first circuit configured to execute a first function.

2. The solid-state imaging device according to claim 1, wherein
the second substrate further includes a first electrode,
the at least one sub-chip includes a second electrode in contact with the first electrode of the second substrate, and
the second substrate is electrically connectable to the at least one sub-chip via the first electrode and the second electrode.

3. The solid-state imaging device according to claim 1, wherein
the second substrate further includes a plurality of substrates,
the plurality of substrates includes the second semiconductor substrate, and
the second semiconductor substrate includes a through hole corresponding to the opening.

4. The solid-state imaging device according to claim 3, wherein each of the first substrate and the second substrate includes second circuit configured to execute a second function.

5. The solid-state imaging device according to claim 4, wherein the first circuit of the at least one sub-chip includes a memory circuit.

6. The solid-state imaging device according to claim 4, wherein the second circuit of the second substrate includes at least one of a logic circuit or an analog-digital conversion circuit.

7. The solid-state imaging device according to claim 5, wherein each of the first substrate and the second substrate includes the same material.

8. The solid-state imaging device according to claim 1, wherein
the at least one sub-chip has a surface height on a side of the opening substantially same as a surface height of an opening surface of the opening.

9. The solid-state imaging device according to claim 1, wherein
the at least one sub-chip further includes a third semiconductor substrate and a third multi-layer wiring layer, and
the third semiconductor substrate includes a material different from a material of each of the first semiconductor substrate and the second semiconductor substrate.

10. The solid-state imaging device according to claim 1, further comprising a third multi-layer wiring layer on the second substrate, wherein
the third multi-layer wiring layer covers the opening, and
the third multi-layer wiring layer is configured to electrically connect the at least one sub-chip and the second substrate.

11. The solid-state imaging device according to claim 10, wherein
the at least one sub-chip further includes:
a third semiconductor substrate and a fourth multi-layer wiring layer; and
a sub-chip through electrode that passes through the third semiconductor substrate,
the second substrate further includes a second substrate through electrode, and
the third multi-layer wiring layer is configured to electrically connect the at least one sub-chip and the second substrate via the the second substrate through electrode and the sub-chip through electrode.

12. The solid-state imaging device according to claim 11, further comprising a third substrate on the third multi-layer wiring layer, wherein the third substrate includes a second circuit configured to execute second function.

13. The solid-state imaging device according to claim 12, wherein
the second substrate includes an analog-digital conversion circuit, and
the third substrate includes a logic circuit.

14. The solid-state imaging device according to claim 1, further comprising:
a second substrate through electrode that passes through the second semiconductor substrate; and
a third multi-layer wiring layer on the second substrate, wherein
the third multi-layer wiring layer covers the opening,
the third multi-layer wiring layer includes an external input/output terminal, and
the external input/output terminal is electrically connectable to the second substrate through electrode.

15. The solid-state imaging device according to claim 14, wherein the external input/output terminal overlaps one of the second substrate or the at least one sub-chip.

16. The solid-state imaging device according to claim 14, wherein the external input/output terminal is a solder ball.

17. The solid-state imaging device according to claim 1, further comprising a plurality of sub-chips inside the opening, wherein the plurality of sub-chips includes the at least one sub-chip.

18. The solid-state imaging device according to claim 1, wherein the second substrate further includes one of an alignment mark or a monitor mark in the specific surface of the second substrate.

19. The solid-state imaging device according to claim 18, wherein the one of the alignment mark or the monitor mark is a slit pattern having a depth substantially same depth as a of the opening.

20. A solid-state imaging device, comprising:
a first substrate that includes:
a first surface;
a principal surface opposite to the first surface; and
a pixel portion on the principal surface, wherein the pixel portion includes a plurality of pixels;
a second substrate that includes:
a second surface in contact with the first surface of the first substrate;
a third surface opposite to the second surface;
a semiconductor substrate;
a first multi-layer wiring layer; and
an opening in a partial region in the third surface;
a through electrode that passes through the semiconductor substrate;
a second multi-layer wiring layer on the second substrate, wherein
the second multi-layer wiring layer covers the opening,
the second multi-layer wiring layer includes an external input/output terminal, and
the external input/output terminal is electrically connectable to the through electrode; and
at least one sub-chip inside the opening, wherein the at least one sub-chip includes a circuit configured to execute a specific function.

* * * * *